(12) United States Patent
Kurokawa

(10) Patent No.: US 10,984,743 B2
(45) Date of Patent: Apr. 20, 2021

(54) SEMICONDUCTOR DEVICE

(71) Applicant: SEMICONDUCTOR ENERGY LABORATORY CO., LTD., Atsugi (JP)

(72) Inventor: Yoshiyuki Kurokawa, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 6 days.

(21) Appl. No.: 16/477,238

(22) PCT Filed: Jan. 11, 2018

(86) PCT No.: PCT/IB2018/050160
§ 371 (c)(1),
(2) Date: Jul. 11, 2019

(87) PCT Pub. No.: WO2018/130954
PCT Pub. Date: Jul. 19, 2018

(65) Prior Publication Data
US 2020/0342825 A1    Oct. 29, 2020

(30) Foreign Application Priority Data
Jan. 16, 2017  (JP) ............................. JP2017-004871
Jan. 16, 2017  (JP) ............................. JP2017-004872

(51) Int. Cl.
G09G 3/36      (2006.01)
G11C 19/28     (2006.01)
(Continued)

(52) U.S. Cl.
CPC ........... G09G 3/3648 (2013.01); G11C 19/28 (2013.01); G09G 2310/0286 (2013.01)

(58) Field of Classification Search
USPC ....................................................... 345/204
See application file for complete search history.

(56) References Cited

U.S. PATENT DOCUMENTS 7,164,405 B1   1/2007  Jeong et al.
7,674,650 B2   3/2010  Akimoto et al.
(Continued)

FOREIGN PATENT DOCUMENTS

EP    2187379 A       5/2010
JP    07-287556 A    10/1995
(Continued)

OTHER PUBLICATIONS

International Search Report (Application No. PCT/IB2018/050160) dated Apr. 24, 2018.
(Continued)

Primary Examiner — Chineyere D Wills-Burns
(74) Attorney, Agent, or Firm — Fish & Richardson P.C.

(57) ABSTRACT

A novel semiconductor device is provided.
The semiconductor device has a function of changing a pixel selection period in accordance with a distance from a driver circuit. Specifically, when the distance between a first pixel and the driver circuit is longer than the distance between a second pixel and the driver circuit, the pulse width of a selection signal supplied to the first pixel is set larger than the pulse width of a selection signal supplied to the second pixel. Accordingly, writing of image signals to pixels provided far from the driver circuit can be accurately performed while the selection period for pixels provided near the driver circuit is kept short.

5 Claims, 24 Drawing Sheets

(51) Int. Cl.
*G01C 19/00* (2013.01)
*H01L 29/786* (2006.01)
*H01L 27/12* (2006.01)
*H01L 27/06* (2006.01)
*H01L 21/822* (2006.01)
*G02F 1/133* (2006.01)
*H01L 51/50* (2006.01)
*G09G 3/20* (2006.01)

(56) References Cited

U.S. PATENT DOCUMENTS

| | | |
|---|---|---|
| 7,773,053 B2 | 8/2010 | Takayanagi et al. |
| 8,487,864 B2 | 7/2013 | Itoh |
| 9,653,013 B2 | 5/2017 | Miyata et al. |
| 9,773,832 B2 | 9/2017 | Kurokawa |
| 9,954,531 B2 | 4/2018 | Ikeda et al. |
| 9,992,442 B2 | 6/2018 | Aoki et al. |
| 10,128,249 B2 | 11/2018 | Akasawa et al. |
| 10,345,977 B2 | 7/2019 | Kimura et al. |
| 2003/0016189 A1* | 1/2003 | Abe ................ G09G 3/2014 345/55 |
| 2004/0212577 A1 | 10/2004 | Takeda et al. |
| 2006/0022913 A1* | 2/2006 | Takayanagi ........ G09G 3/3216 345/76 |
| 2006/0289934 A1 | 12/2006 | Tanabe et al. |
| 2007/0159441 A1 | 7/2007 | Yang et al. |
| 2009/0219242 A1 | 9/2009 | Fuchigami et al. |
| 2010/0141850 A1* | 6/2010 | Itoh ................ G09G 3/3677 348/731 |
| 2012/0037911 A1* | 2/2012 | Kim ................ H01L 29/7869 257/59 |
| 2014/0092355 A1* | 4/2014 | Teranuma .......... G09G 3/3655 349/139 |
| 2014/0176407 A1* | 6/2014 | Choi ................ G09G 3/3677 345/87 |
| 2015/0138249 A1 | 5/2015 | Miyata et al. |
| 2017/0116512 A1 | 4/2017 | Kurokawa |
| 2017/0118479 A1 | 4/2017 | Kurokawa |
| 2017/0140722 A1 | 5/2017 | Miyata et al. |
| 2017/0352328 A1* | 12/2017 | Jeong ................ G09G 3/3266 |
| 2018/0076231 A1* | 3/2018 | Yamazaki .......... H01L 27/1255 |
| 2018/0122336 A1 | 5/2018 | Kunitake et al. |
| 2018/0130423 A1* | 5/2018 | Kim ................ H01L 27/3262 |
| 2018/0158393 A1* | 6/2018 | Woo ................ G09G 3/3266 |
| 2018/0182355 A1 | 6/2018 | Kobayashi et al. |
| 2019/0180709 A1* | 6/2019 | Lee .................. G09G 3/20 |

FOREIGN PATENT DOCUMENTS

| | | |
|---|---|---|
| JP | 3333470 | 10/2002 |
| JP | 2004-117758 A | 4/2004 |
| JP | 2006-039457 A | 2/2006 |
| JP | 2006-178689 A | 7/2006 |
| JP | 2006-332109 A | 12/2006 |
| JP | 2007-096055 A | 4/2007 |
| JP | 2007-123861 A | 5/2007 |
| JP | 2009-230103 A | 10/2009 |
| JP | 2013-246230 A | 12/2013 |
| KR | 10-0567500 | 4/2006 |
| KR | 2014-0082413 A | 7/2014 |
| TW | 200725525 | 7/2007 |
| WO | WO-2009/022486 | 2/2009 |
| WO | WO-2012/157725 | 11/2012 |

OTHER PUBLICATIONS

Written Opinion (Application No. PCT/IB2018/050160) dated Apr. 24, 2018.

Kawashima.S et al., "13.3-in. 8K×4K 664-ppi OLED Display Using CAAC-OS FETs", SID Digest '14 : SID International Symposium Digest of Technical Papers, Jun. 3, 2014, pp. 627-630.

\* cited by examiner

# SEMICONDUCTOR DEVICE

CROSS REFERENCE TO RELATED APPLICATIONS

This application is a U.S. National Phase Application under 35 U.S.C. § 371 of International Application PCT/IB2018/050160, filed on Jan. 11, 2018, which claims the benefit of foreign priority applications filed in Japan as Application Nos. 2017-004871 and 2017-004872 on Jan. 16, 2017, all of which are incorporated by reference.

TECHNICAL FIELD

One embodiment of the present invention relates to a semiconductor device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device means all devices that can function by utilizing semiconductor characteristics. A transistor, a semiconductor circuit, an arithmetic device, a memory device, and the like are embodiments of the semiconductor device. In addition, a display device, an imaging device, an electro-optical device, a power generation device (including a thin film solar cell, an organic thin film solar cell, and the like), and an electronic device may include a semiconductor device.

BACKGROUND ART

With the increase in screen size, a television (TV) capable of displaying high-resolution images has been desired, and ultra-high-definition television broadcasting has been promoted. Experimental 8K digital television broadcasting started in 2016, and the full-scale launch of the broadcasting is planned. Accordingly, various electronic devices that are compatible with 8K broadcasting have been developed (e.g., Non-Patent Document 1).

Flat panel displays typified by liquid crystal display devices and light-emitting display devices are widely used for displaying images. As a semiconductor material of transistors included in these display devices, silicon, for example, is chiefly used. Recently, a technique in which a transistor using a metal oxide is used in a pixel of a display device has also been developed (e.g., Patent Documents 1 and 2).

REFERENCE

Patent Document

[Patent Document 1] Japanese Published Patent Application No. 2007-96055

[Patent Document 2] Japanese Published Patent Application No. 2007-123861

Non-Patent Document

[Non-Patent Document 1] S. Kawashima, et al., "13.3-In. 8K×4K 664-ppi OLED Display Using CAAC-OS FETs", SID 2014 DIGEST, pp. 627-630.

SUMMARY OF THE INVENTION

Problems to be Solved by the Invention

An object of one embodiment of the present invention is to provide a novel semiconductor device. Another object of one embodiment of the present invention is to provide a semiconductor device capable of high-speed operation. Another object of one embodiment of the present invention is to provide a semiconductor device capable of displaying a high-quality image. Another object of one embodiment of the present invention is to provide a semiconductor device capable of displaying an image on a large screen. Another object of one embodiment of the present invention is to provide a semiconductor device with low power consumption.

Note that one embodiment of the present invention does not necessarily achieve all the above objects and only needs to achieve at least one of the objects. The description of the above objects does not preclude the existence of other objects. Objects other than the above will be apparent from and can be derived from the description of the specification, the claims, the drawings, and the like.

Means for Solving the Problems

A semiconductor device according to one embodiment of the present invention includes a pixel portion, first to fourth driver circuits, and first to sixth wirings. The pixel portion includes a first region including a first pixel and a second pixel, and a second region including a third pixel and a fourth pixel. The first driver circuit has a function of supplying a first selection signal to the first wiring and a function of supplying a second selection signal to the second wiring. The second driver circuit has a function of supplying a third selection signal to the third wiring and a function of supplying a fourth selection signal to the fourth wiring. The third driver circuit has a function of supplying a first image signal to the fifth wiring. The fourth driver circuit has a function of supplying a second image signal to the sixth wiring. The first pixel is electrically connected to the first wiring and the fifth wiring. The second pixel is electrically connected to the second wiring and the fifth wiring. The third pixel is electrically connected to the third wiring and the sixth wiring. The fourth pixel is electrically connected to the fourth wiring and the sixth wiring. The distance between the third driver circuit and the second pixel is longer than the distance between the third driver circuit and the first pixel. The distance between the fourth driver circuit and the fourth pixel is longer than the distance between the fourth driver circuit and the third pixel. The second pixel and the fourth pixel are provided adjacent to each other. The pulse width of the second selection signal is larger than the pulse width of the first selection signal. The pulse width of the fourth selection signal is larger than the pulse width of the third selection signal.

Moreover, the semiconductor device according to one embodiment of the present invention may include a first signal generator circuit and a second signal generator circuit. The first signal generator circuit may have a function of controlling the waveforms of a first clock signal and a first control signal. The second signal generator circuit may have a function of controlling the waveforms of a second clock signal and a second control signal. The first clock signal and the first control signal may be used to generate the first selection signal and the second selection signal. The second clock signal and the second control signal may be used to generate the third selection signal and the fourth selection signal.

In the semiconductor device according to one embodiment of the present invention, a first signal generator circuit and a second signal generator circuit may each include a register, a counter, a first comparator circuit, and a second comparator circuit. The register may have a function of outputting a first parameter to the first comparator circuit and a function of outputting a second parameter to the second comparator circuit. The first comparator circuit may have a function of generating a first clock signal or a second clock signal by using the first parameter and a count value of the counter. The second comparator circuit may have a function of generating a first control signal or a second control signal by using the second parameter and the count value of the counter.

In the semiconductor device according to one embodiment of the present invention, the register may include a first scan chain register portion, a second scan chain register portion, and a register portion. First data may be sequentially input to the first scan chain register portion. Second data may be sequentially input to the second scan chain register portion. The register portion may have a function of selecting and outputting one of the first data and the second data.

In the semiconductor device according to one embodiment of the present invention, the first scan chain register portion and the second scan chain register portion may each include a retention circuit. The retention circuit may include a transistor and a capacitor. One of a source and a drain of the transistor may be electrically connected to the capacitor. The transistor may contain a metal oxide in a channel formation region.

In the semiconductor device according to one embodiment of the present invention, the first to fourth pixels may each include a transistor containing hydrogenated amorphous silicon in a channel formation region.

In the semiconductor device according to one embodiment of the present invention, the first to fourth pixels may each include a transistor containing a metal oxide in a channel formation region.

Effect of the Invention

One embodiment of the present invention can provide a novel semiconductor device. Alternatively, one embodiment of the present invention can provide a semiconductor device capable of high-speed operation. Alternatively, one embodiment of the present invention can provide a semiconductor device capable of displaying a high-quality image. Alternatively, one embodiment of the present invention can provide a semiconductor device capable of displaying an image on a large screen. Alternatively, one embodiment of the present invention can provide a semiconductor device with low power consumption.

Note that the description of these effects does not preclude the existence of other effects. Moreover, one embodiment of the present invention does not necessarily have all of these effects. Effects other than the above will be apparent from and can be derived from the description of the specification, the claims, the drawings, and the like.

MODE FOR CARRYING OUT THE INVENTION

Figure 1:
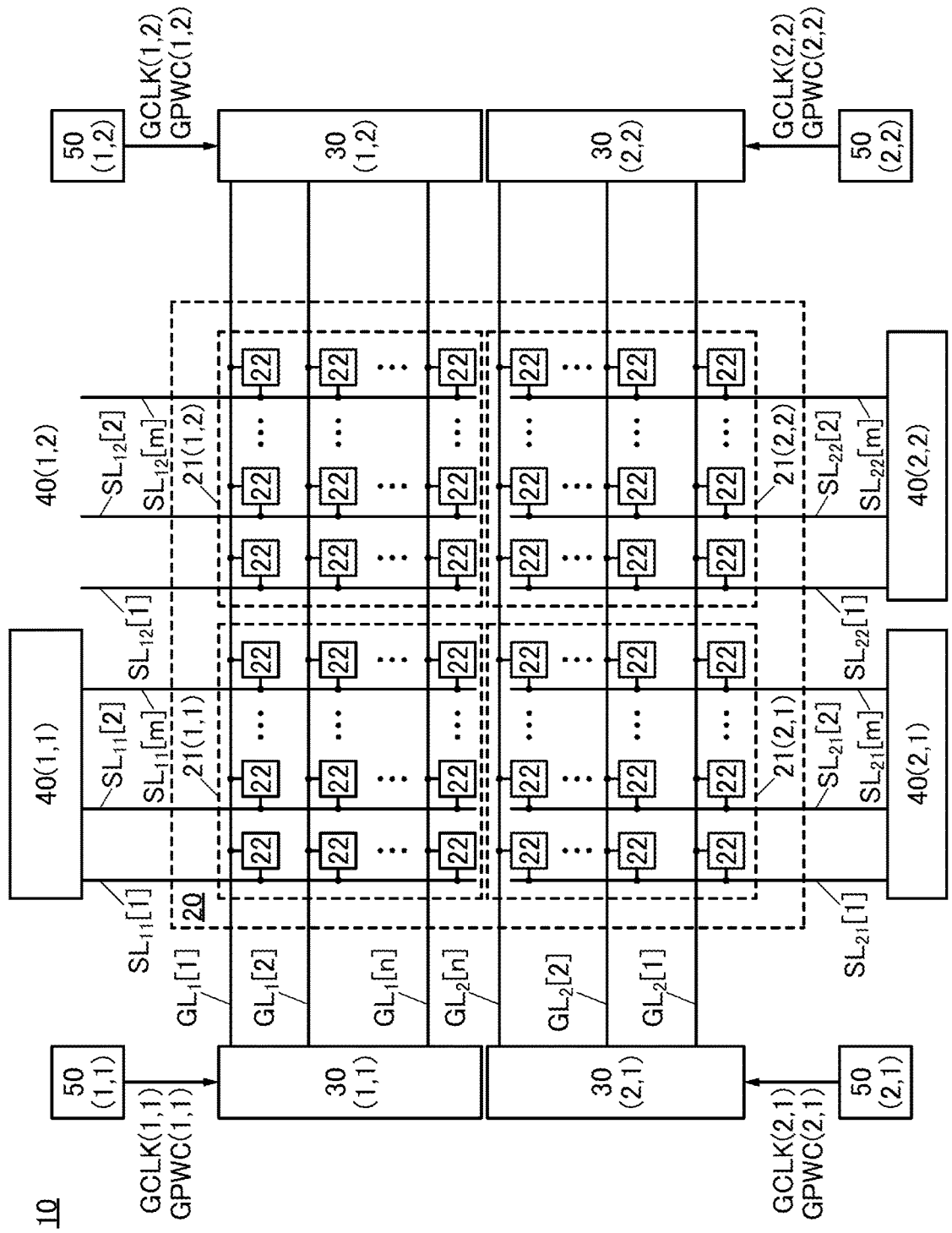
FIG. 1 A diagram illustrating a structure example of a semiconductor device.

Embodiments of the present invention will be described below in detail with reference to the drawings. Note that the present invention is not limited to the description in the following embodiments, and it is easily understood by those skilled in the art that the modes and details can be changed in various ways without departing from the spirit and scope of the present invention. Thus, the present invention should not be interpreted as being limited to the following description of the embodiments.

One embodiment of the present invention includes, in its category, all devices such as a semiconductor device, a memory device, a display device, an imaging device, and an RF (Radio Frequency) tag. A display device includes, in its category, a liquid crystal display device, a light-emitting device in which each pixel is provided with a light-emitting element typified by an organic light-emitting element, electronic paper, a DMD (Digital Micromirror Device), a PDP (Plasma Display Panel), an FED (Field Emission Display), and the like.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. When a metal oxide is used in a channel region of a transistor, for example, the metal oxide is called an oxide semiconductor in some cases. That is, when a metal oxide has at least one of an amplifying function, a rectifying function, and a switching function, the metal oxide can be referred to as a metal oxide semiconductor, or an OS for short. Hereinafter, a transistor containing a metal oxide in a channel region is also referred to as an OS transistor.

In this specification and the like, a metal oxide containing nitrogen is also referred to as a metal oxide in some cases. Moreover, a metal oxide containing nitrogen may be referred to as a metal oxynitride. The details of a metal oxide will be described later.

When this specification and the like explicitly state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text. Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being turned on or off to control whether current flows therethrough or not. Alternatively, a switch has a function of selecting and changing a path through which current flows. Note that the case where X and Y are electrically connected includes the case where X and Y are directly connected.

In an example of the case where X and Y are functionally connected, at least one circuit that allows functional connection between X and Y (e.g., a logic circuit (an inverter, a NAND circuit, a NOR circuit, or the like); a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, or a control circuit) can be connected between X and Y. Note that even if another circuit is provided between X and Y, for example, X and Y are regarded as being functionally connected when a signal output from X is transmitted to Y. Note that the case where X and Y are functionally connected includes the case where X and Y are directly connected and the case where X and Y are electrically connected.

Note that in the case where there is an explicit description "X and Y are electrically connected," the case where X and Y are electrically connected (i.e., the case where X and Y are connected with another element or another circuit placed therebetween), the case where X and Y are functionally connected (i.e., the case where X and Y are functionally connected with another circuit placed therebetween), and the case where X and Y are directly connected (i.e., the case where X and Y are connected without another element or another circuit placed therebetween) are regarded as being disclosed in this specification and the like. That is, in the case where there is an explicit description "being electrically connected," the same contents as the case where there is only an explicit description "being connected" are regarded as being disclosed in this specification and the like.

Components denoted by the same reference numerals in different drawings represent the same components, unless otherwise specified.

Even when a diagram shows that independent components are electrically connected to each other, one component has functions of a plurality of components in some cases. For example, when part of a wiring also functions as an electrode, one conductive film has functions of both of the components, the function of the wiring and the function of the electrode. Thus, "electrical connection" in this specification also includes such a case where one conductive film has functions of a plurality of components, in its category.

Embodiment 1

In this embodiment, a semiconductor device according to one embodiment of the present invention will be described.
<Structure Example of Semiconductor Device>

FIG. 1 illustrates a structure example of a semiconductor device 10. The semiconductor device 10 includes a pixel portion 20, a driver circuit 30, a driver circuit 40, and a signal generator circuit 50. The semiconductor device 10 has a function of displaying a predetermined image on the pixel portion 20 with the use of the driver circuit 30 and the driver circuit 40. Thus, the semiconductor device 10 can be used as a display device.

The pixel portion 20 is composed of a plurality of pixels 22 and has a function of displaying an image. The pixels 22 each include a display element and have a function of expressing a predetermined gray level. The gray levels of the pixels 22 are controlled with signals output from the driver circuit 30 and the driver circuit 40, and a predetermined image is displayed on the pixel portion 20.

Examples of the display element provided in the pixel 22 include a liquid crystal element and a light-emitting element. As the liquid crystal element, a transmissive liquid crystal element, a reflective liquid crystal element, a transflective liquid crystal element, or the like can be used. Moreover, as the display element, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can be used, for instance. In addition, examples of the light-emitting element include self-luminous light-emitting elements such as an OLED (Organic Light Emitting Diode), an LED (Light Emitting Diode), a QLED (Quantum-dot Light Emitting Diode), and a semiconductor laser. Specific structure examples of the pixel 22 will be described later.

The pixels 22 are connected to wirings SL and wirings GL. The wirings GL are connected to the driver circuit 30, and the wirings SL are connected to the driver circuit 40. The wiring GL is supplied with a signal for selecting the pixel 22 (hereinafter also referred to as a selection signal). The wiring SL is supplied with a signal for making the pixel 22 express a predetermined gray level (hereinafter also referred to as an image signal). An image signal is supplied to the pixel 22 that has been supplied with a selection signal, whereby the image signal is written to the pixel 22.

The driver circuit 30 has a function of supplying a selection signal to the pixel 22. Specifically, the driver circuit 30 has a function of supplying a selection signal to the wiring GL, and the wiring GL has a function of transmitting the selection signal output from the driver circuit 30 to the pixel 22. Note that the wiring GL can also be referred to as a selection signal line, a gate line, or the like.

The driver circuit 40 has a function of supplying an image signal to the pixel 22. Specifically, the driver circuit 40 has a function of supplying an image signal to the wiring SL, and the wiring SL has a function of transmitting the image signal output from the driver circuit 40 to the pixel 22. Note that the wiring SL can also be referred to as an image signal line, a source line, or the like.

The number of pixels 22 included in the pixel portion 20 can be set freely. In order to display a high-resolution image, it is preferable to arrange many pixels 22. For example, pixels 22 of 1920×1080 or more are preferably provided in the case of displaying 2K images. Furthermore, pixels 22 of 3840×2160 or more or 4096×2160 or more are preferably provided in the case of displaying 4K images. Moreover, pixels 22 of 7680×4320 or more are preferably provided in the case of displaying 8K images.

In the case where a large number of pixels 22 are provided in the pixel portion 20 to display high-resolution images such as the above-described 2K, 4K, and 8K images, the length of the wirings GL and the wirings SL is increased, and the parasitic resistance of the wirings GL and the wirings SL is increased accordingly. In addition, as illustrated in FIG. 1, the wirings GL and the wirings SL are provided so as to intersect with each other. Thus, when the number of pixels 22 is increased, the number of intersections is also increased, and parasitic capacitance formed by the wirings GL and the wirings SL is increased. For this reason, FIG. 1 employs a structure where the pixel portion 20 is divided into a plurality of regions 21, and each region 21 is provided with the driver circuit 30 and the driver circuit 40.

Specifically, in FIG. 1, the pixel portion 20 is divided into four regions 21 (21(1, 1) to (2, 2)), and the four regions 21 each include m columns and n rows of pixels 22 (m and n are natural numbers). In addition, four driver circuits 30 (30(1, 1) to (2, 2)) and four driver circuits 40 (40(1, 1) to (2, 2)) are provided in FIG. 1.

In FIG. 1, the wirings GL connected to the driver circuits 30(1, 1) and (1, 2) are denoted by wirings $GL_1$, and the wirings GL connected to the driver circuits 30(2, 1) and (2, 2) are denoted by wirings $GL_2$. The wirings SL connected to the driver circuits 40(1, 1), (1, 2), (2, 1), and (2, 2) are denoted by wirings $SL_{11}$, wirings $SL_{12}$, wirings $SL_{21}$, and wirings $SL_{22}$, respectively. The wiring SL and the wiring GL connected to the pixel 22 in the i-th column and the j-th row (i is an integer of 1 to m; j is an integer of to 1 to n) are denoted by a wiring SL[i] and a wiring GL[j], respectively.

Image signals are supplied to the regions 21(1, 1) to (2, 2) from the respective driver circuits 40(1, 1) to (2, 2). Thus, image signals can be supplied from the driver circuits 40 (40(1, 1) and (1, 2)) to the pixels 22 that belong to the regions 21 (21(1, 1) and (1, 2)) in the pixel portion 20, and image signals can be supplied from the driver circuits 40 (40(2, 1) and (2, 2)) to the pixels 22 that belong to the regions 21 (21(2, 1) and (2, 2)) in the pixel portion 20. Consequently, the wirings SL connected to one driver circuit 40 can be shortened; hence, the parasitic resistance and parasitic capacitance can be reduced, and image signals can be supplied at high speed.

Note that FIG. 1 illustrates a structure example in which the pixel portion 20 region is divided into the four regions 21(1, 1), (1, 2), (2, 1), and (2, 2). In this case, the timings for outputting image signals from the driver circuits 40(1, 1) and (1, 2) are synchronized, and the timings for outputting image signals from the driver circuits 40(2, 1) and (2, 2) are synchronized. Note that the driver circuit 40 that supplies image signals to the regions 21(1, 1) and (1, 2) may be formed of a circuit in which the driver circuits 40(1, 1) and (1, 2) are integrated. Moreover, the driver circuit 40 that supplies image signals to the regions 21(2, 1) and (2, 2) may be formed of a circuit in which the driver circuits 40(2, 1) and (2, 2) are integrated. Furthermore, each of the driver circuits 40(1, 1), (1, 2), (2, 1), and (2, 2) may be formed of a plurality of driver circuits.

In FIG. 1, two driver circuits 30 are connected to one wiring GL. Specifically, the pixels 22 included in the regions 21(1, 1) and (1, 2) are connected to the driver circuits 30(1, 1) and (1, 2) through the wirings GL. Moreover, the pixels 22 included in the regions 21(2, 1) and (2, 2) are connected to the driver circuits 30(2, 1) and (2, 2) through the wirings GL. Thus, selection signals can be supplied from opposite ends of the wiring GL, which enables the selection signals to be supplied at high speed. Note that in the case where transmission of selection signals is not hindered, one of the driver circuits 30(1, 1) and (1, 2) and one of the driver circuits 30(2, 1) and (2, 2) can be omitted.

Although FIG. 1 shows the case where the pixel portion 20 is divided into four regions 21, the divisor is not particularly limited and can be set freely. Moreover, although FIG. 1 illustrates an example in which the numbers of columns and the numbers of rows of the pixels 22 included in the four regions 21 are the same, the number of columns and the number of rows of the pixels 22 are not limited thereto and can be set freely in each region 21.

Figure 2:
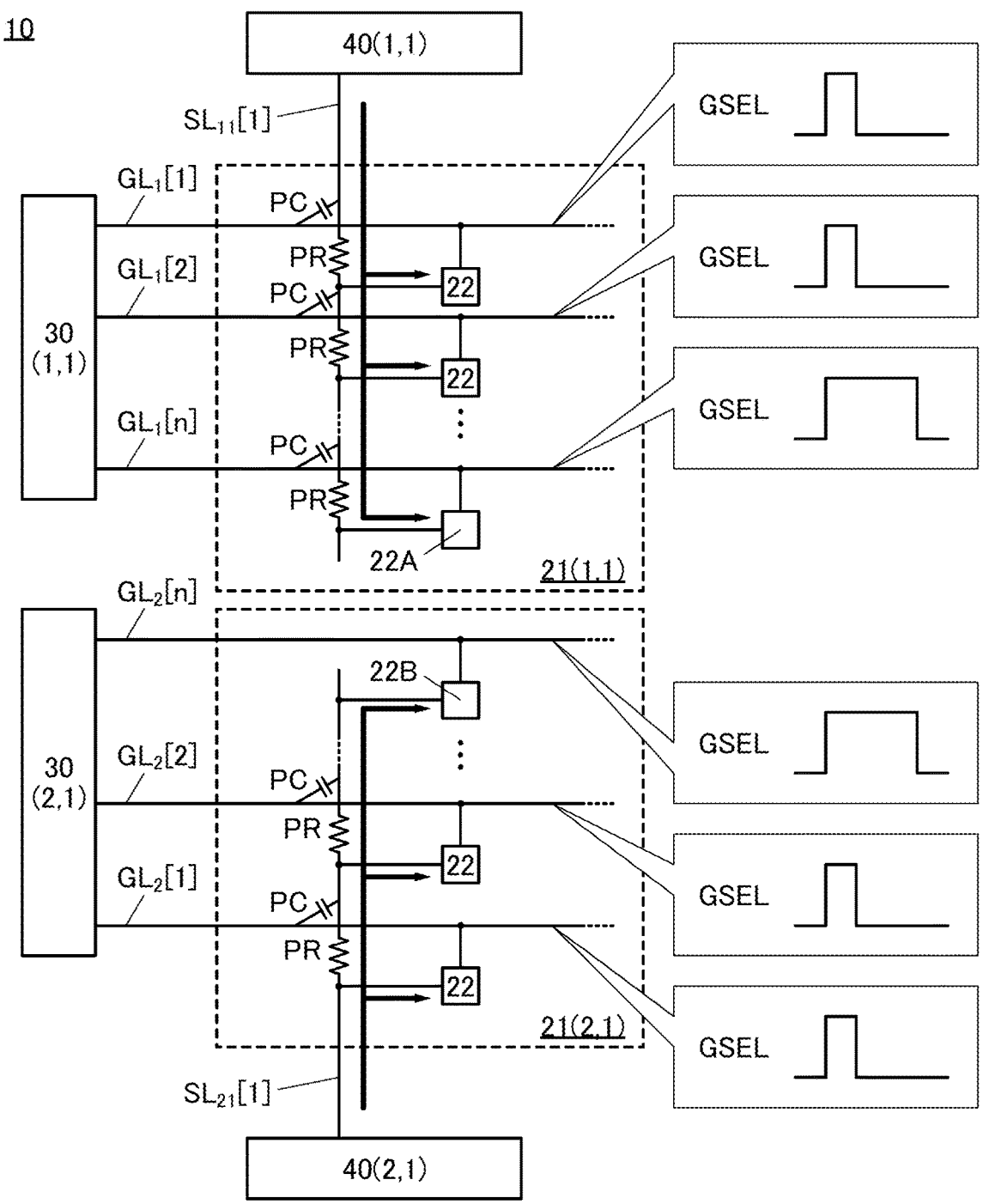
FIG. 2 A diagram illustrating an operation example of a semiconductor device.

In the case where the pixel portion 20 is divided into a plurality of regions 21 as described above, the image continuity is preferably ensured at a junction of the regions 21. However, gray levels expressed by the pixels 22 around the junctions particularly tend to vary owing to the influence of the parasitic resistance and parasitic capacitance of the wirings SL or the like. For example, the case where image signals are supplied to the wiring SL[1] in the regions 21(1, 1) and (2, 1) as illustrated in FIG. 2 is considered. Here, parasitic capacitance PC, wiring resistance PR, and the like formed at the intersections with the wirings GL and the like are added to the wiring SL; hence, image signals may delay. More specifically, as the distance between the driver circuit 40 and the pixel 22 is longer and the path of an image signal formed in the wiring SL is longer, the parasitic resistance PR increases. Moreover, as the number of intersections of the wirings GL and the wiring SL is larger, the parasitic capacitance PC increases. Thus, the image signal delay increases. The image signal delay reaches its maximum when the image signal is supplied to the pixel 22 that is farthest from the driver circuit 40 (pixels 22A and 22B in the diagram).

If the pulse width of selection signals supplied to the wirings GL[1] to [n] (n here is an integer of 1 or more) is set in accordance with the pixel 22 that is provided comparatively close to the driver circuit 40, before writing of image signals is completed, the pixels 22A and 22B may become a non-selected state because of the above-described image signal delay. Consequently, writing of image signals to the pixels 22A and 22B is incomplete, and gray levels expressed by the pixels 22A and 22B may vary. Furthermore, in a region at the junction of the regions 21(1, 1) and (2, 1) shown in FIG. 2, the pixels 22A and 22B, where a variation in gray level due to the signal delay is most likely to occur, are adjacent to each other. Thus, a discontinuous image may be generated in this region.

On the other hand, to ensure the image continuity, the pulse width of selection signals can be set in accordance with the pixels 22A and 22B provided near the ends of the wirings SL. However, in this case, selection periods for all the pixels 22 need to be set long, so that the time required to select all the rows is increased. Thus, the time required to update an image is increased, and the operating speed is lowered.

Here, the semiconductor device 10 according to one embodiment of the present invention has a function of changing the selection period of the pixel 22 in accordance with the distance from the driver circuit 40. Specifically, when the distance between a first pixel 22 and the driver circuit 40 is longer than the distance between a second pixel 22 and the driver circuit 40, the pulse width of a selection signal supplied to the first pixel 22 is set larger than the pulse width of a selection signal supplied to the second pixel 22. Accordingly, writing of image signals to the pixels 22 provided far from the driver circuit 40 can be accurately performed while the selection period for the pixels 22 provided near the driver circuit 40 is kept short.

Note that the above-described distance between the pixel 22 and the driver circuit 40 means the length of an image signal path formed between the pixel 22 and the driver circuit 40 when an image signal is supplied from the driver circuit 40 to the pixel 22 through the wiring SL. In addition, the pulse width of a selection signal corresponds to a period during which the selection signal is continuously supplied. For example, when a high-level signal is supplied as a selection signal, a period during which the potential of the wiring GL is kept at high level corresponds to the pulse width of the selection signal. Moreover, the pulse width of a selection signal corresponds to a selection period of the pixel 22 connected to the wiring GL (a period during which a selected state is maintained).

FIG. 2 shows an operation example in which the pulse width of a selection signal is controlled. A signal GSEL with a small pulse width can be supplied to the wirings GL (wirings $GL_1$[1] and [2] and wirings $GL_2$[1] and [2]) connected to the pixels 22 provided near the driver circuit 40, and the signal GSEL with a large pulse width can be supplied to the wirings GL (a wiring $GL_1$[n] and a wiring $GL_2$[n]) connected to the pixels 22 provided far from the driver circuit 40. Note that the signal GSEL shown in FIG. 2 is a selection signal. Accordingly, image signals can be accurately written to the pixels 22, and the image continuity around the junction of the regions 21 (a region where the pixels 22A and 22B are adjacent to each other) can be secured.

The pulse width of the signal GSEL can be set freely without being limited to the above. For example, the pulse width of the signal GSEL can be changed for every wiring GL so that the signal GSEL with a larger pulse width is supplied to the pixel 22 placed further from the driver circuit 40. Alternatively, the pulse width can be widened only for the signal GSEL supplied to the pixels 22 belonging to a predetermined row that is distant from the driver circuit 40 (e.g., a row around the n-th row in the regions 21(1, 1) and (2, 1)).

The pulse width of a selection signal can be controlled by controlling a variety of signals supplied to the driver circuit 30. FIG. 1 illustrates a structure example in which signals supplied to the driver circuit 30 are controlled using the signal generator circuit 50.

The signal generator circuit 50 has a function of generating a signal used in the driver circuit 30. Specifically, the signal generator circuit 50 has a function of generating a clock signal GCLK and a control signal GPWC that are used to generate a selection signal. Note that the control signal GPWC is used to control the pulse width of a selection signal. The signal generator circuit 50 is provided for each driver circuit 30, and four signal generator circuits 50 (50(1, 1) to (2, 2)) are provided in FIG. 1. When the clock signal GCLK and the control signal GPWC are supplied from the signal generator circuit 50 to the driver circuit 30, the driver circuit 30 generates a selection signal and supplies it to the wiring GL.

Figure 3A:
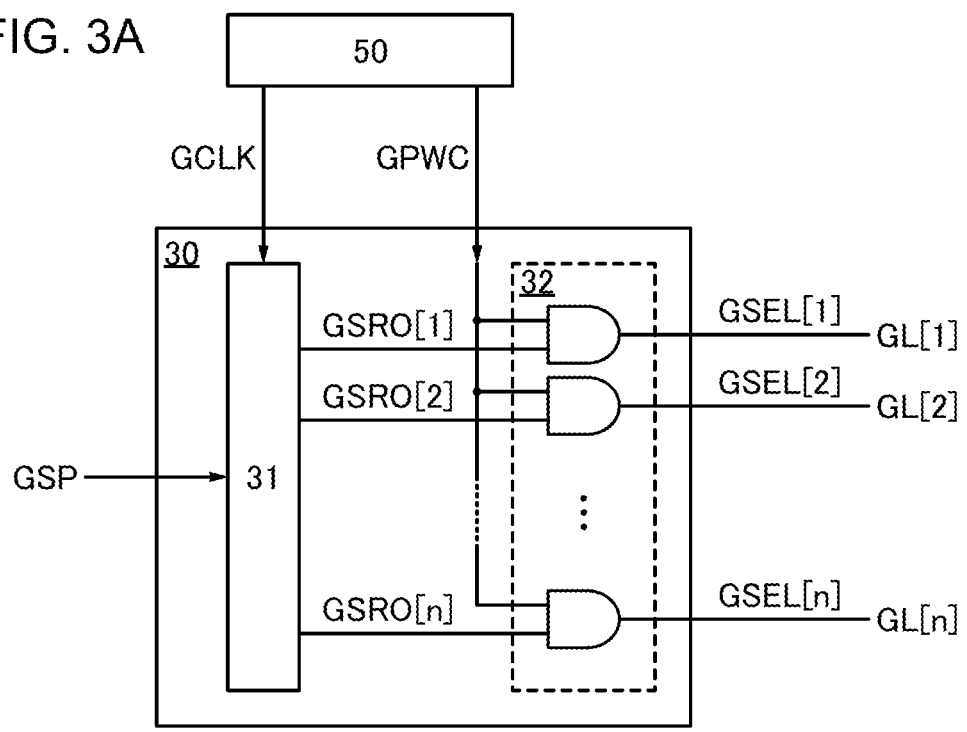
FIGS. 3A and 3B Diagrams illustrating a structure example of a driver circuit.

FIG. 3(A) illustrates a structure example of the driver circuit 30 supplied with the clock signal GCLK and the control signal GPWC from the signal generator circuit 50. The driver circuit 30 includes a shift register 31 and a control circuit 32 that is composed of a plurality of AND circuits.

The shift register 31 has a function of generating signals GSRO[1] to [n] by using a start pulse GSP input from the outside and the clock signal GCLK. The number of stages of the register 31 is n, and the signals GSRO[1] to [n] correspond to output signals of the respective stages of the shift register 31.

Figure 3B:
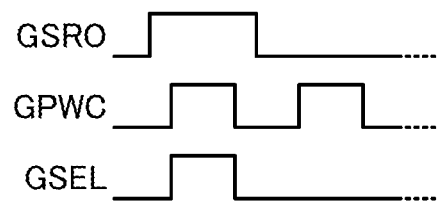

The control circuit 32 has a function of controlling the pulse width of the signal GSRO. The control circuit 32 includes n AND circuits to which the signals GSRO[1] to [n] are input. The signal GSRO and the control signal GPWC are input to the AND circuit, and the logical product thereof is output to the wiring GL as the signal GSEL (see FIG. 3(B)).

The signal generator circuit 50 has a function of controlling the cycle and pulse width of the clock signal GCLK and the cycle and pulse width of the control signal GPWC. Thus, the waveforms of the signal GSRO and the control signal GPWC can be controlled, and the pulse width of the signal GSEL can be controlled.

<Operation Example of Semiconductor Device>

Figure 4:
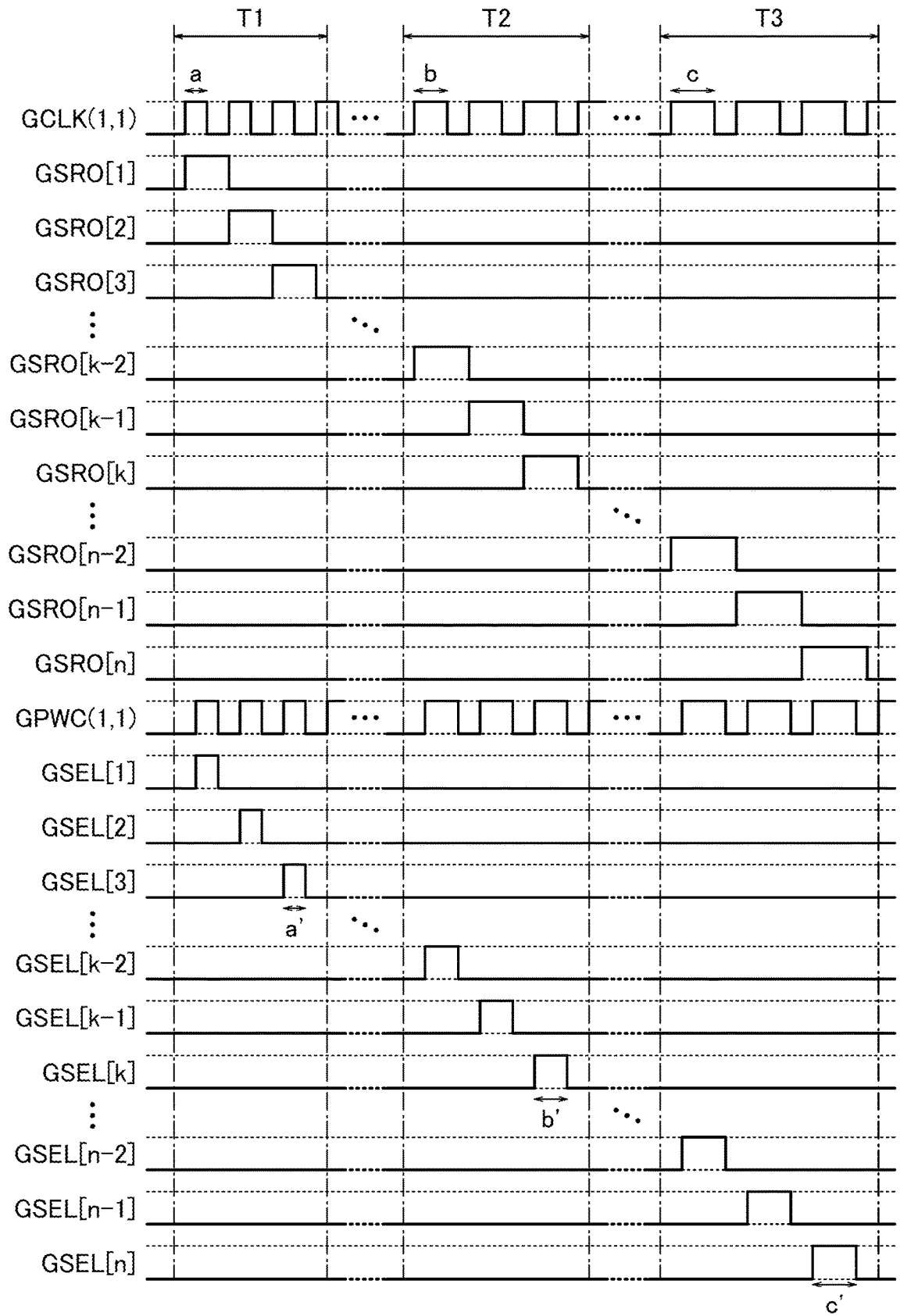
FIG. 4 A timing chart.

Next, an operation example of the semiconductor device 10 in which the pulse width of a selection signal is changed in accordance with the distance between the pixel 22 and the driver circuit 40 is described. FIG. 4 is a timing chart showing an operation example of the semiconductor device 10. Here, the case where the region 21(1, 1) in FIG. 1 is supplied with three types of signals GSEL from the driver circuit 30(1, 1) is described as an example; the other regions 21 can be operated in a similar manner. Note that k in FIG. 4 is an integer of 6 to n−3, and n here is an integer of 9 or more.

First, in a period T1, selection signals supplied to the pixels 22 provided in a region nearest to the driver circuit 40 (here, the pixels 22 in the first to third rows) are generated. First, a clock signal GCLK(1, 1) with a pulse width a and a control signal GPWC(1, 1) generated in accordance with the cycle and pulse width of the clock signal GCLK(1, 1) are output from the signal generator circuit 50 to the driver circuit 30(1, 1). When the clock signal GCLK(1, 1) is input to the shift register 31, the shift register 31 outputs signals GSRO[1] to [3] to the control circuit 32. Then, the control circuit 32 generates signals GSEL[1] to [3] on the basis of the control signal GPWC(1, 1) and the signals GSRO[1] to [3] and sequentially outputs them to the wirings $GL_1$[1] to [3]. The pulse width of the signal GSEL generated in the period T1 is represented by a'.

Next, in a period T2, selection signals supplied to the pixels 22 provided in a region further from the driver circuit 40 than the pixels 22 in the first to third rows (here, the pixels 22 in the (k−2)th to k-th rows) are generated. First, the pulse width of the clock signal GCLK(1, 1) supplied from the signal generator circuit 50 to the driver circuit 30(1, 1) is changed to b (>a), and the cycle and pulse width of the control signal GPWC(1, 1) are changed accordingly. Then, by the operation similar to that in the period T1, signals GSEL[k−2] to [k] are generated on the basis of the changed clock signal GCLK(1, 1) and control signal GPWC(1, 1) and sequentially output to the wirings $GL_1$[k−2] to [k]. The pulse width of the signal GSEL generated in the period T2 is represented by b' (>a').

Note that a period during which the selection signal GSEL is output in the period T2 is longer than that in the period T1. Thus, the period T2 becomes longer than the period T1.

Next, in a period T3, selection signals supplied to the pixels 22 provided in a region farthest from the driver circuit 40 (here, the pixels 22 in the (n−2)th to n-th rows) are generated. First, the pulse width of the clock signal GCLK (1, 1) supplied from the signal generator circuit 50 to the driver circuit 30(1, 1) is changed to c (>b), and the cycle and pulse width of the control signal GPWC(1, 1) are changed accordingly. Then, by the operation similar to that in the period T1, signals GSEL[n−2] to [n] are generated on the basis of the changed clock signal GCLK(1, 1) and control signal GPWC(1, 1) and sequentially output to the wirings $GL_1$[n−2] to [n]. The pulse width of the signal GSEL in the period T3 is represented by c' (>b').

Note that a period during which the selection signal GSEL is output in the period T3 is longer than that in the period T2. Thus, the period T3 becomes longer than the period T2.

As described above, by controlling the waveforms of the control signal GPWC and the signal GCLK by the signal generator circuit 50, the signal GSEL with a pulse width corresponding to the distance from the driver circuit 40 to the pixel 22 can be supplied from the driver circuit 30. Note that although an operation example in which the pulse width of the selection signal is changed for every certain number of wirings GL is described here, the pulse width of the selection signal can alternatively be changed for every wiring GL. Alternatively, the pulse width can be widened only for the signal GSEL supplied to the pixels 22 belonging to a certain row that is distant from the driver circuit 40.

<Structure Example of Signal Generator Circuit>

Figure 5A:
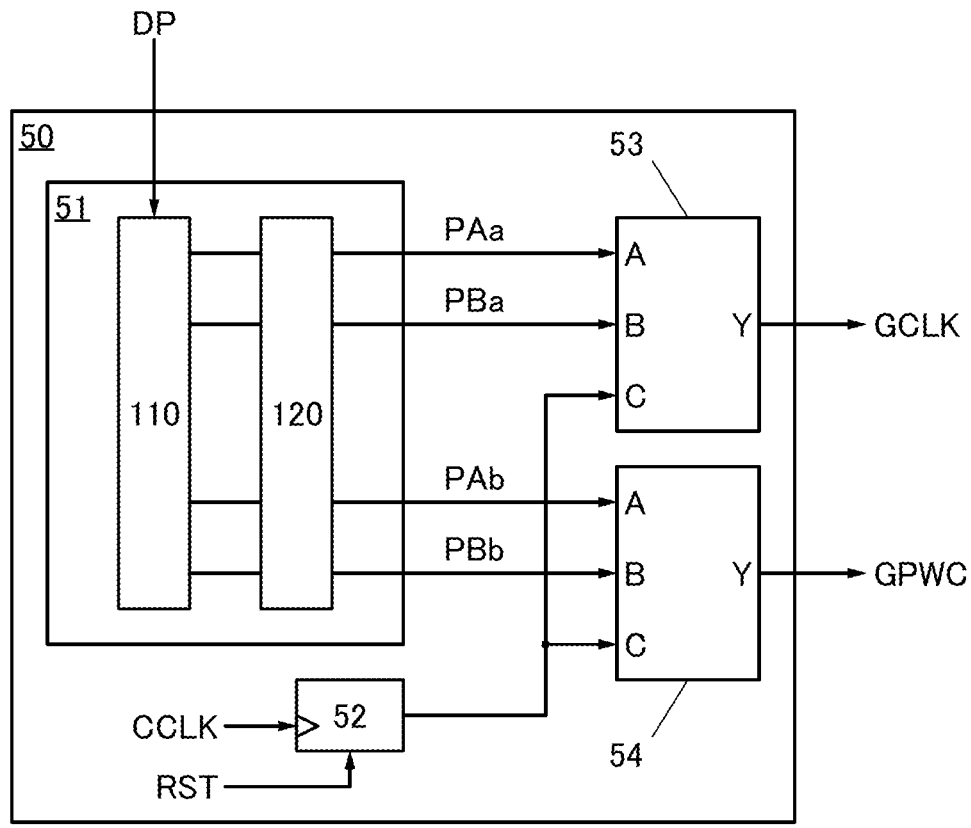
FIGS. 5A and 5B Diagrams illustrating a structure example of a signal generator circuit.

Next, a structure example of the signal generator circuit 50 is described. FIG. 5(A) illustrates the signal generator circuit 50 having a function of controlling the waveforms of the clock signal GCLK and the control signal GPWC. The signal generator circuit 50 includes a register 51, a counter 52, a comparator circuit 53, and a comparator circuit 54.

The register 51 has a function of storing and collectively outputting data DP including parameters for determining the waveform of the control signal GPWC or the signal GCLK. The register 51 includes a scan chain register portion 110 and a register portion 120. The data DP is sequentially input to and stored in the scan chain register portion 110. Then, the data DP stored in the scan chain register portion 110 is collectively transferred to the register portion 120 and output to the comparator circuit 53 and the comparator circuit 54 at the same time.

The data DP includes a variety of parameters used in the comparator circuit 53 and the comparator circuit 54. Specifically, the data DP includes parameters PAa and PBa determining the waveform of the signal GCLK, parameters PAb and PBb determining the waveform of the control signal GPWC, and the like.

The counter 52 has a function of counting in synchronization with a clock signal CCLK. A count value of the counter 52 is output to the comparator circuit 53 and the comparator circuit 54. When a reset signal RST is input to the counter 52, the count value of the counter 52 is reset.

The comparator circuit 53 has a function of generating the signal GCLK by using the parameters input from the register 51 and the count value of the counter. The parameter PAa is input to an input terminal A of the comparator circuit 53, the parameter PBa is input to an input terminal B, and the count value of the counter 52 is input to an input terminal C. The comparator circuit 53 has a function of determining the waveform of the signal GCLK by using the parameters PAa and PBa as parameters determining the rise timing and fall timing, respectively, of the signal GCLK. The signal GCLK generated by the comparator circuit 53 is output from an output terminal Y to the driver circuit 30.

Figure 5B:
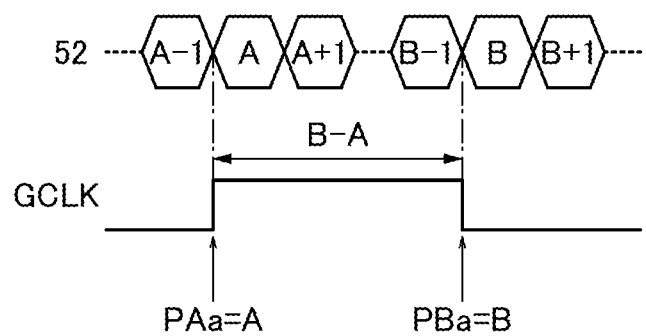

For example, as shown in FIG. 5(B), the comparator circuit 53 can be configured to output a high-level signal when the count value of the counter 52 reaches the value of the parameter PAa (here, A) and output a low-level signal when the count value of the counter 52 reaches the value of the parameter PBa (here, B). Thus, the waveform of the signal GCLK can be controlled. Note that the pulse width of the signal GCLK at this time becomes a value corresponding to (B-A). More specifically, it becomes (B-A) times the cycle of the clock signal CCLK (the count up cycle of the counter).

The comparator circuit 54 has a function of generating the control signal GPWC by using the parameters input from the register 51 and the count value of the counter. The parameter PAb is input to an input terminal A of the comparator circuit 54, the parameter PBb is input to an input terminal B, and the count value of the counter 52 is input to an input terminal C. The comparator circuit 54 has a function of determining the waveform of the control signal GPWC by using the parameters PAb and PBb as parameters determining the rise timing and fall timing, respectively, of the control signal GPWC. The control signal GPWC generated by the comparator circuit 54 is output from an output terminal Y to the driver circuit 30. Specific operation of the comparator circuit 54 is similar to that of the comparator circuit 53.

The parameters are collectively output from the register 51 to the comparator circuit 53 and the comparator circuit 54 at the same time. Thus, the timings of updating the signal GCLK and the control signal GPWC can be synchronized, and the change in pulse width of a selection signal in the driver circuit 30 can be accurately performed.

In addition, by controlling the timing at which the reset signal RST is input to the counter 52, the cycles of the signal GCLK and the control signal GPWC can be controlled. The timing at which the reset signal RST is input may be determined by a parameter stored in the register 51.

[Structure Example of Register]

In one embodiment of the present invention, the pulse width of a selection signal output from the driver circuit 30 is changed in a period during which the wirings GL are sequentially scanned. Thus, it is preferred that parameters output from the register 51 be updated at high speed. High-speed parameter update is required particularly when the number of pulse width switching is large, for example, when the pulse width of a selection signal is changed for every wiring GL.

Here, for high-speed parameter update, a structure where a plurality of scan chain register portions 110 are provided and a set of parameters corresponding a selection signal with a predetermined pulse width is stored in each of the scan chain portions 110 is effective. In this case, the output of parameters can be switched quickly by switching between the scan chain register portions 110 that will output parameters to the register portion 120. A structure example of the register 51 having such a structure will be described below.

Figure 6:
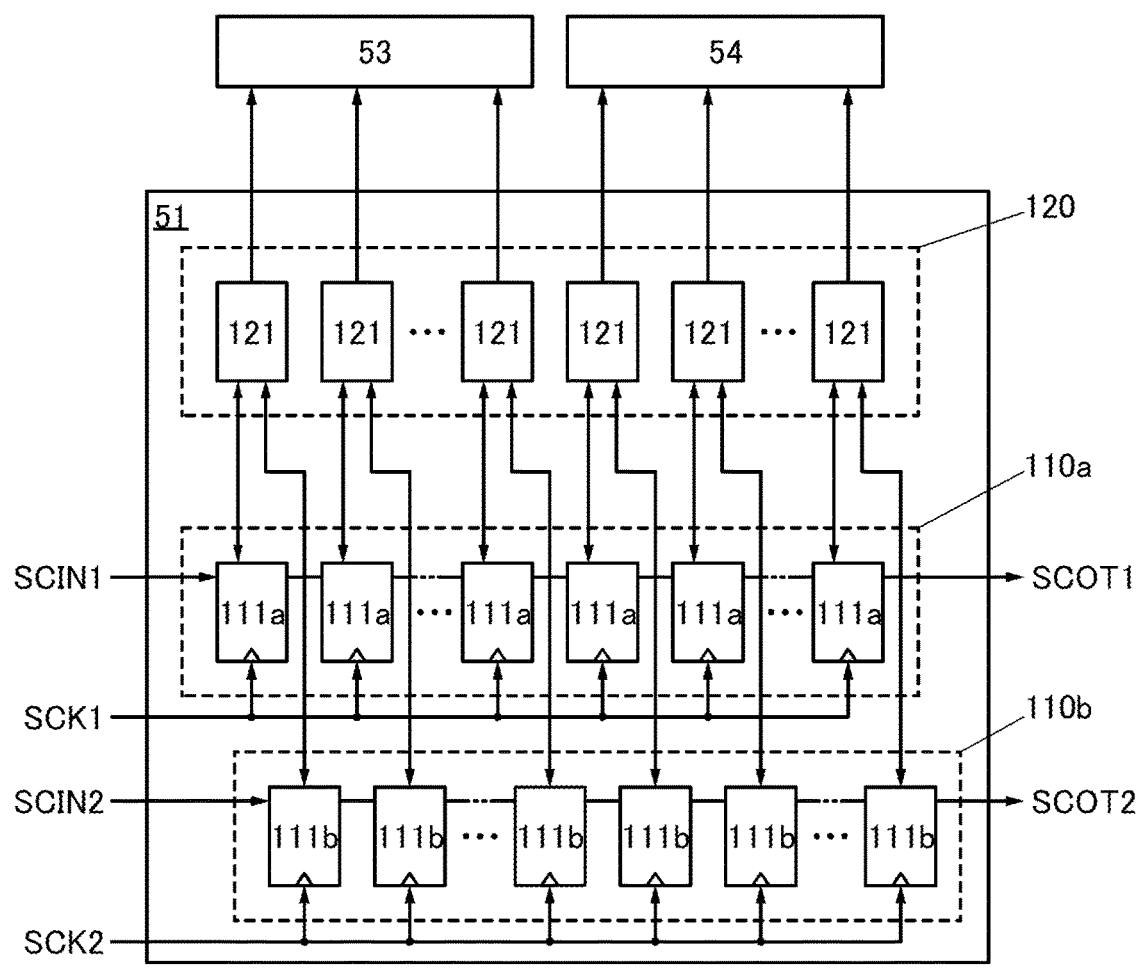
FIG. 6 A diagram illustrating a structure example of a register.

FIG. 6 illustrates a structure example of the register 51. The register 51 includes a plurality of scan chain register portions 110 and the register portion 120. Although a structure where two scan chain register portions 110 (110a and 110b) are provided is shown here, the number of scan chain register portions 110 can be set freely. Each of the scan chain register portions 110a and 110b can store a set of parameters for generating a selection signal with a predetermined pulse width.

The register portion 120 includes a plurality of registers 121. The scan chain register portion 110a includes a plurality of registers 111a and nodes SCIN1 and SCOT1. The scan chain register portion 110b includes a plurality of registers 111b and nodes SCIN2 and SCOT2.

The registers 111a and 111b are nonvolatile registers, which do not lose data even in a state where the power is shut off. The registers 111a and 111b are provided with a retention circuit using an OS transistor so that the registers 111a and 111b become nonvolatile.

A metal oxide has a larger energy gap than a semiconductor such as silicon and can have a lower minority carrier density. Thus, a current flowing between a source and a drain of an OS transistor when the OS transistor is in an off state (hereinafter also referred to as an off-state current) is extremely low. Accordingly, when OS transistors are used in the registers 111a and 111b, data can be retained for a long period compared with the case of using transistors containing silicon in their channel regions (hereinafter also referred to as Si transistors) or the like. This enables data retention even in a period when power supply to the registers 111a and 111b is stopped.

Meanwhile, the register 121 is a volatile register. There is no particular limitation on the circuit structure of the register 121; the register 121 can be any circuit capable of storing data and can be composed of a latch circuit, a flip-flop circuit, or the like. The waveforms of signals generated by the comparator circuit 53 and the comparator circuit 54 are controlled with parameters output from the register portion 120.

To update data stored in the register 51, first, data in the scan chain register portions 110a and 110b is changed. To change the data in the scan chain register portion 110a, data is input from the node SCIN1 while a scan clock signal SCK1 is toggled. By the data input from the node SCIN1, data in each register 111a is updated in accordance with the scan clock signal SCK1. The last-stage register 111a outputs data from the node SCOT1. Similarly, to change the data in the scan chain register portion 110b, data is input from the node SCIN2 while a scan clock signal SCK2 is toggled. By the data input from the node SCIN2, data in each register 111b is updated in accordance with the scan clock signal SCK2. The last-stage register 111b outputs data from the node SCOT2.

To store parameters for generating a selection signal with a predetermined pulse width in the scan chain register portions 110a and 110b, the data DP in FIG. 5 is input from the node SCIN1 and the node SCIN2.

After the data of each register 111a in the scan chain register portion 110a is rewritten, the data of the registers 111a is collectively loaded into the registers 121 in the register portion 120. Alternatively, after the data of each register 111b in the scan chain register portion 110b is rewritten, the data of the registers 111b is collectively loaded into the registers 121 in the register portion 120. Thus, the comparator circuit 53 and the comparator circuit 54 can generate a signal by using parameters that are collectively updated. Since the simultaneity of data update is maintained, stable operation of the signal generator circuit 50 can be achieved. Moreover, including the scan chain register portions 110a and 110b and the register portion 120 enables data in the scan chain register portions 110a and 110b to be updated even while the comparator circuit 53 and the comparator circuit 54 are in operation.

Note that in a period during which the register 51 is not accessed, power supply to the register 51 can be temporarily stopped (power gating). To implement power gating of the register 51, the power is shut off after data is stored (saved) in the retention circuit of the registers 111a and 111b. After the power supply is resumed, the data in the register 111a or the register 111b is restored (loaded) to the register 121 and normal operation is restarted. Note that in the case where the data stored in the register 111a or the register 111b and the data stored in the register 121 do not match, it is preferable to save the data of the register 121 in the register 111a or the register 111b and then store the data again in the retention circuit of the registers 111a and 111b. An example of the case where the data do not match includes the case where data in the scan chain register portions 110a and 110b has been changed.

Figure 7:
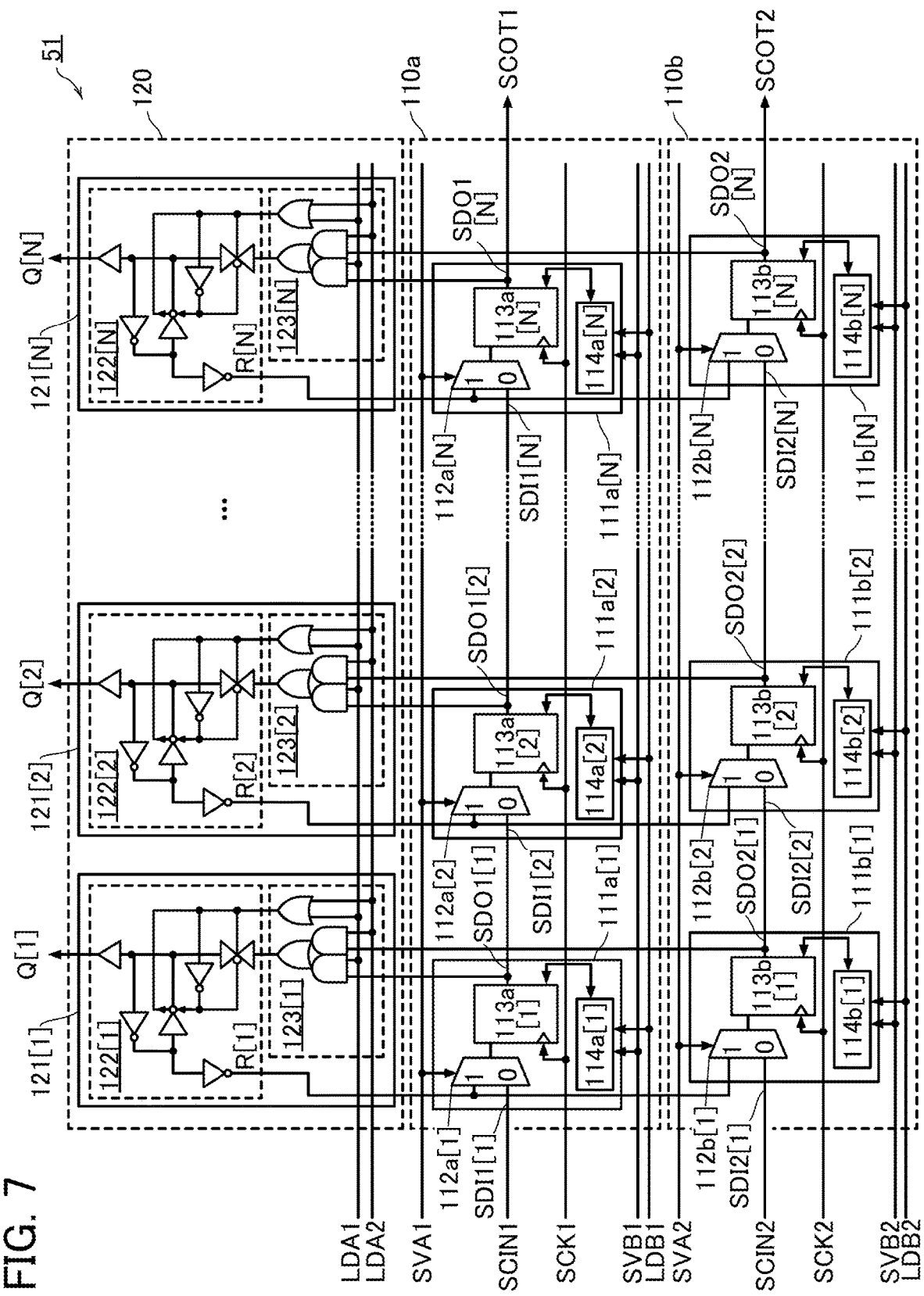
FIG. 7 A diagram illustrating a structure example of a register.

A circuit structure example of the register 51 is described with reference to FIG. 7 and FIG. 8.

The register portion 120 includes N registers 121 (N is an integer of 2 or more). Signals LDA1 and LDA2 are input to the register portion 120. The signals LDA1 and LDA2 are signals for controlling data loading.

The scan chain register portions 110a and 110b include respective N registers 111a and 111b. The scan clock signal SCK1 and signals SVA1, SVB1, and LDB1 are input to the scan chain register portion 110a. The scan clock signal SCK2 and signals SVA2, SVB2, and LDB2 are input to the scan chain register portion 110b. The signals LDB1 and LDB2 are signals for controlling data loading. The signals SVA1, SVA2, SVB1, and SVB2 are signals for controlling data saving.

The register 121 includes a latch circuit 122 and a MUX (multiplexer) 123. The register 111a includes a selector 112a, a flip-flop circuit 113a, a retention circuit 114a, and nodes SDI1 and SDO1. The register 111b includes a selector 112b, a flip-flop circuit 113b, a retention circuit 114b, and nodes SDI2 and SDO2. The nodes SDI1 and SDI2 are nodes to which data is input. The nodes SDO1 and SDO2 are nodes from which data is output.

The register 121 is a volatile register. Nodes Q and R are output nodes of the latch circuit 122 and output data with the same logic. The node Q is connected to the comparator circuit 53 or the comparator circuit 54. The node R is connected to the registers 111a and 111b. There is no particular limitation on the latch circuit 122, and another circuit such as a flip-flop circuit may alternatively be provided.

The MUX 123 has a function of selecting data to be input to the latch circuit 122. The signals LDA1 and LDA2 are control signals for the MUX 123. In the example of FIG. 7, data in the latch circuit 122 is updated by data of the node SDO1 when the signal LDA1 is at high level and LDA2 is at low level. On the other hand, data in the latch circuit 122 is updated by data of the node SDO2 when the signal LDA1 is at low level and LDA2 is at high level.

The registers 111a and 111b are nonvolatile registers. A more specific circuit structure example of the registers 111a and 111b is described with reference to FIG. 8.

In the register 111a, the selector 112a and the flip-flop circuit 113a constitute a scan flip-flop circuit. When the scan chain register portion 110a operates as a shift register, the register 111a takes data from the node SDI1 and outputs the data from the node SDO1. The data of the node SDO1 is input to the node SDI1 in the next-stage register 111a.

The signal SVA1 is a control signal for the selector 112a. When the signal SVA1 is at high level, the selector 112a establishes electrical continuity between an input node of the flip-flop circuit 113a and the node R of the register 121. When the signal SVA1 is at low level, the selector 112a establishes electrical continuity between the input node of the flip-flop circuit 113a and the node SDI1.

Figure 8:
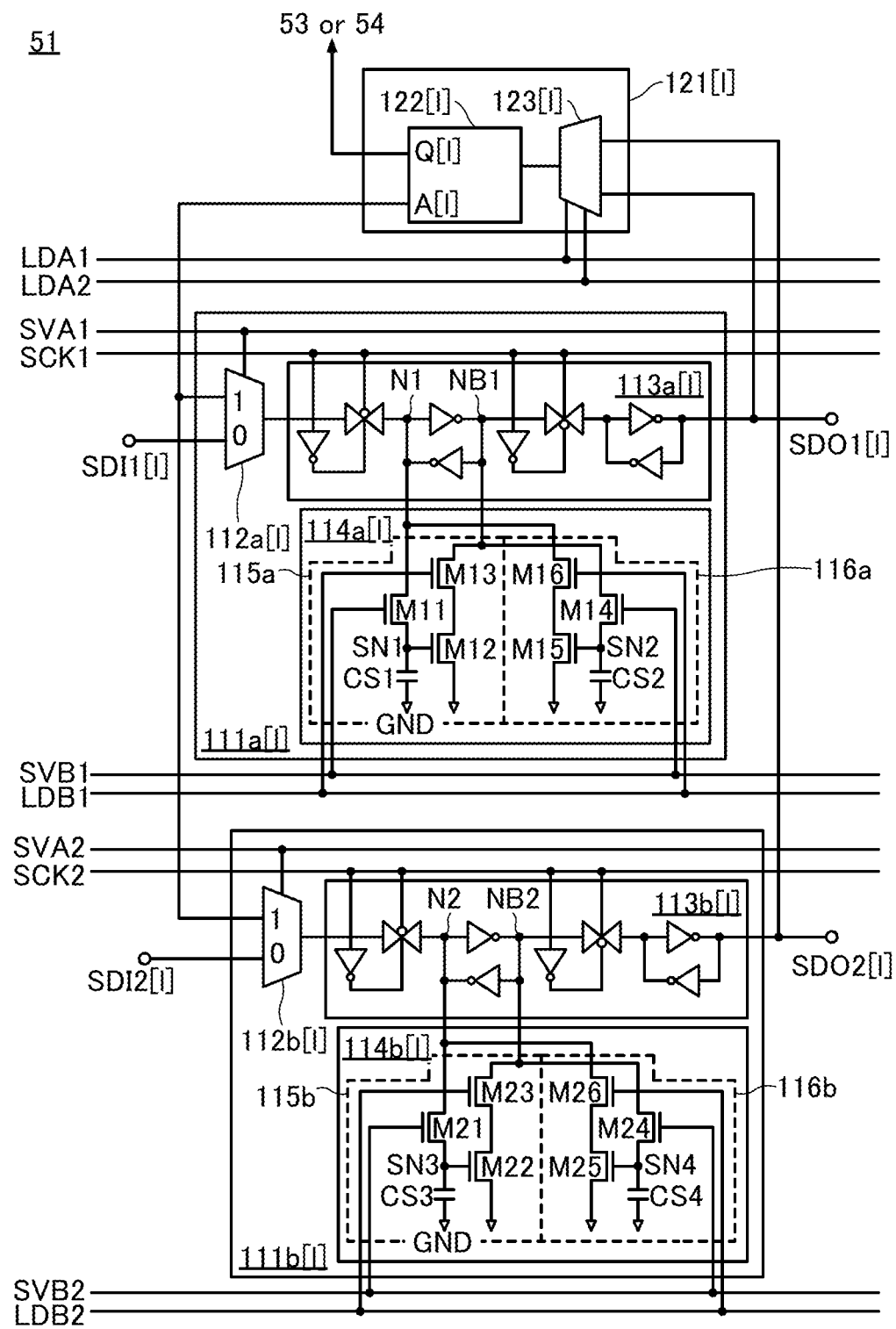
FIG. 8 A diagram illustrating a structure example of a register.

The flip-flop circuit 113a is not limited to the circuit structure in FIG. 8, and a variety of flip-flop circuits can be employed. The retention circuit 114a is connected to nodes N1 and NB1 of the flip-flop circuit 113a. The signals LDB1 and SVB1 are control signals for the retention circuit 114a.

The retention circuit 114a is a circuit for storing data retained in the flip-flop circuit 113a and includes two memory circuits 115a and 116a. Here, the memory circuits 115a and 116a are composed of a three-transistor gain cell. The memory circuit 115a includes transistors M11 to M13, a capacitor CS1, and a node SN1. The memory circuit 116a includes transistors M14 to M16, a capacitor CS2, and a node SN2. The nodes SN1 and SN2 are retention nodes of the memory circuits 115a and 116a.

The memory circuit 115a has a function of backing up data of the node N1 and loading the backed-up data into the node NB1. The memory circuit 116a has a function of backing up data of the node NB1 and loading the backed-up data into the node N1. In accordance with the signal SVB1, the memory circuit 115a writes data of the node N1 to the node SN1 and the memory circuit 116a writes data of the node NB1 to the node SN2. In accordance with the signal LDB1, the memory circuit 115a writes data of the node SN1 to the node NB1 and the memory circuit 116a writes data of the node SN2 to the node N1.

The transistors M11 and M14 are OS transistors; thus, the retention circuit 114a can retain data for a long time even in a state where the power is shut off. In the register 111a, the transistors other than the transistors M11 and M14 may be Si transistors.

The circuit structure of the register 111b is similar to that of the register 111a; therefore, the description of the register 111a is referred to for the details of the register 111b.

In the register 111b, the selector 112b and the flip-flop circuit 113b constitute a scan flip-flop circuit. The selector 112b selects one of the node R and the node SDI2 in accordance with the signal SVA2, and establishes electrical continuity between the selected node and an input node of the flip-flop circuit 113b.

The retention circuit 114b is connected to nodes N2 and NB2 of the flip-flop circuit 113b. The retention circuit 114b includes memory circuits 115b and 116b. The memory circuit 115b includes transistors M21 to M23, a capacitor CS3, and a node SN3. The memory circuit 116b includes transistors M24 to M26, a capacitor CS4, and a node SN4. The memory circuit 115b stores data of the flip-flop circuit 113b in accordance with the signal SVB2, and loads the retained data into the flip-flop circuit 113b in accordance with the signal LDB2.

The transistors M21 and M24 are OS transistors; thus, the retention circuit 114b can retain data for a long time even in a state where the power is shut off. The transistor M21 and the transistor M24 may be a transistor having a back gate. The same applies to the transistors M11 and M14.

In the register 111b, the transistors other than the transistors M21 and M24 may be Si transistors.

Note that FIG. 8 shows an example where the retention circuit 114b backs up complementary data of the first-stage inverter loop in the flip-flop circuit 113b. The retention circuit 114b may be provided so as to back up complementary data of the subsequent-stage inverter loop in the flip-flop circuit 113b. The same applies to the register 111a. With the retention circuits 114a and 114b having such a structure, backed-up data can be loaded asynchronously, resulting in high-speed data loading. Thus, it is possible to shorten the time it takes during power gating to restore the register 51 to a normal operation state from a power-off state.

[Operation Example of Register]

Figure 9:
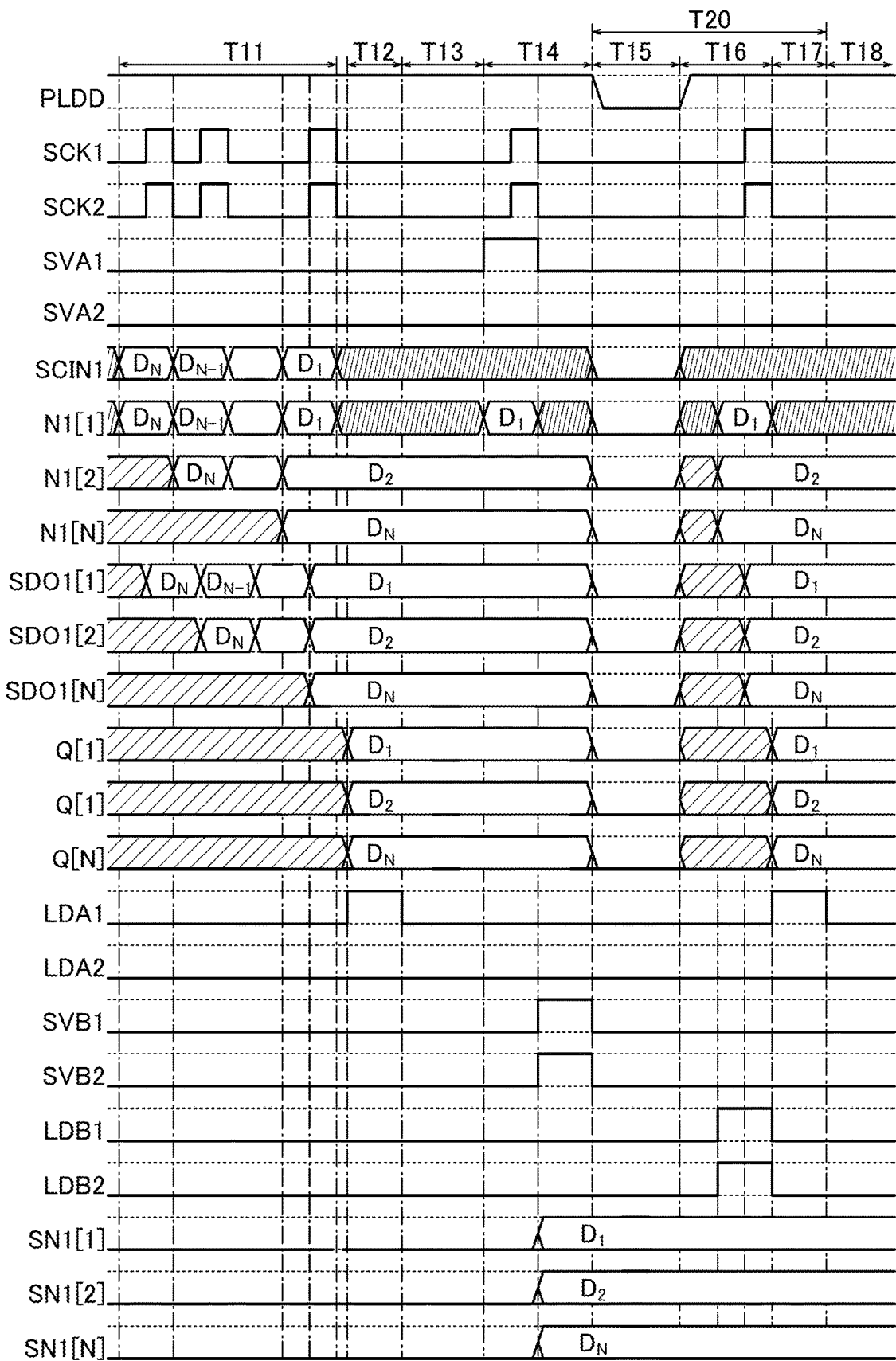
FIG. 9 A timing chart.

An operation example of the register 51 is described with reference to FIG. 9. FIG. 9 is a timing chart showing an operation example of the register 51. PLDD is a wiring that supplies a potential VDD to the register 51. The potential VDD is a power supply potential. A hatched portion of a waveform for the node N1 and the like denotes an indeterminate value where the logic is not fixed at high level or low level.

In a period T11, the scan chain register portions 110a and 110b perform scan operation so that data is written to each of them. During this, the signals SVA1 and SVA2 are at low level, and the scan clock signals SCK1 and SCK2 are active. Thus, electrical continuity between the node SDI1 and the input node of the flip-flop circuit 113a is established by the selector 112a, and electrical continuity between the node SDI2 and the input node of the flip-flop circuit 113b is established by the selector 112b.

To write data to the N registers 111a in the scan chain register portion 110a, data of the node SCIN1 is updated in synchronization with the scan clock signal SCK1. In the register 111a[*l*] (l is an integer of 1 to N), data of the node SDO1[*l*] is updated in synchronization with the rising edge of the scan clock signal SCK1, and data of the node N1[*l*+1] is updated by the data of the node SDO1[*l*] in synchronization with the falling edge of the scan clock signal SCK1. As the scan clock signal SCK1 is repeatedly toggled, data of the node SCIN1 is shifted within the registers 111a. Data stored in each register 111a can be sequentially obtained from the node SCOT1.

Shift operation of the scan chain register portion 110b is performed in a similar manner to that of the scan chain register portion 110a. Data of the node SDO2 is updated in synchronization with the rising edge of the scan clock signal SCK2.

In a period T12, operation of updating data in the register portion 120 is performed. The signal LDA1 changes to high level, whereby electrical continuity between the node SDO1 [l] and an input node of the latch circuit 122[1] is established by the MUX 123[l]. The latch circuit 122[l] stores data Dk that is retained in the register 111a[l]. Data D1 is output from the nodes Q[1] and A[1]. In other words, by setting the signal LDA1 to high level, data D1 to DN retained in the scan chain register portion 110a are collectively loaded into the register portion 120. Accordingly, parameters and the like that the comparator circuit 53 or the comparator circuit 54 uses can be collectively changed.

To update data in the register portion 120 by data retained in the scan chain register portion 110b, the signal LDA1 is kept at low level and the signal LDA2 is set to high level.

Note that in the period T12, electrical continuity is established between the node N1[1] and the node SCIN1 when the scan clock signal SCK1 and the signal SVA1 become low level; hence, the potential of the node N1[1] changes in accordance with the potential of the node SCIN1. Similarly, when the scan clock signal SCK2 and the signal SVA2 become low level, the potential of the node N1[2] changes in accordance with the potential of the node SCIN2.

In a period T13, the register 51 performs normal operation. The data D1 to DN, which are written in the period T12, are output from the nodes Q[1] to Q[N]. During this, the scan chain register portion 110a may perform scan operation to change data in the scan chain register portion 110a. Data in the register portion 120 may be rewritten by setting the signal LDA1 to high level after data in the scan chain register portion 110a is changed. The same applies to the scan chain register portion 110b.

In a period T20, power gating operation of the register 51 is performed. The power gating operation is broadly divided into backup operation for the register 51, operation of turning off power, and recovery operation for the register 51.

In a period T14, the backup operation for the register 51 is performed. First, the signal SVA1 is set to high level, and then the scan clock signal SCK1 is set to high level, whereby the data D1 to DN stored in the register portion 120 are written to the flip-flop circuit 113a in the scan chain register portion 110a. In the example of FIG. 9, the scan clock signal SCK2 is set to high level together with the scan clock signal SCK1 to simplify signal control; however, the scan clock signal SCK2 may be kept at low level.

When the signal SVA1 becomes high level, the selector 112a establishes electrical continuity between the node A of the latch circuit 122 and the input node of the flip-flop circuit 113a. Since the scan clock signal SCK1 is at low level, data of the node A is written to the node N1 of the flip-flop circuit 113a. When the scan clock signal SCK1 changes to high level, electrical continuity between the node N1 and the node A is broken, and electrical continuity between the node N1[1] and the node SCIN1 is broken.

Note that in the case where data stored in the register portion 120 is data loaded from the scan chain register portion 110b, the data in the register portion 120 is backed up in the scan chain register portion 110b. In this case, the signal SVA2 is set to high level, and then the scan clock signal SCK2 is set to high level.

Next, backup operation for the scan chain register portions 110a and 110b is performed. During this, the signals SVB1 and SVB2 are set to high level. When the signal SVB1 becomes high level, data of the nodes N1 and NB1 in the flip-flop circuit 113a is written to the nodes SN1 and SN2 in the retention circuit 114a. When the signal SVB2 becomes high level, data of the nodes N2 and NB2 in the flip-flop circuit 113b is written to the nodes SN3 and SN4 in the retention circuit 114b.

By setting the signals SVB1 and SVB2 to low level, the backup operation for the register 51 is completed.

In a period T15, the operation of turning off power is performed. Supply of the potential VDD to the wiring PLDD is stopped. The wiring PLDD is gradually discharged. Since the potential of the wiring PLDD decreases, data in the latch circuit 122 and the flip-flop circuits 113a and 113b is lost; however, data in the retention circuits 114a and 114b is not lost.

In a period T16, recovery operation for the scan chain register portions 110a and 110b is performed. First, supply of the potential VDD to the wiring PLDD is started. The potential of the wiring PLDD increases and then becomes the potential VDD.

Next, the signals LDB1 and LDB2 are set to high level, and one clock of each of the scan clock signals SCK1 and SCK2 is input. When the signal LDB1 becomes high level, the retention circuit 114a writes data of the nodes SN1 and SN2 to the nodes N1 and NB1 in the flip-flop circuit 113a. The data of the node N1 is input to the node SDO1 in synchronization with the rising edge of the scan clock signal SCK1. When the signal LDB2 becomes high level, the retention circuit 114b writes data of the nodes SN3 and SN4 to the nodes N2 and NB2 in the flip-flop circuit 113b. The data of the node N2 is input to the node SDO2 in synchronization with the rising edge of the scan clock signal SCK2.

By setting the signals LDB1 and LDB2 to low level, the recovery operation is completed.

In a period T17, recovery operation for the register portion 120 is performed. The signal LDA1 is set to high level to restore the register portion 120 to the state in the period T13. The recovery operation in the period T17 is the same as the operation of updating data in the register portion 120 in the period T13; the data D1 to DN retained in the scan chain register portion 110a are collectively loaded into the register portion 120. By setting the signal LDA1 to low level, the recovery operation is completed.

In a period T18, the register 51 performs normal operation and outputs the data D1 to DN, which are written in the period T17, from the nodes Q[1] to Q[N].

With the above-described operation, collective change of parameters used in the comparator circuit 53 or the comparator circuit 54 and power gating of the register 51 can be performed.

<Structure Example of Pixel>

Next, a specific structure example of the pixels 22 in FIG. 1 is described.

Figure 10A:
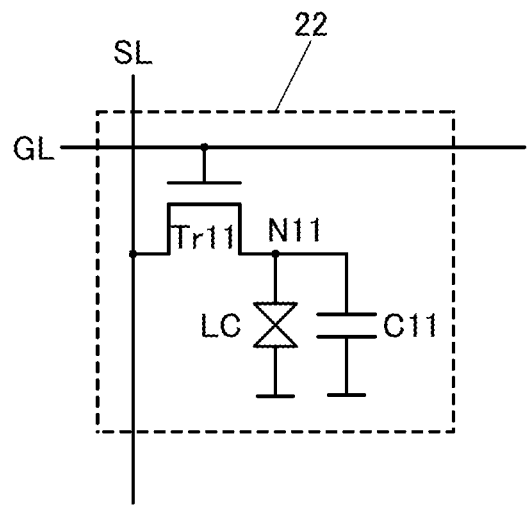
FIGS. 10A and 10B Diagrams illustrating structure examples of a pixel.

FIG. 10(A) illustrates a structure example of a pixel using a liquid crystal element.

The pixel 22 shown in FIG. 10(A) includes a transistor Tr11, a capacitor C11, and a liquid crystal element LC. Note that although the transistor Tr11 is of n-channel type here, the polarity of the transistor can be changed as appropriate.

A gate of the transistor Tr11 is connected to the wiring GL, one of a source and a drain is connected to one electrode of the liquid crystal element LC and one electrode of the capacitor C11, and the other of the source and the drain is connected to the wiring SL. The other electrode of the liquid crystal element LC and the other electrode of the capacitor C11 are each connected to a wiring to which a predetermined potential is supplied. A node that is connected to the one of the source and the drain of the transistor Tr11, the one electrode of the liquid crystal element LC, and the one electrode of the capacitor C11 is referred to as a node N11.

Note that in this specification and the like, a source of a transistor means a source region that is part of a semiconductor layer functioning as a channel region, a source electrode connected to the semiconductor layer, or the like. Similarly, a drain of a transistor means a drain region that is part of the semiconductor layer, a drain electrode connected to the semiconductor layer, or the like. Moreover, a gate means a gate electrode or the like.

The terms "source" and "drain" of a transistor interchange with each other according to the conductivity type of the transistor and the levels of potentials applied to the terminals. In general, in an n-channel transistor, a terminal to which a low potential is applied is called a source, and a terminal to which a high potential is applied is called a drain. In addition, in a p-channel transistor, a terminal to which a low potential is applied is called a drain, and a terminal to which a high potential is applied is called a source. In this specification, the connection relation of a transistor is sometimes described assuming for convenience that its source and drain are fixed; actually, the names of the source and the drain interchange with each other according to the relation of the above-described potentials.

The potential of the other electrode of the liquid crystal element LC may be a common potential among the plurality of pixels 22 or may be the same potential as the other electrode of the capacitor C11. Alternatively, the potential of the other electrode of the liquid crystal element LC may differ between the pixels 22. Furthermore, the capacitor C11 has a function of a storage capacitor for retaining the potential of the node N11.

The transistor Tr11 has a function of controlling the supply of the potential of the wiring SL to the node N11. Specifically, the potential of the wiring GL is controlled to turn on the transistor Tr11, whereby the potential of the wiring SL (corresponding to an image signal) is supplied to the node N11 and written to the pixel 22. After that, the potential of the wiring GL is controlled to turn off the transistor Tr11, whereby the potential of the node N11 is retained.

The liquid crystal element LC includes a pair of electrodes and a liquid crystal layer containing a liquid crystal material to which a voltage between the pair of electrodes is applied. The alignment of liquid crystal molecules included in the liquid crystal element LC changes in accordance with the value of the voltage applied between the pair of electrodes, and thus the transmittance of the liquid crystal layer is changed. Consequently, the gray level of the pixel 22 can be controlled by controlling a potential supplied from the wiring SL to the node N11.

Figure 10B:
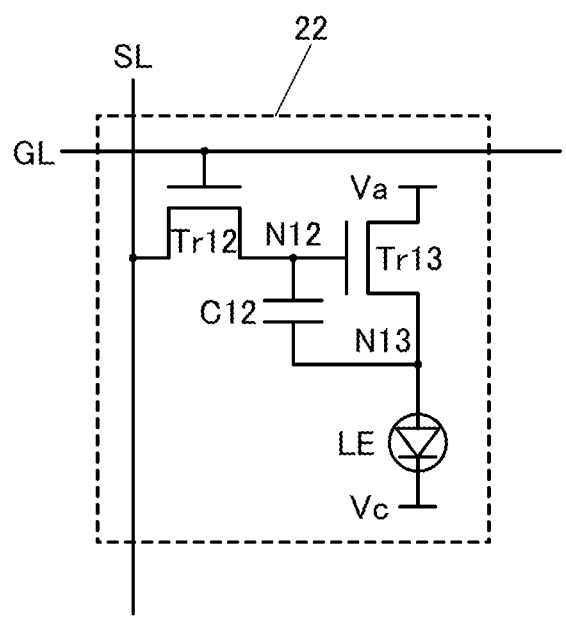

FIG. 10(B) illustrates a structure example of the pixel 22 using a light-emitting element. The pixel 22 shown in FIG. 10(B) includes transistors Tr12 and Tr13, a capacitor C12, and a light-emitting element LE. Note that although the transistors Tr12 and Tr13 are of n-channel type here, the polarity of the transistors can be changed as appropriate.

A gate of the transistor Tr12 is connected to the wiring GL, one of a source and a drain is connected to a gate of the transistor Tr13 and one electrode of the capacitor C12, and the other of the source and the drain is connected to the wiring SL. One of a source and a drain of the transistor Tr13 is connected to the other electrode of the capacitor C12 and one electrode of the light-emitting element LE, and the other of the source and the drain is connected to a wiring to which a potential Va is supplied. The other electrode of the light-emitting element LE is connected to a wiring to which a potential Vc is supplied. A node that is connected to the one of the source and the drain of the transistor Tr12, the gate of the transistor Tr13, and the one electrode of the capacitor C12 is referred to as a node N12. A node that is connected to the one of the source and the drain of the transistor Tr13 and the other electrode of the capacitor C12 is referred to as a node N13.

Here, the case where the potential Va is a high power supply potential and the potential Vc is a low power supply potential is described. Additionally, the capacitor C12 has a function of a storage capacitor for retaining the potential of the node N12.

The transistor Tr12 has a function of controlling the supply of the potential of the wiring SL to the node N12. Specifically, the potential of the wiring GL is controlled to turn on the transistor Tr12, whereby the potential of the wiring SL that corresponds to an image signal (corresponding to an image signal) is supplied to the node N12 and written to the pixel 22. After that, the potential of the wiring GL is controlled to turn off the transistor Tr12, whereby the potential of the node N12 is retained.

Then, the amount of current flowing between the source and the drain of the transistor Tr13 is controlled in accordance with the voltage between the nodes N12 and N13, and the light-emitting element LE emits light with a luminance corresponding to the amount of flowing current. Accordingly, the gray level of the pixel 22 can be controlled. Note that the transistor Tr13 is preferably operated in a saturation region.

The above-described operation is sequentially performed for every wiring GL, whereby an image for a first frame can be displayed.

Note that the selection of the wirings GL may be performed by a progressive method or an interlace method. In addition, the supply of image signals to the wirings SL may be performed by dot sequential driving in which image signals are sequentially supplied to the wirings SL, or may be performed by line sequential driving in which image signals are concurrently supplied to all the wirings SL. Alternatively, the supply of image signals may be sequentially performed for every plural wirings SL.

After that, in a second frame period, an image is displayed by operation similar to that in a first frame period. Thus, the image displayed on the pixel portion 20 is rewritten.

As a semiconductor used for the transistors included in the pixels 22, a Group 14 element such as silicon or germanium, a compound semiconductor such as gallium arsenide, an organic semiconductor, a metal oxide, or the like can be used. The semiconductor may be a non-single-crystal semiconductor (e.g., an amorphous semiconductor, a microcrystalline semiconductor, or a polycrystalline semiconductor) or a single crystal semiconductor.

Here, the transistors included in the pixels 22 preferably contain an amorphous semiconductor, in particular, hydrogenated amorphous silicon (a-Si:H) in channel formation regions. Transistors using an amorphous semiconductor easily deal with the increase in substrate area; thus, when a large-screen display device that is compatible with 2K, 4K, or 8K broadcasting, for example, is manufactured, the manufacturing process can be simplified. Furthermore, as described above, the semiconductor device 10 according to one embodiment of the present invention can operate at high speed with the pixel portion 20 divided into a plurality of regions 21. For this reason, when an amorphous semiconductor with which it is comparatively difficult to increase the field-effect mobility is used for the transistors provided in the pixels 22, employing the structure of the semiconductor device 10 is particularly effective.

Alternatively, the transistors included in the pixels 22 may be transistors containing a metal oxide in channel formation regions, that is, OS transistors. Since OS transistors have an extremely low off-state current, in the case where OS transistors are used as the transistors Tr11 or the transistors Tr12, image signals can be held in the pixels 22 for an extremely long period. This enables the update frequency of image signals to be extremely low in a period when there is no change in the image displayed on the pixel portion 20 or a period when the change is at a certain level or lower. The update frequency of image signals can be set less than or equal to once every 0.1 seconds, less than or equal to once every second, or less than or equal to once every 10 seconds, for example. In particular, when a large number of pixels 22 are provided to be compatible with 2K, 4K, or 8K broadcasting or the like, reducing the power consumption by skipping update of image signals is effective.

As described above, in one embodiment of the present invention, the pixel portion 20 is divided into a plurality of regions 21 and the pulse width of selection signals is controlled, whereby writing of image signals to the pixels 22 can be accurately performed while selection periods for the pixels 22 are kept short. Accordingly, a variation in gray level among adjacent pixels in a junction region between the regions 21 can be reduced, and the image continuity can be secured.

This embodiment can be combined with the description of the other embodiments as appropriate.

Embodiment 2

In this embodiment, another structure example of the semiconductor device described in the above embodiment will be described.

Figure 11:
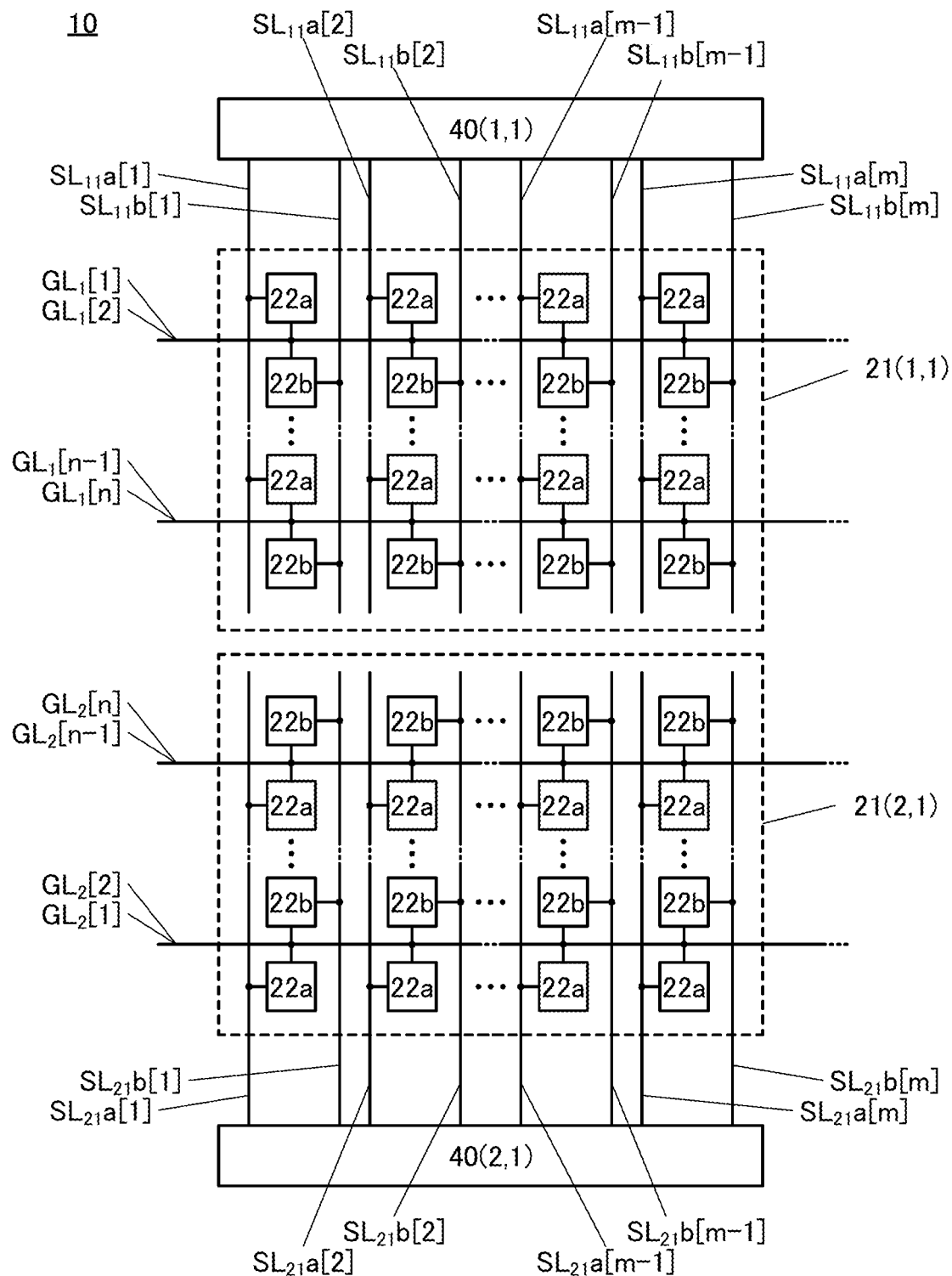
FIG. 11 A diagram illustrating a structure example of a semiconductor device.

FIG. 11 shows another structure example of the semiconductor device 10. The semiconductor device 10 illustrated in FIG. 11 is different from that in FIG. 1 in that the number of wirings SL is an integral multiple of the number of columns of the pixels 22 (m×M, where M is an integer of 2 or more). Here, as an example, a structure in which the number of wirings SL is twice the number of columns of the pixels 22 (M=2) will be described. Note that although FIG. 11 illustrates the regions 21(1, 1) and (2, 1) as a typical example, a similar structure can also be used for the other regions 21.

The semiconductor device 10 includes m wirings SLa (SLa[1] to [m]) and m wirings SLb (SLb[1] to [m]). The pixel 22 is connected to one of the wiring SLa and the wiring SLb. FIG. 11 shows a structure example where pixels 22a belonging to odd-numbered rows are connected to the wirings SLa and pixels 22b belonging to even-numbered rows are connected to the wirings SLb.

Image signals are supplied to the pixel 22a, which belongs to an odd-numbered row, and the pixel 22b, which belongs to an even-numbered row, from different wirings SL. Thus, selection signals can be concurrently supplied to the pixel 22a, which belongs to an odd-numbered row, and the pixel 22b, which belongs to an even-numbered row. For example, in FIG. 11, selection signals can be concurrently supplied to the wiring $GL_1[1]$ and the wiring $GL_1[2]$, the wiring $GL_1[n-1]$ and the wiring $GL_1[n]$, the wiring $GL_2[1]$ and the wiring $GL_2[2]$, or the wiring $GL_1[n-1]$ and the wiring $GL_1[n]$. Accordingly, the scan period for the wirings GL can be shortened, and the operating speed of the semiconductor device 10 can be improved.

Note that the wirings GL to which selection signals are simultaneously supplied can be merged. In FIG. 11, the wiring $GL_1[1]$ and the wiring $GL_1[2]$, the wiring $GL_1[n-1]$ and the wiring $GL_1[n]$, the wiring $GL_2[1]$ and the wiring $GL_2[2]$, and the wiring $GL_1[n-1]$ and the wiring $GL_1[n]$ are merged. Consequently, the number of wirings GL can be reduced, and the area of the semiconductor device 10 can be reduced.

Note that although the case where the number of wirings SL is twice the number of columns of the pixels 22 (M=2) is described here, M may be 3 or more. In this case, selection signals can be simultaneously supplied to M wirings GL. Moreover, a structure in which the M wirings GL are merged can be used.

In particular, when an amorphous semiconductor is used as the semiconductor used for the transistors included in the pixels 22, the structure illustrated in FIG. 11 is preferably employed to maintain high-speed operation of the semiconductor device 10.

This embodiment can be combined with the description of the other embodiments as appropriate.

Embodiment 3

In this embodiment, a structure example of a display panel including the semiconductor device described in the above embodiment will be described.

Figure 12:
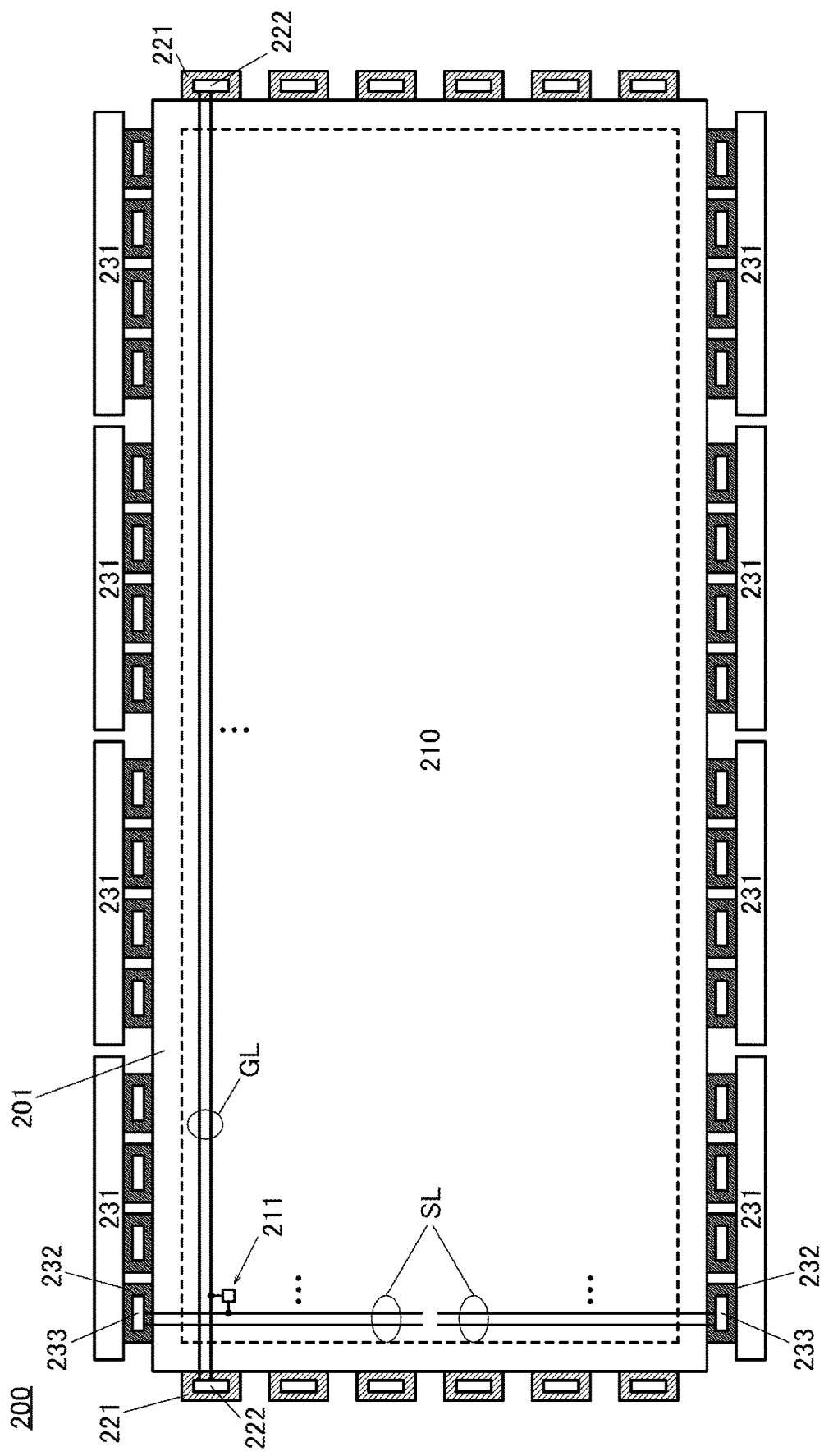
FIG. 12 A diagram illustrating a structure example of a display panel.

A display panel that displays an image can be configured using the semiconductor device 10 described in the above embodiment. FIG. 12 illustrates a structure example of a display panel 200.

The display panel 200 includes a display portion 210 provided over a substrate 201. The display portion 210 includes a plurality of pixels 211 connected to the wirings GL and the wirings SL. Note that the display portion 210 corresponds to the pixel portion 20 in FIG. 1.

Furthermore, the display panel 200 is provided with a plurality of TAB (Tape Automated Bonding) tapes 221 where a wiring circuit is formed. Integrated circuits 222 are mounted on the TAB tapes 221 by a TAB method, and the driver circuits 30 and the signal generator circuits 50 in FIG. 1 are formed in the integrated circuits 222. The integrated circuits 222 are connected to the plurality of wirings GL and have a function of supplying selection signals to the wirings GL.

The display panel 200 is also provided with a plurality of printed boards 231 and a plurality of TAB tapes 232. The printed boards 231 are each connected to a plurality of TAB tapes 232 and have a function of distributing signals input from the outside to the TAB tapes 232. Moreover, integrated circuits 233 are mounted on the TAB tapes 232, and the driver circuits 40 in FIG. 1 are formed in the integrated circuits 233. The integrated circuits 233 are connected to the plurality of wirings SL and have a function of supplying selection signals to the wirings SL.

To manufacture a large-screen display panel that is compatible with 2K, 4K, or 8K broadcasting or the like, a plurality of printed boards 231 are preferably provided as illustrated in FIG. 12. Consequently, image data can be easily input to the display panel 200.

Note that the integrated circuits 222 and the integrated circuits 233 can alternatively be provided over the substrate 201 by a COG (Chip On Glass) method, a COF (Chip on Film) method, or the like.

When an amorphous semiconductor is used for transistors included in the pixels 211, it is preferable to separately form the driver circuits 30, the driver circuits 40, the signal generator circuits 50, and the like by using the integrated circuits 222 and the integrated circuits 233 as illustrated in FIG. 12. Thus, the operating speed can be improved.

On the other hand, when OS transistors are used as the transistors included in the pixels 211, OS transistors constituting the driver circuits 30 and the like can be formed over the substrate 201 at the same time. Since OS transistors have high field-effect mobility, the driver circuits 30 and the like can be formed using OS transistors. In this case, the integrated circuits 222 can be omitted.

This embodiment can be combined with the description of the other embodiments as appropriate.

Embodiment 4

In this embodiment, specific structure examples of a display device using the semiconductor device described in the above embodiment will be described. In particular, a display device using a liquid crystal element as a display element is described here.

<Structure Example 1 of Display Device>

Figure 13:
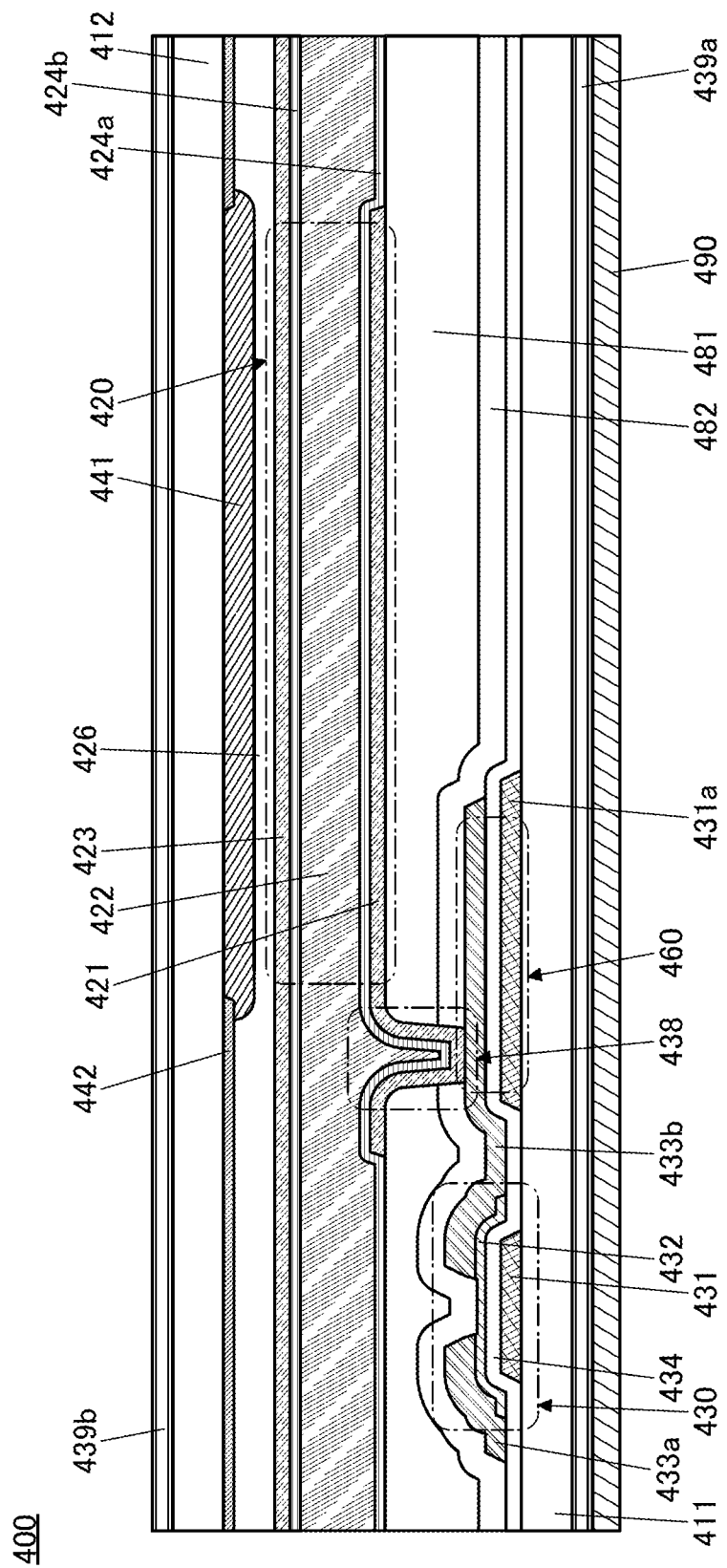
FIG. 13 A diagram illustrating a structure example of a display device.

FIG. 13 illustrates an example of a cross-sectional structure of a display device 400. Here, an example of the case where a transmissive liquid crystal element 420 is used as a display element is shown.

The display device 400 has a structure in which a liquid crystal 422 is placed between a substrate 411 and a substrate 412. The liquid crystal element 420 includes a conductive layer 421 provided on the substrate 411 side, a conductive layer 423 provided on the substrate 412 side, and the liquid crystal 422 placed therebetween. Furthermore, an alignment film 424*a* is provided between the liquid crystal 422 and the conductive layer 421, and an alignment film 424*b* is provided between the liquid crystal 422 and the conductive layer 423.

The conductive layer 421 functions as a pixel electrode. The conductive layer 423 functions as a common electrode or the like. Moreover, the conductive layer 421 and the conductive layer 423 each have a function of transmitting visible light. Thus, the liquid crystal element 420 is a transmissive liquid crystal element.

A coloring layer 441 and a light-blocking layer 442 are provided on a surface of the substrate 412 on the substrate 411 side. An insulating layer 426 is provided to cover the coloring layer 441 and the light-blocking layer 442, and the conductive layer 423 is provided to cover the insulating layer 426. Furthermore, the coloring layer 441 is provided in a region overlapping the conductive layer 421. The light-blocking layer 442 is provided to cover a transistor 430 and a connection portion 438.

A polarizing plate 439*a* is located on the outer side of the substrate 411, and a polarizing plate 439*b* is located on the outer side of the substrate 412. Furthermore, a backlight unit 490 is provided on the outer side of the polarizing plate 439*a*. That is, in the display device 400 illustrated in FIG. 13, the display surface is on the substrate 412 side.

A semiconductor layer, the transistor 430, a capacitor 460, and the like are provided over the substrate 411. The transistor 430 functions as a selection transistor of a pixel. The transistor 430 is connected to the liquid crystal element 420 through the connection portion 438.

The transistor 430 illustrated in FIG. 13 is what is called a channel-etched bottom-gate transistor. The transistor 430 includes a conductive layer 431 functioning as a gate electrode, an insulating layer 434 functioning as a gate insulating layer, a semiconductor layer 432, and a pair of a conductive layer 433*a* and a conductive layer 433*b* functioning as a source electrode and a drain electrode. A portion of the semiconductor layer 432 overlapping the conductive layer 431 functions as a channel formation region. The semiconductor layer 432 is connected to the conductive layer 433*a* and the conductive layer 433*b*.

The capacitor 460 is composed of a conductive layer 431*a*, the insulating layer 434, and the conductive layer 433*b*.

An insulating layer 482 and an insulating layer 481 are stacked to cover the transistor 430 and the like. The conductive layer 421 functioning as a pixel electrode is provided over the insulating layer 481. In the connection portion 438, the conductive layer 421 and the conductive layer 433*b* are electrically connected through an opening provided in the insulating layer 481 and the insulating layer 482. The insulating layer 481 preferably functions as a planarization layer. The insulating layer 482 preferably has a function of a protective film that inhibits diffusion of impurities or the like to the transistor 430 and the like. For example, an inorganic insulating material can be used for the insulating layer 482 and an organic insulating material can be used for the insulating layer 481.

<Structure Example 2 of Display Device>

Figure 14:
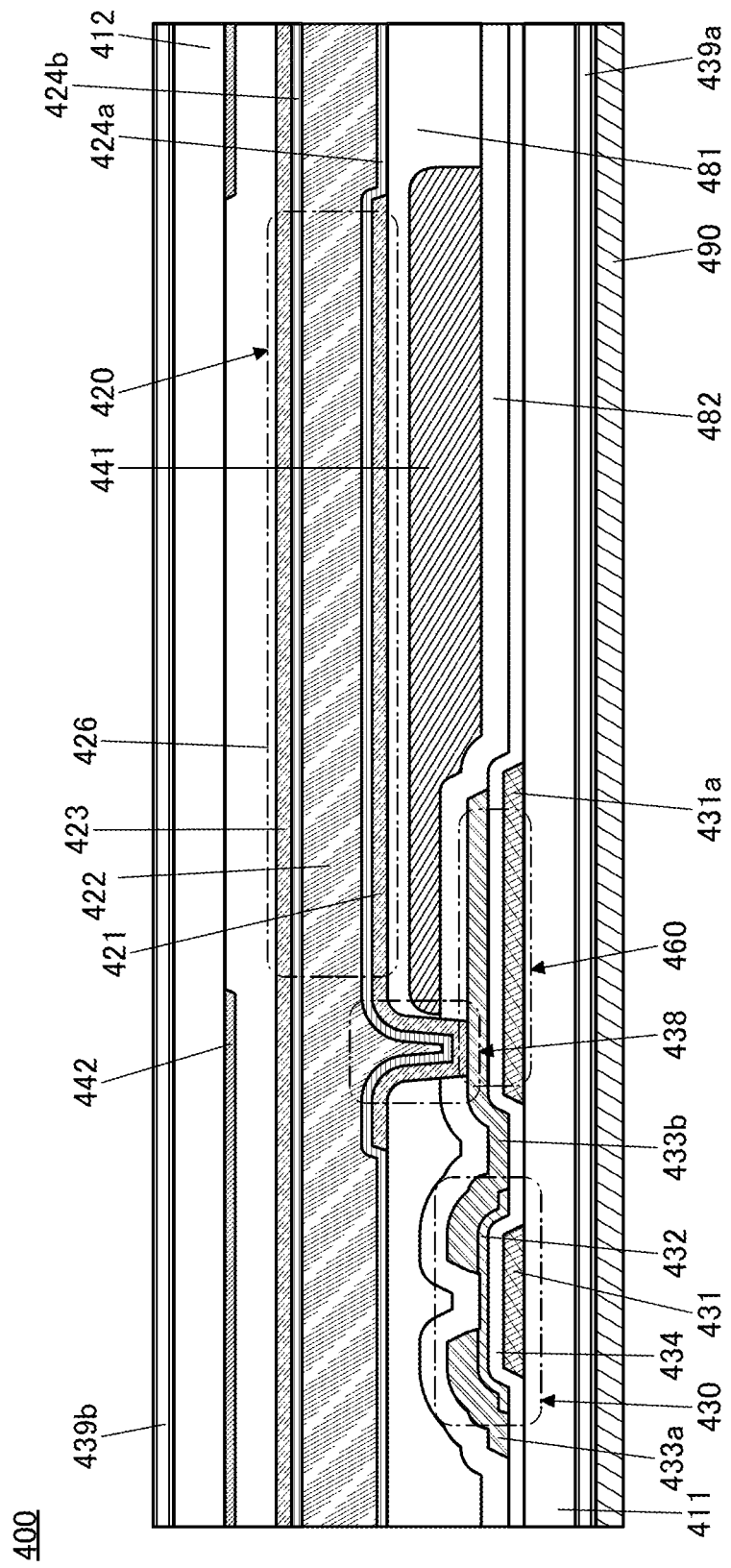
FIG. 14 A diagram illustrating a structure example of a display device.

FIG. 14 illustrates an example of the case where the coloring layer 441 is provided on the substrate 411 side. In this case, the structure on the substrate 412 side can be simplified.

Note that a structure where the insulating layer 481 is not provided may be employed when the coloring layer 441 is used as a planarization film.

<Structure Example 3 of Display Device>

The examples of a vertical electric field mode liquid crystal element in which a pair of electrodes that sandwich the liquid crystal are provided at the top and bottom are shown above as the liquid crystal element; however, the structure of the liquid crystal element is not limited thereto and liquid crystal elements of various modes can be used.

Figure 15:
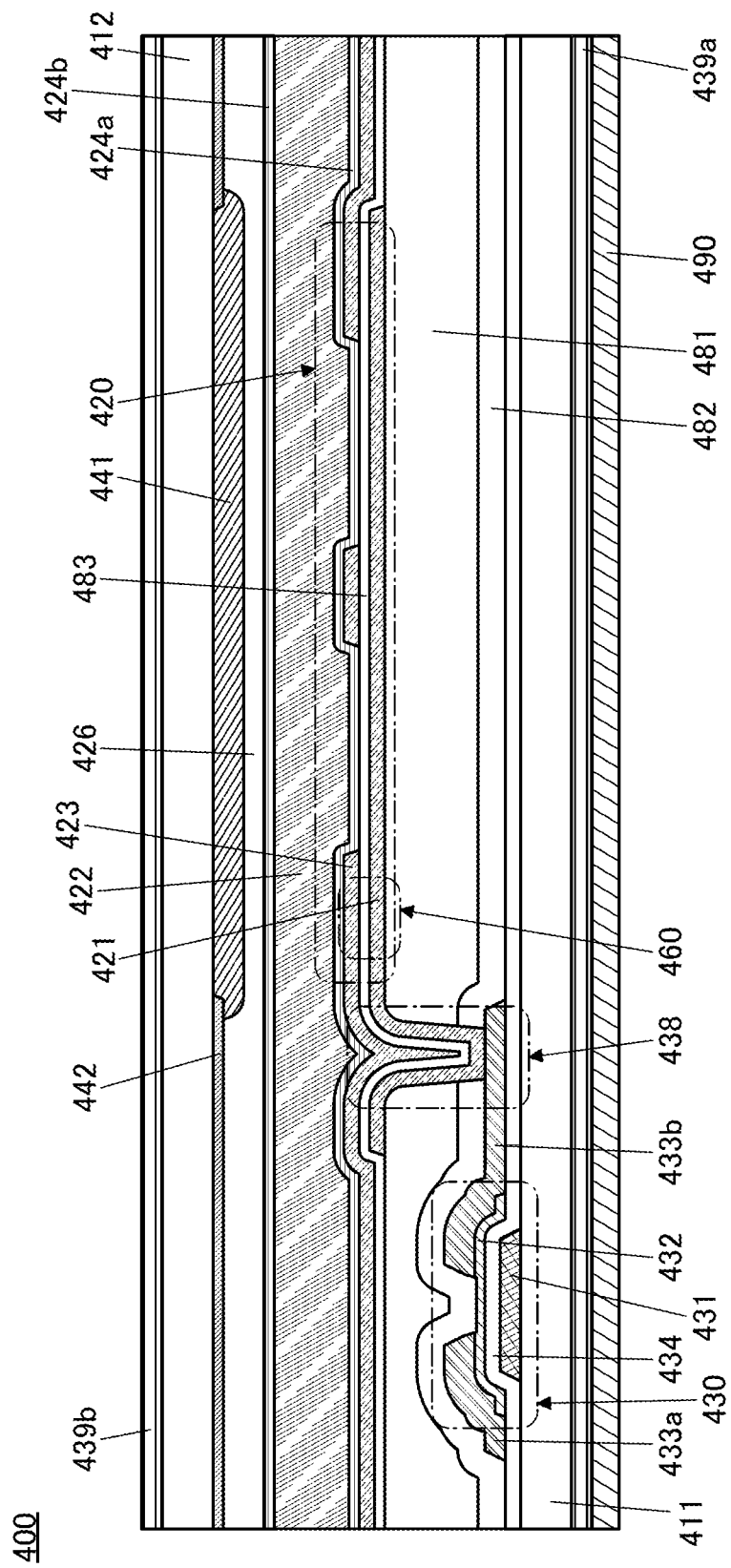
FIG. 15 A diagram illustrating a structure example of a display device.

FIG. 15 is a schematic cross-sectional view of a display device including a liquid crystal element employing an FFS (Fringe Field Switching) mode.

The liquid crystal element 420 includes the conductive layer 421 functioning as a pixel electrode and the conductive layer 423 overlapping the conductive layer 421 with an insulating layer 483 therebetween. The conductive layer 423 has a slit-like or comb-like top surface.

In this structure, a capacitance is formed in a portion where the conductive layer 421 and the conductive layer 423 overlap, and this can be used as the capacitor 460. Thus, the area occupied by the pixel can be reduced, so that a high-resolution display device can be achieved. Moreover, the aperture ratio can be improved.

Figure 16:
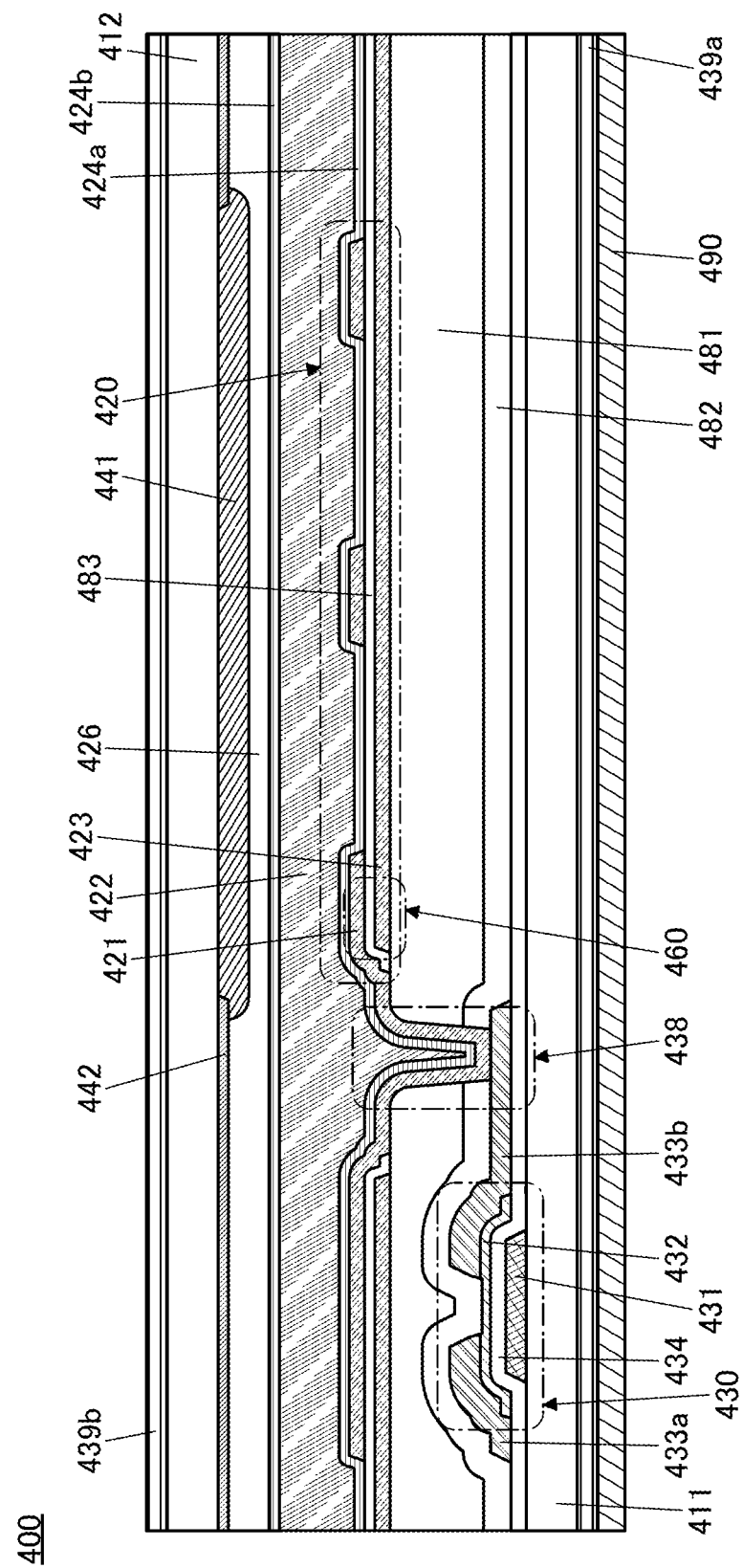
FIG. 16 A diagram illustrating a structure example of a display device.

Although FIG. 15 shows the structure in which the conductive layer 423 functioning as a common electrode is placed on the liquid crystal 422 side, the conductive layer 421 functioning as a pixel electrode may be placed on the liquid crystal 422 side as illustrated in FIG. 16. In this case, the conductive layer 421 has a slit-like or comb-like top surface.

Here, at the time of manufacturing a display device, the smaller the number of photolithography steps in the manufacturing process is, that is, the smaller the number of photomasks is, the lower the manufacturing cost can be.

For example, the display device having the structure illustrated in FIG. 13 can be manufactured through five photolithography steps in total among steps on the substrate 411 side, which are a step of forming the conductive layer 431 and the like, a step of forming the semiconductor layer 432, a step of forming the conductive layer 433a and the like, a step of forming an opening to be the connection portion 438, and a step of forming the conductive layer 421. That is, a backplane substrate can be manufactured with five photomasks. Meanwhile, on the substrate 412 (counter substrate) side, an ink-jet method, a screen printing method, or the like is preferably used as the methods for forming the coloring layer 441 and the light-blocking layer 442, in which case a photomask becomes unnecessary. For example, in the case where three-color coloring layers 441 and the light-blocking layer 442 are provided, four photomasks in total can be reduced compared with the case where they are formed by a photolithography method.

<Structure Example 1 of Transistor>

Next, specific structure examples of the transistor 430 will be described. A semiconductor containing silicon can be used for the semiconductor layer 432 of the transistor described below. For example, hydrogenated amorphous silicon, microcrystalline silicon, polycrystalline silicon, or the like can be used as the semiconductor containing silicon. Hydrogenated amorphous silicon is particularly preferable because it can be formed over a large substrate with high yield. A display device of one embodiment of the present invention can perform favorable display even with a transistor that uses amorphous silicon and has comparatively low field-effect mobility.

Figure 17A:
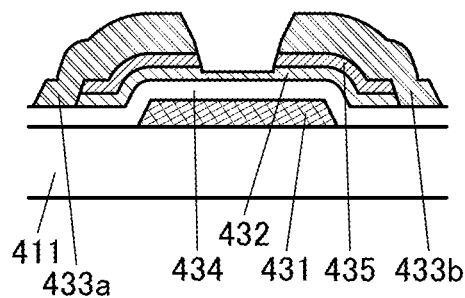
FIGS. 17A-17G Diagrams illustrating structure examples of a transistor.

A transistor illustrated in FIG. 17(A) includes a pair of impurity semiconductor layers 435 functioning as a source region and a drain region. The impurity semiconductor layers 435 are provided between the semiconductor layer 432 and the conductive layer 433a and between the semiconductor layer 432 and the conductive layer 433b. The semiconductor layer 432 and the impurity semiconductor layers 435 are provided in contact with each other. The impurity semiconductor layer 435 is provided in contact with the conductive layer 433a or the conductive layer 433b.

An impurity semiconductor film to form the impurity semiconductor layer 435 is formed using a semiconductor to which an impurity element imparting one conductivity type is added. In the case where the transistor is of n-type, silicon to which P or As is added can be given as an example of the semiconductor to which an impurity element imparting one conductivity type is added. Alternatively, in the case where the transistor is of p-type, it is possible to add B, for example, as the impurity element imparting one conductivity type; however, the transistor is preferably of n-type. Note that the impurity semiconductor layer may be formed using an amorphous semiconductor or may be formed using a crystalline semiconductor such as a microcrystalline semiconductor.

Figure 17B:
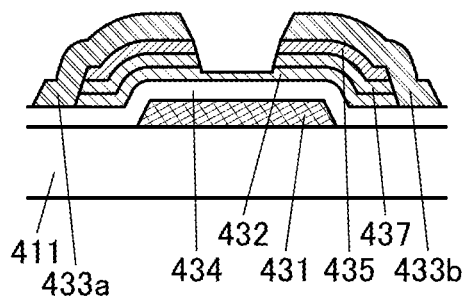

A transistor illustrated in FIG. 17(B) includes a semiconductor layer 437 between the semiconductor layer 432 and the impurity semiconductor layer 435.

The semiconductor layer 437 may be formed using a semiconductor film similar to the semiconductor layer 432. The semiconductor layer 437 can function as an etching stopper for preventing the semiconductor layer 432 from disappearing by etching in the etching of the impurity semiconductor layer 435. Note that although FIG. 17(B) shows an example where the semiconductor layer 437 is separated into left and right portions, part of the semiconductor layer 437 may cover a channel formation region of the semiconductor layer 432.

In addition, the semiconductor layer 437 may include an impurity at a concentration lower than that in the impurity semiconductor layer 435. Thus, the semiconductor layer 437 can function as an LDD (Lightly Doped Drain) region, so that hot-carrier degradation at the time when the transistor is driven can be suppressed.

Figure 17C:
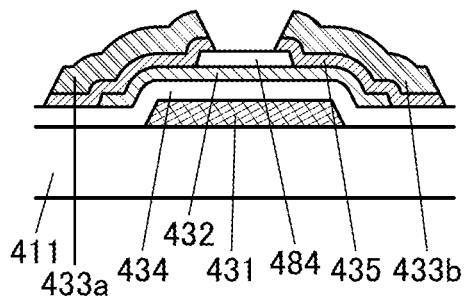

In a transistor illustrated in FIG. 17(C), an insulating layer 484 is provided over a channel formation region of the semiconductor layer 432. The insulating layer 484 functions as an etching stopper in the etching of the impurity semiconductor layer 435.

Figure 17D:
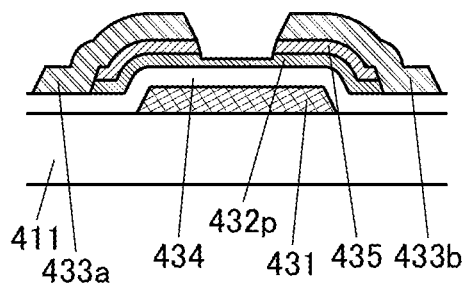

A transistor illustrated in FIG. 17(D) includes a semiconductor layer 432p instead of the semiconductor layer 432. The semiconductor layer 432p includes a semiconductor film having high crystallinity. For example, the semiconductor layer 432p contains a polycrystalline semiconductor or a single crystal semiconductor. Thus, the transistor can have high field-effect mobility.

Figure 17E:
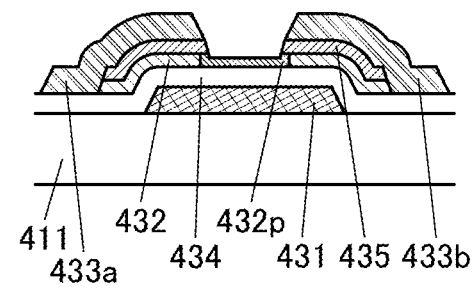

A transistor illustrated in FIG. 17(E) includes the semiconductor layer 432p in a channel formation region of the semiconductor layer 432. For example, the transistor illustrated in FIG. 17(E) can be formed by irradiating a semiconductor film to be the semiconductor layer 432 with laser light or the like so that the semiconductor film is crystallized locally. In this way, a transistor having high field-effect mobility can be achieved.

Figure 17F:
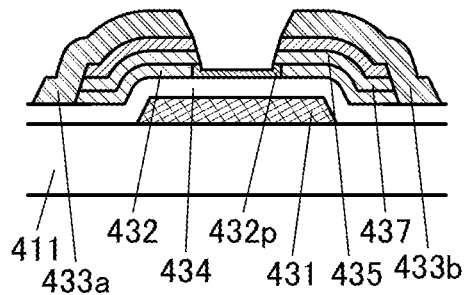

A transistor illustrated in FIG. 17(F) includes the crystalline semiconductor layer 432p in a channel formation region of the semiconductor layer 432 of the transistor illustrated in FIG. 17(B).

Figure 17G:
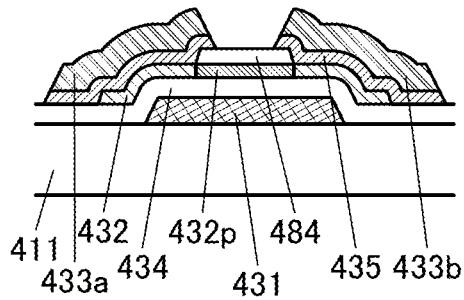

A transistor illustrated in FIG. 17(G) includes the crystalline semiconductor layer 432p in a channel formation region of the semiconductor layer 432 of the transistor illustrated in FIG. 17(C).

<Structure Example 2 of Transistor>

Next, other variation examples of the transistor 430 will be described. Note that an OS transistor can be formed by using a metal oxide for the semiconductor layer 432 of the transistor described below. When an OS transistor is used, the update frequency of image signals can be set extremely low in a period when there is no change in the image or a period when the change is at a certain level or lower; hence, power consumption can be reduced.

Figure 18A:
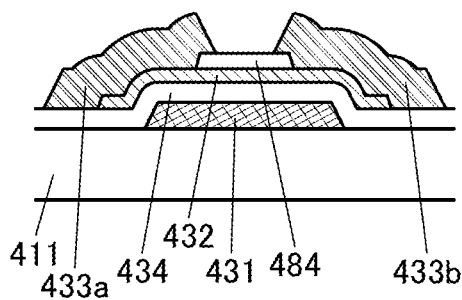
FIGS. 18A-18E Diagrams illustrating structure examples of a transistor.

In a transistor illustrated in FIG. 18(A), the insulating layer 484 is provided over a channel formation region of the semiconductor layer 432. The insulating layer 484 functions as an etching stopper in the etching of the conductive layer 433a and the conductive layer 433b.

Figure 18B:
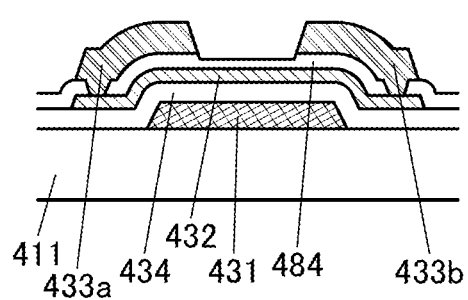

A transistor illustrated in FIG. 18(B) has a structure in which the insulating layer 484 covers the semiconductor layer 432 and extends over the insulating layer 434. In this case, the conductive layer 433a and the conductive layer 433b are connected to the semiconductor layer 432 through openings provided in the insulating layer 484.

Figure 18C:
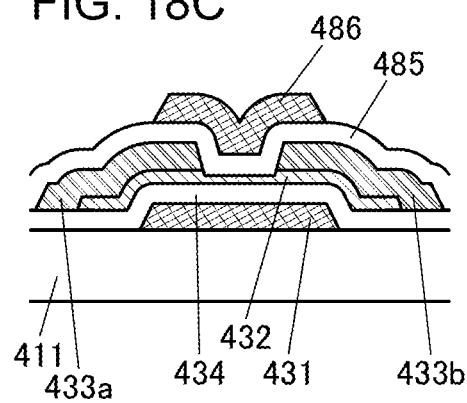

A transistor illustrated in FIG. 18(C) includes an insulating layer 485 and a conductive layer 486. The insulating layer 485 is provided to cover the semiconductor layer 432, the conductive layer 433a, and the conductive layer 433b. The conductive layer 486 is provided over the insulating layer 485 and includes a region overlapping the semiconductor layer 432.

The conductive layer 486 is positioned opposite to the conductive layer 431 with the semiconductor layer 432 therebetween. In the case where the conductive layer 431 is used as a first gate electrode, the conductive layer 486 can function as a second gate electrode. By supplying the same potential to the conductive layer 431 and the conductive layer 486, the on-state current of the transistor can be increased. Moreover, by supplying a potential for controlling the threshold voltage to one of the conductive layer 431 and the conductive layer 486 and supplying a potential for driving to the other, the threshold voltage of the transistor can be controlled.

Figure 18D:
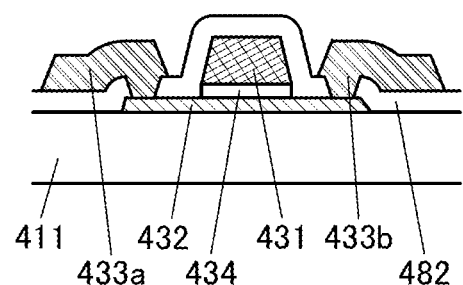

A transistor illustrated in FIG. 18(D) is a top-gate transistor, and the conductive layer 431 functioning as a gate electrode is provided above the semiconductor layer 432 (on the side opposite to the surface where the semiconductor layer 432 is formed). The insulating layer 434 and the conductive layer 431 are stacked over the semiconductor layer 432. The insulating layer 482 is provided to cover the conductive layer 431 and a top surface and a side edge portion of the semiconductor layer 432. The conductive layer 433a and the conductive layer 433b are provided over the insulating layer 482. The conductive layer 433a and the conductive layer 433b are connected to the semiconductor layer 432 through openings provided in the insulating layer 482.

Note that although an example of the case where the insulating layer 434 does not exist in a portion that is not overlapped by the conductive layer 431 is shown here, the insulating layer 434 may be provided to cover the top surface and the side edge portion of the semiconductor layer 432.

In the transistor illustrated in FIG. 18(D), the physical distance between the conductive layer 431 and the conductive layer 433a or the conductive layer 433b can be easily increased, so that the parasitic capacitance therebetween can be reduced.

Figure 18E:
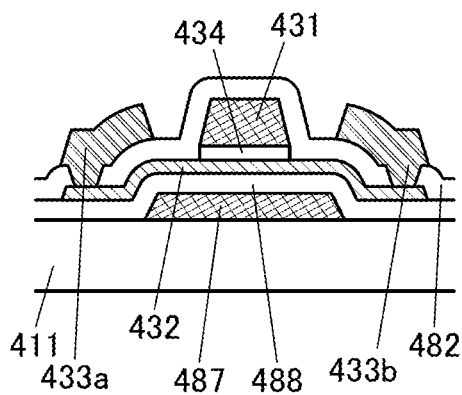

A transistor illustrated in FIG. 18(E) is different from the transistor in FIG. 18(D) in including a conductive layer 487 and an insulating layer 488. The conductive layer 487 includes a region overlapped by the semiconductor layer 432. The insulating layer 488 is provided to cover the conductive layer 487.

The conductive layer 487 functions as a second gate electrode. It is thus possible to increase the on-state current and control the threshold voltage, for example.

<Components>

The components shown above will be described below.

[Substrate]

A material having a flat surface can be used for the substrate included in the display device. For the substrate through which light emitted from the display element is extracted, a material that transmits the light is used. For example, a material such as glass, quartz, ceramics, sapphire, or an organic resin can be used.

The weight and thickness of the display panel can be decreased by using a thin substrate. Furthermore, a flexible display panel can be achieved by using a substrate that is thin enough to have flexibility. Alternatively, glass or the like that is thin enough to have flexibility can be used as the substrate. Alternatively, a composite material in which glass and a resin material are attached to each other with an adhesive layer may be used.

[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor may be used, a staggered transistor may be used, or an inverted staggered transistor may be used. Moreover, a top-gate or bottom-gate transistor structure may be employed. Alternatively, gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As for a semiconductor material used for the transistor, a Group 14 element (silicon, germanium, or the like) or a metal oxide, for example, can be used for the semiconductor layer. A semiconductor containing silicon, a semiconductor containing gallium arsenide, a metal oxide containing indium, or the like can be typically used.

Silicon, for example, can be used as a semiconductor in which a channel of the transistor is formed. It is particularly preferable to use amorphous silicon as silicon. By using amorphous silicon, transistors can be formed over a large substrate with high yield, resulting in excellent mass productivity.

Alternatively, silicon having crystallinity, such as microcrystalline silicon, polycrystalline silicon, or single crystal silicon, can be used. In particular, polycrystalline silicon can be formed at a lower temperature than single crystal silicon and has higher field-effect mobility and higher reliability than amorphous silicon.

The bottom-gate transistor shown in this embodiment is preferable because the number of manufacturing steps can be reduced. Moreover, using amorphous silicon at this time enables the semiconductor layer to be formed at a lower temperature than the case of using polycrystalline silicon; hence, materials with low heat resistance can be used as materials for a wiring and an electrode below the semiconductor layer and a material for the substrate, resulting in wider choice of materials. For example, an extremely large-area glass substrate can be favorably used. Meanwhile, the top-gate transistor is preferable because an impurity region is easily formed in a self-aligned manner and thus variations in characteristics or the like can be reduced. At this time, the top-gate transistor is sometimes suitable particularly in the case of using polycrystalline silicon, single crystal silicon, or the like.

As a semiconductor material used for the transistor, a metal oxide having a larger band gap than silicon can also be used. The use of a semiconductor material having a larger band gap and a lower carrier density than silicon is preferable because the current of the transistor in the off state can be reduced.

Owing to its low off-state current, a transistor using a metal oxide whose band gap is larger than that of silicon enables long-term retention of charges stored in a capacitor that is connected in series with the transistor. The use of such a transistor in pixels allows a driver circuit to stop while the gray level of an image displayed in each display region is maintained. As a result, a display device with extremely low power consumption can be achieved.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). Moreover, the semiconductor layer preferably contains a stabilizer together with the above in order to reduce variations in electrical characteristics of transistors including the semiconductor layer.

Examples of the stabilizer, including the metals that are described above as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide forming the semiconductor layer, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used, for example.

Note that here, an In—Ga—Zn-based oxide means an oxide containing In, Ga, and Zn as its main components and there is no limitation on the ratio of In to Ga and Zn. Furthermore, a metal element other than In, Ga, and Zn may be contained.

The semiconductor layer and the conductive layer may include the same metal elements contained in the above oxide. The use of the same metal elements for the semiconductor layer and the conductive layer can reduce the manufacturing cost. For example, the use of metal oxide targets with the same metal composition can reduce the manufacturing cost. In addition, an etching gas or an etchant can be used in common in processing the semiconductor layer and the conductive layer. Note that even when including the same metal elements, the semiconductor layer and the conductive layer have different compositions in some cases. For example, a metal element in a film may be released during the manufacturing process of the transistor and the capacitor, resulting in different metal compositions.

The energy gap of the metal oxide forming the semiconductor layer is preferably greater than or equal to 2 eV, further preferably greater than or equal to 2.5 eV, still further preferably greater than or equal to 3 eV. With the use of a metal oxide having such a wide energy gap, the off-state current of the transistor can be reduced.

In the case where the metal oxide forming the semiconductor layer is an In-M-Zn-based oxide, the atomic ratio of the metal elements of a sputtering target used for forming a film of the In-M-Zn oxide preferably satisfies In≥M and Zn≥M As the atomic ratio of the metal elements of such a sputtering target, In:M:Zn=1:1:1, In:M:Zn=1:1:1.2, In:M:Zn=3:1:2, 4:2:4.1, and the like are preferable. Note that the atomic ratio in the formed semiconductor layer varies from the above atomic ratio of the metal elements contained in the sputtering target within a range of ±40% as an error.

A metal oxide with a low carrier density is preferably used for the semiconductor layer. For example, it is possible to use, for the semiconductor layer, a metal oxide whose carrier density is lower than or equal to $1\times10^{17}$/cm$^3$, preferably lower than or equal to $1\times10^{15}$/cm$^3$, further preferably lower than or equal to $1\times10^{13}$/cm$^3$, still further preferably lower than or equal to $1\times10^{11}$/cm$^3$, even further preferably lower than $1\times10^{10}$/cm$^3$ and is higher than or equal to $1\times10^{-9}$/cm$^3$.

Such a semiconductor layer has a low impurity concentration and a low density of defect states and thus has stable characteristics.

Note that without limitation to the above, a material with an appropriate composition can be used in accordance with required semiconductor characteristics and electrical characteristics (e.g., field-effect mobility and threshold voltage) of a transistor. To obtain the required semiconductor characteristics of the transistor, it is preferred that the carrier density, the impurity concentration, the defect density, the atomic ratio of a metal element to oxygen, the interatomic distance, the density, and the like of the semiconductor layer be set to appropriate values.

When silicon and carbon, which are Group 14 elements, are included in the metal oxide forming the semiconductor layer, oxygen vacancies are increased in the semiconductor layer and the semiconductor layer becomes n-type in some cases. Thus, the concentrations of silicon and carbon in the semiconductor layer (the concentrations obtained by secondary ion mass spectrometry) are preferably lower than or equal to $2\times10^{18}$ atoms/cm$^3$, further preferably lower than or equal to $2\times10^{17}$ atoms/cm$^3$.

Moreover, an alkali metal and an alkaline earth metal might generate carriers when bonded to a metal oxide, in which case the off-state current of the transistor might be increased. Therefore, the concentration of an alkali metal or an alkaline earth metal in the semiconductor layer, which is obtained by secondary ion mass spectrometry, is preferably lower than or equal to $1\times10^{18}$ atoms/cm$^3$, further preferably lower than or equal to $2\times10^{16}$ atoms/cm$^3$.

The semiconductor layer may have a non-single-crystal structure, for example. Examples of non-single-crystal structures include a polycrystalline structure, a microcrystalline structure, and an amorphous structure. Among the non-single-crystal structures, an amorphous structure has the highest density of defect states.

A metal oxide having an amorphous structure has disordered atomic arrangement and no crystalline component, for example. Alternatively, an oxide film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, and a region having a single crystal structure. The mixed film sometimes has a single-layer structure or a stacked-layer structure including two or more of the above-described regions, for example.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. Moreover, a film containing these materials can be used as a single layer or in a stacked-layer structure. Examples include a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure of a titanium film or a titanium nitride film, an aluminum film or a copper film stacked thereover, and a titanium film or a titanium nitride film formed thereover; and a three-layer structure of a molybdenum film or a molybdenum nitride film, an aluminum film or a copper film stacked thereover, and a molybdenum film or a molybdenum nitride film formed thereover. Note that an oxide such as indium oxide, tin oxide, or zinc oxide may be used. Furthermore, copper containing manganese is preferably used because controllability of the shape by etching is increased.

Moreover, as a light-transmitting conductive material that can be used for conductive layers of a variety of wirings and electrodes and the like included in the display device in addition to a gate, a source, and a drain of a transistor, a conductive oxide such as indium oxide, indium tin oxide, indium zinc oxide, zinc oxide, or zinc oxide to which gallium is added or graphene can be used. Alternatively, a metal material such as gold, silver, platinum, magnesium, nickel, tungsten, chromium, molybdenum, iron, cobalt, copper, palladium, or titanium or an alloy material containing the metal material can be used. Alternatively, a nitride of the metal material (e.g., titanium nitride) or the like may be used. Note that in the case of using the metal material or the alloy material (or the nitride thereof), the thickness is set small enough to have a light-transmitting property. Alternatively, a stacked film of the above materials can be used for the conductive layer. For example, a stacked film of indium tin oxide and an alloy of silver and magnesium, or the like is preferably used because the conductivity can be increased. They can also be used for conductive layers of a variety of wirings and electrodes and the like included in the display device, and conductive layers included in the display element (conductive layers functioning as a pixel electrode and a common electrode).

[Insulating Layer]

Examples of an insulating material that can be used for the insulating layers include a resin such as an acrylic and epoxy resin; a resin having a siloxane bond, such as silicone; and an inorganic insulating material such as silicon oxide, silicon oxynitride, silicon nitride oxide, silicon nitride, and aluminum oxide.

Examples of an insulating film with low water permeability include a film containing nitrogen and silicon, such as a silicon nitride film and a silicon nitride oxide film; and a film containing nitrogen and aluminum, such as an aluminum nitride film. Alternatively, a silicon oxide film, a silicon oxynitride film, an aluminum oxide film, or the like may be used.

[Liquid Crystal Element]

As the liquid crystal element, a liquid crystal element employing a vertical alignment (VA) mode can be used, for example. As the vertical alignment mode, an MVA (Multi-Domain Vertical Alignment) mode, a PVA (Patterned Vertical Alignment) mode, an ASV (Advanced Super View) mode, or the like can be used.

Alternatively, as the liquid crystal element, a liquid crystal element employing a variety of modes can be used. For example, it is possible to use a liquid crystal element employing a TN (Twisted Nematic) mode, an IPS (In-Plane-Switching) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a guest-host mode, or the like instead of a VA mode.

Note that the liquid crystal element is an element that controls transmission or non-transmission of light by utilizing an optical modulation action of liquid crystal. The optical modulation action of the liquid crystal is controlled by an electric field applied to the liquid crystal (including a horizontal electric field, a vertical electric field, and a diagonal electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal can be used, and the most suitable liquid crystal material for the mode or design to be employed can be used.

An alignment film can be provided to adjust the alignment of liquid crystal. Note that in the case of employing a horizontal electric field mode, a liquid crystal exhibiting a blue phase for which no alignment film is used may be used. The blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that includes a liquid crystal exhibiting a blue phase and a chiral material has a short response time and is optically isotropic. In addition, the liquid crystal composition that includes a liquid crystal exhibiting a blue phase and a chiral material does not need alignment treatment and has small viewing angle dependence. Since an alignment film does not need to be provided, rubbing treatment is unnecessary; accordingly, electrostatic discharge damage caused by the rubbing treatment can be prevented and defects and damage of the liquid crystal display device in the manufacturing process can be reduced.

The liquid crystal element can be a transmissive liquid crystal element, a reflective liquid crystal element, a transflective liquid crystal element, or the like.

In one embodiment of the present invention, a transmissive liquid crystal element in particular can be suitably used.

In the case of using a transmissive or transflective liquid crystal element, two polarizing plates are provided such that a pair of substrates are sandwiched therebetween. Furthermore, a backlight is provided on the outer side of the polarizing plate. As the backlight, a direct-type backlight may be used or an edge-lit backlight may be used. A direct-type backlight including an LED (Light Emitting Diode) is preferably used because local dimming becomes easy to perform and the contrast can be improved. Meanwhile, an edge-lit backlight is preferably used because the thickness of a module including the backlight can be reduced.

Note that when an edge-lit backlight is turned off, see-through display can be performed.

[Coloring Layer]

Examples of a material that can be used for the coloring layer include a metal material, a resin material, and a resin material containing a pigment or a dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. A stacked film of films containing a material of the coloring layer can also be used for the light-blocking layer. For example, it is possible to employ a stacked-layer structure of a film containing a material used for a coloring layer that transmits light of a certain color and a film containing a material used for a coloring layer that transmits light of another color. The use of the same material for the coloring layer and the light-blocking layer is preferable because the same manufacturing apparatus can be used and the process can be simplified.

Note that although the display device in which the liquid crystal element is used as the display element is described in this embodiment, a light-emitting element can also be used as the display element.

This embodiment can be combined with the description of the other embodiments as appropriate.

Embodiment 5

In this embodiment, examples of a crystallization method for polycrystalline silicon that can be used for a semiconductor layer of a transistor and a laser crystallization apparatus will be described.

To form polycrystalline silicon layers having favorable crystallinity, it is preferred that an amorphous silicon layer be provided over a substrate and the amorphous silicon layer be irradiated with laser light to be crystallized. For example, a linear beam is used as the laser light and the substrate is moved while the amorphous silicon layer is irradiated with the linear beam, whereby polycrystalline silicon layers can be formed in desired regions over the substrate.

The method using a linear beam is comparatively favorable in throughput. On the other hand, since laser light that is being moved relative to a given region is emitted to the region a plurality of times, the method tends to produce crystallinity variations due to a change in laser light output and a change in beam profile caused thereby. For example, when a semiconductor layer crystallized by this method is used for transistors included in pixels of a display device, a random stripe pattern caused by crystallinity variations might be observed in the display.

The length of the linear beam is ideally greater than or equal to the length of one side of the substrate; however, the length of the linear beam is limited by the output of a laser device and the structure of an optical system. Thus, for processing of a large substrate, it is practical to perform laser irradiation with laser light turned back in the substrate plane. Consequently, there occurs a region irradiated with the laser light a plurality of times. The crystallinity of such a region is likely to be different from that of the other regions; hence, display unevenness is sometimes caused in the region.

To avoid the above-described problem, an amorphous silicon layer formed over a substrate may be crystallized by local laser irradiation. Local laser irradiation is likely to form polycrystalline silicon layers with small variations in crystallinity.

Figure 19A:
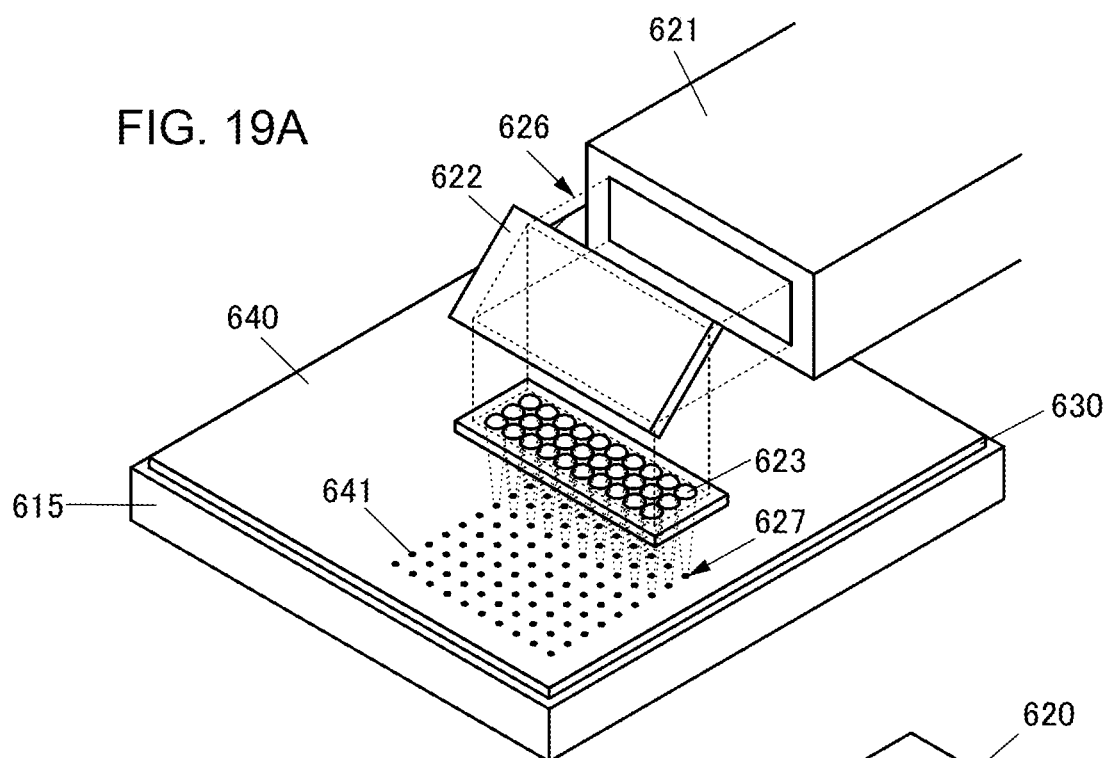
FIGS. 19A and 19B Diagrams showing a laser irradiation method and a laser crystallization apparatus.

FIG. 19(A) is a diagram illustrating a method of performing local laser irradiation on an amorphous silicon layer formed over a substrate.

Laser light 626 emitted from an optical system unit 621 is reflected by a mirror 622 and enters a microlens array 623. The microlens array 623 condenses the laser light 626 and forms a plurality of laser beams 627.

A substrate 630 where an amorphous silicon layer 640 is formed is fixed to a stage 615. The amorphous silicon layer 640 is irradiated with the plurality of laser beams 627, so that a plurality of polycrystalline silicon layers 641 can be formed at the same time.

Microlenses of the microlens array 623 are preferably provided to match the pixel pitch in a display device. Alternatively, they may be provided at intervals of an integral multiple of the pixel pitch. In either case, polycrystalline silicon layers can be formed in all regions corresponding to respective pixels by repeating laser irradiation and transfer of the stage 615 in the X direction or the Y direction.

For example, when the microlens array 623 includes I rows and J columns (I and J are natural numbers) of microlenses arranged at intervals of the pixel pitch, laser light irradiation is performed at a predetermined start position first, and I rows and J columns of polycrystalline silicon layers 641 can be formed. Then, the stage 615 is moved by a distance of J columns in the row direction and laser light irradiation is performed to further form I rows and J columns of polycrystalline silicon layers 641; consequently, I rows and 2J columns of polycrystalline silicon layers 641 can be formed. By repeating the steps, a plurality of polycrystalline silicon layers 641 can be formed in desired regions. In the case where the laser irradiation step is performed by turning back laser light, the following steps are repeated: the stage 615 is moved by a distance of J columns in the row direction and laser irradiation is performed, and then the stage 615 is moved by a distance of I rows in the column direction and laser light irradiation is performed.

Note that even with a method of performing laser irradiation while the stage 615 is moved in one direction, polycrystalline silicon layers can be formed at intervals of the pixel pitch by adjusting the oscillation frequency of laser light and the moving speed of the stage 615 properly.

The size of the laser beam 627 can be an area including the entire semiconductor layer of one transistor, for example. Alternatively, it can be an area including the entire channel region of one transistor. Alternatively, it can be an area including part of a channel region of one transistor. They can be used properly in accordance with required electrical characteristics of a transistor.

Note that in the case where the target is a display device including a plurality of transistors in one pixel, the laser beam 627 can have an area including the entire semiconductor layer of each transistor in one pixel. Alternatively, the laser beam 627 may have an area including the entire semiconductor layers of transistors included in a plurality of pixels.

Figure 20A:
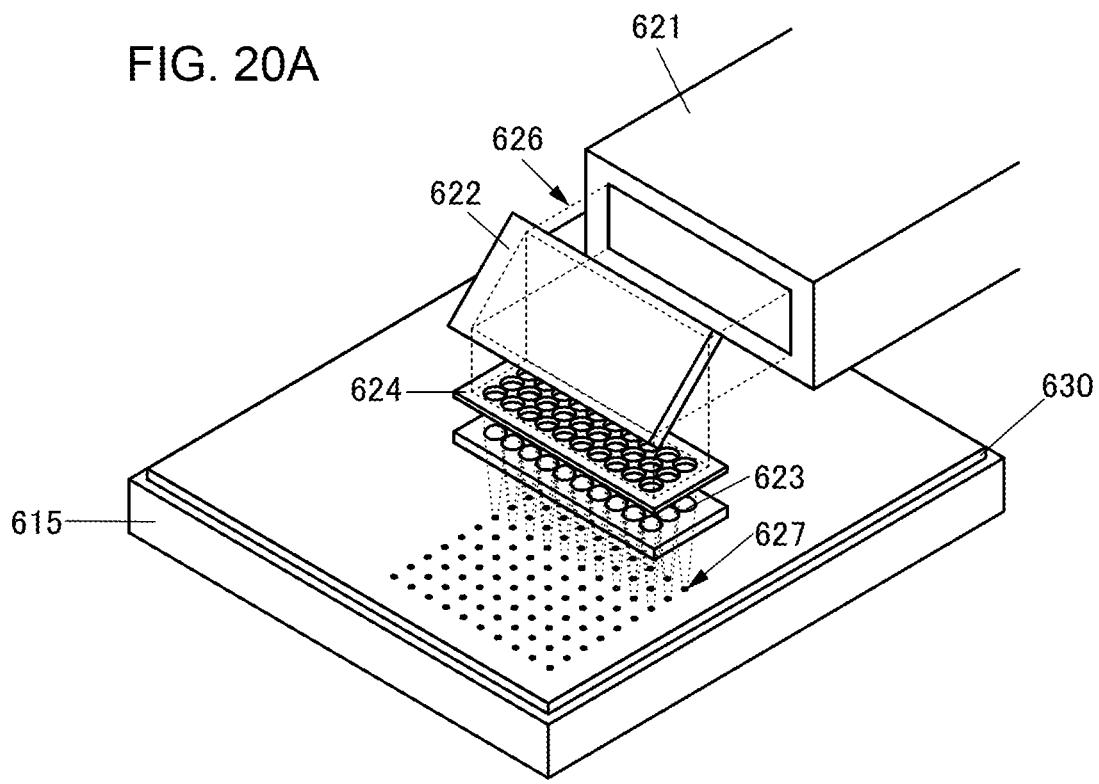
FIGS. 20A and 20B Diagrams showing laser irradiation methods.
Figure 20B:
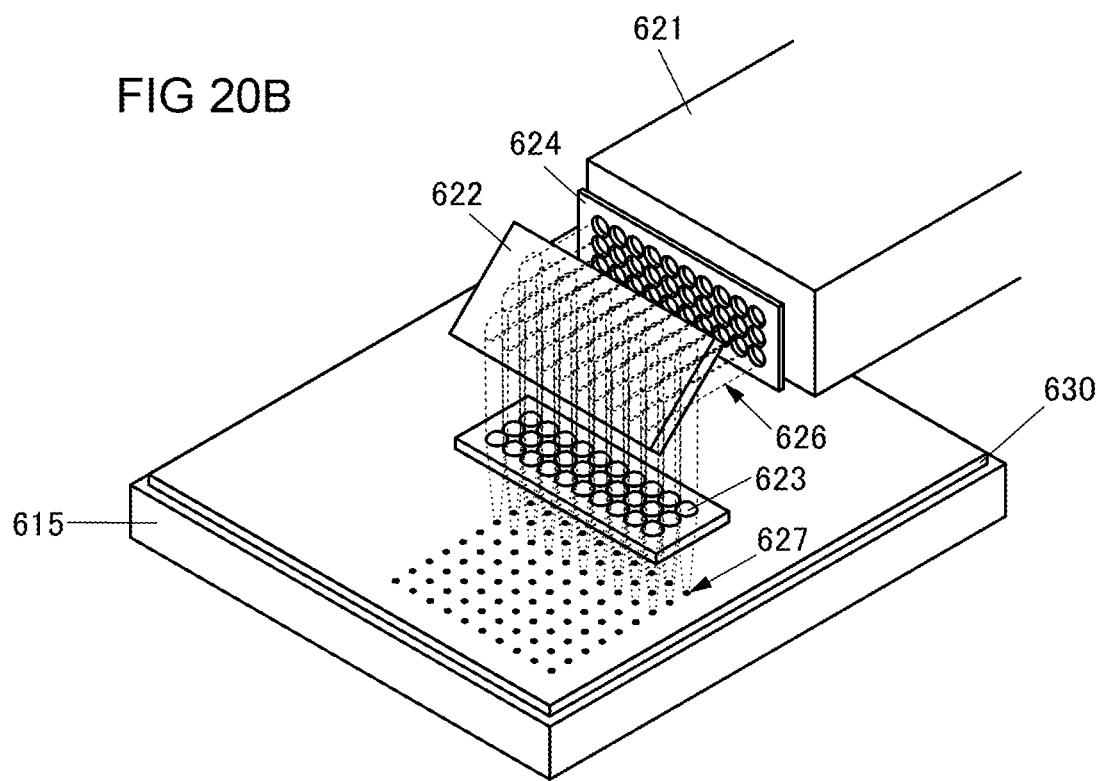

As illustrated in FIG. 20(A), a mask 624 may be provided between the mirror 622 and the microlens array 623. The mask 624 is provided with a plurality of openings corresponding to the respective microlenses. The shape of the openings can affect the shape of the laser beams 627. In the case where the mask 624 has circular openings as in FIG. 20(A), circular laser beams 627 can be obtained. Furthermore, in the case where the mask 624 has rectangular openings, rectangular laser beams 627 can be obtained. The mask 624 is effective, for example, in crystallizing only a channel region of a transistor. Note that the mask 624 may be provided between the optical system unit 621 and the mirror 622 as illustrated in FIG. 20(B).

Figure 19B:
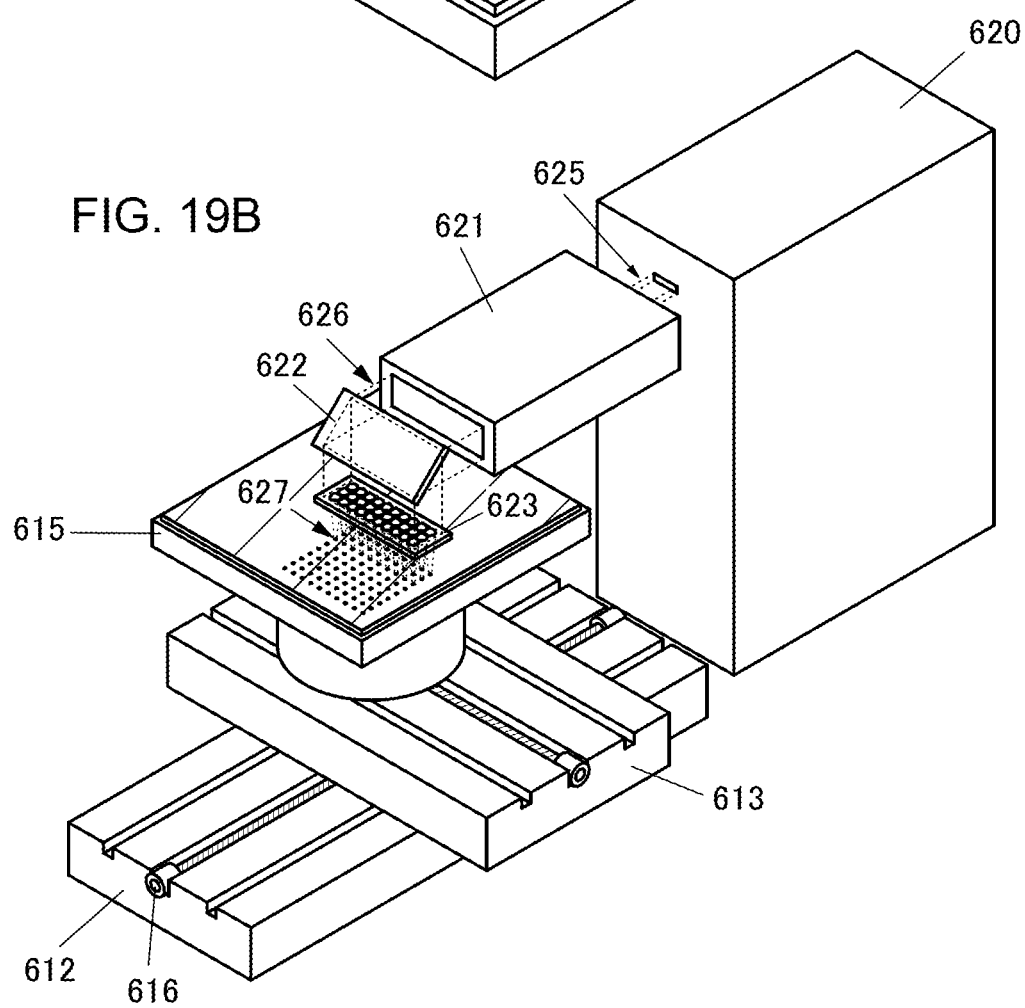

FIG. 19(B) is a perspective view illustrating a main structure of a laser crystallization apparatus that can be used in the local laser irradiation step shown above. The laser crystallization apparatus includes a moving mechanism 612, a moving mechanism 613, and the stage 615 that are components of an X-Y stage. The crystallization apparatus also includes a laser device 620, the optical system unit 621, the mirror 622, and the microlens array 623 to shape the laser beam 627.

The moving mechanism 612 and the moving mechanism 613 have a function of performing reciprocating linear motion in the horizontal direction. As a mechanism for powering the moving mechanism 612 and the moving mechanism 613, a ball screw mechanism 616 driven by a motor can be used, for example. The moving directions of the moving mechanism 612 and the moving mechanism 613 cross orthogonally; thus, the stage 615 fixed to the moving mechanism 613 can be moved in the X direction and the Y direction freely.

The stage 615 includes a fixing mechanism such as a vacuum suction mechanism and can fix the substrate 630 or the like. Moreover, the stage 615 may include a heating mechanism as needed. Note that although not illustrated, the stage 615 includes a pusher pin and a vertical moving mechanism thereof, and the substrate 630 or the like can be moved vertically when the substrate 630 or the like is carried in or out.

The laser device 620 is preferably a pulsed laser, but may be a CW laser as long as it outputs light with a wavelength and intensity suitable for the purpose of processing. Typically, an excimer laser capable of emitting ultraviolet light with a wavelength of 351-353 nm (XeF), 308 nm (XeCl), or the like can be used. Alternatively, a second harmonic wavelength (515 nm, 532 nm, or the like) or a third harmonic wavelength (343 nm, 355 nm, or the like) of a solid-state laser (such as a YAG laser or a fiber laser) may be used. In addition, a plurality of laser devices 620 may be provided.

The optical system unit 621 includes a mirror, a beam expander, a beam homogenizer, and the like, for example, and can expand the laser light 625 while homogenizing the energy in-plane distribution of the laser light 625 output from the laser device 620.

As the mirror 622, a dielectric multilayer mirror can be used, for example, and is placed so that the incident angle of the laser light is substantially 45°. The microlens array 623 can have a shape such that a plurality of convex lenses are provided on the top surface or on the top and bottom surfaces of a quartz board, for example.

With the above laser crystallization apparatus, polycrystalline silicon layers with small variations in crystallinity can be formed.

This embodiment can be combined with the description of the other embodiments as appropriate.

Embodiment 6

In this embodiment, a structure example of an OS transistor that can be used in the above embodiment will be described. An OS transistor described in this embodiment can be used in the memory circuit in FIG. 8, for example.
<Structure Example of Transistor>

Figure 21A:
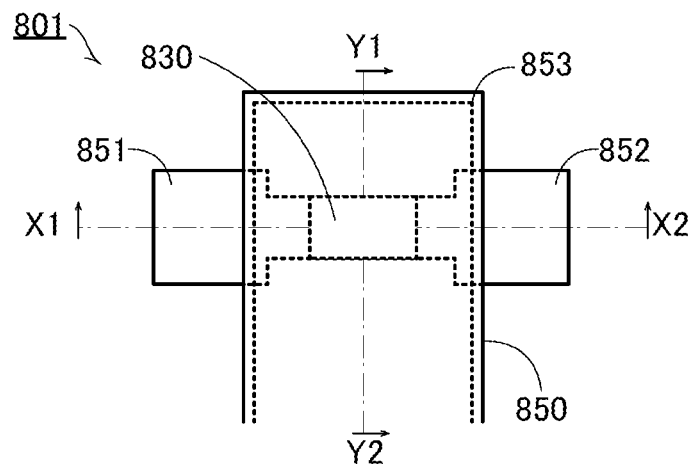
FIGS. 21A-21C Diagrams illustrating a structure example of a transistor.
Figure 21B:
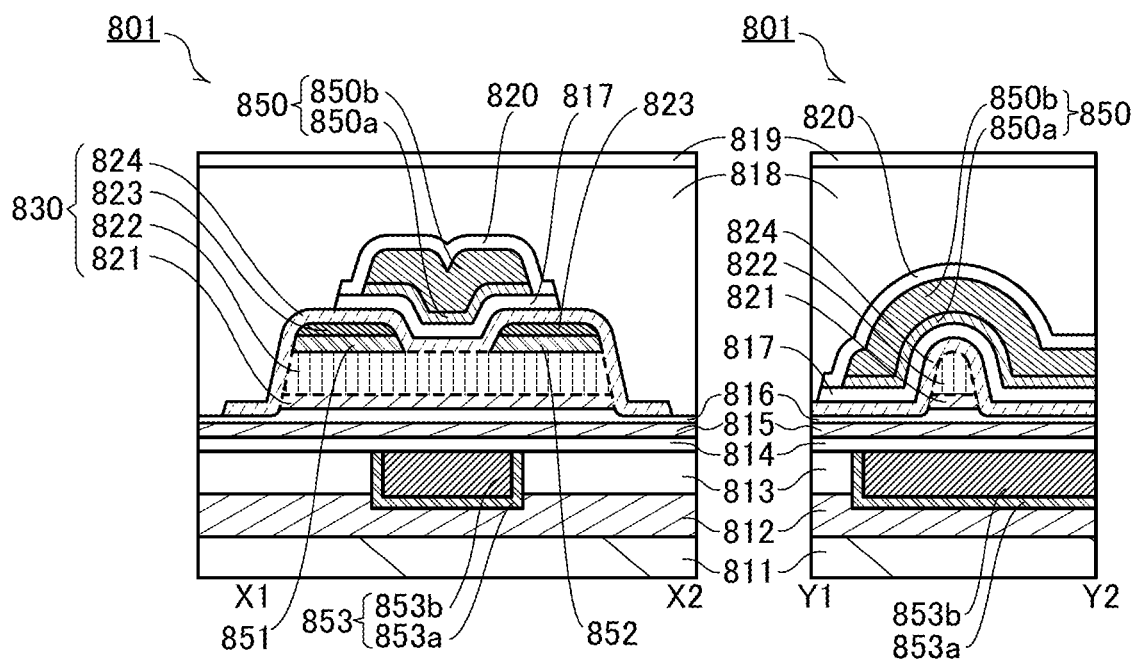
Figure 21C:
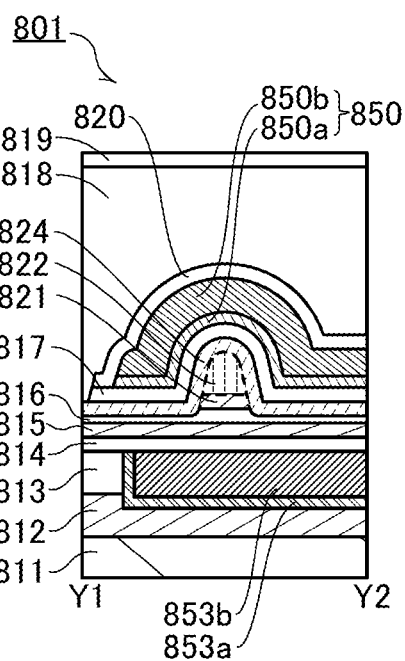

FIG. 21(A) is a top view illustrating a structure example of a transistor. FIG. 21(B) is a cross-sectional view along the line X1-X2 in FIG. 21(A), and FIG. 21(C) is a cross-sectional view along the line Y1-Y2. Here, in some cases, the direction of the line X1-X2 is referred to as a channel length direction and the direction of the line Y1-Y2 as a channel width direction. FIG. 21(B) is a diagram illustrating a cross-sectional structure of the transistor in the channel length direction, and FIG. 21(C) is a diagram illustrating a cross-sectional structure of the transistor in the channel width direction. Note that to clarify the device structure, some components are omitted in FIG. 21(A).

The semiconductor device according to one embodiment of the present invention includes insulating layers 812 to 820, metal oxide films 821 to 824, and conductive layers 850 to 853. A transistor 801 is formed on an insulating surface. FIG. 21 illustrates the case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may be a single layer or may be formed by stacking a plurality of films. They can be formed by a variety of deposition methods such as a sputtering method, a molecular beam epitaxy method (MBE method), a pulsed laser ablation method (PLA method), a CVD method, and an atomic layer deposition method (ALD method). Note that examples of CVD methods include a plasma-enhanced CVD method, a thermal CVD method, and a metal organic CVD method.

The conductive layer 850 includes a region that functions as a gate electrode of the transistor 801. The conductive layer 851 and the conductive layer 852 include a region that functions as a source electrode or a drain electrode. The conductive layer 853 includes a region that functions as a back gate electrode. The insulating layer 817 includes a region that functions as a gate insulating layer on the gate electrode (front gate electrode) side, and an insulating layer formed of a stack of the insulating layer 814 to the insulating layer 816 includes a region that functions as a gate insulating layer on the back gate electrode side. The insulating layer 818 has a function of an interlayer insulating layer. The insulating layer 819 has a function of a barrier layer.

The metal oxide films 821 to 824 are collectively referred to as an oxide layer 830. As illustrated in FIG. 21(B) and FIG. 21(C), the oxide layer 830 includes a region where the metal oxide film 821, the metal oxide film 822, and the metal oxide film 824 are stacked in this order. In addition, a pair of metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 823 and the conductive layer 850. The conductive layer 851 and the conductive layer 852 each include a region that is overlapped by the conductive layer 850 with the metal oxide film 823, the metal oxide film 824, and the insulating layer 817 therebetween.

The conductive layer 851 and the conductive layer 852 are formed from a hard mask for forming the metal oxide film 821 and the metal oxide film 822. Thus, the conductive layer 851 and the conductive layer 852 do not include a region that is in contact with the side surfaces of the metal oxide film 821 and the metal oxide film 822. For example, the metal oxide films 821 and 822, the conductive layer 851, and the conductive layer 852 can be formed through the following steps. First, a conductive film is formed over two stacked metal oxide films. This conductive film is processed (etched) into a desired shape so that a hard mask is formed. By using the hard mask, the shapes of the two metal oxide films are processed so that the metal oxide film 821 and the metal oxide film 822 that are stacked are formed. Next, the hard mask is processed into a desired shape so that the conductive layer 851 and the conductive layer 852 are formed.

Examples of insulating materials used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed of a single layer or a stack containing these insulating materials. The layers forming the insulating layers 811 to 818 may contain a plurality of insulating materials.

Note that in this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layer 816 to the insulating layer 818 are preferably insulating layers containing oxygen. More preferably, the insulating layer 816 to the insulating layer 818 are formed of an insulating film from which oxygen is released by heating (hereinafter also referred to as an "insulating film containing excess oxygen"). Supplying oxygen from the insulating film containing excess oxygen to the oxide layer 830 can compensate for oxygen vacancies in the oxide layer 830. The reliability and electrical characteristics of the transistor 801 can be improved.

The insulating layer containing excess oxygen is a film in which the amount of desorbed oxygen that is converted into oxygen atoms at a film surface temperature ranging from 100° C. to 700° C. or from 100° C. to 500° C. in TDS (Thermal Desorption Spectroscopy) is $1.0 \times 10^{18}$ atoms/cm$^3$ or more. Note that the amount of desorbed oxygen is preferably $3.0 \times 10^{20}$ atoms/cm$^3$ or more.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The hydrogen concentrations of the insulating layers 812 to 819 are preferably reduced in order to prevent an increase in hydrogen concentration of the oxide layer 830. In particular, the hydrogen concentrations of the insulating layers 813 to 818 are preferably reduced. Specifically, the hydrogen concentrations are lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The above-mentioned hydrogen concentrations are values measured by secondary ion mass spectrometry (SIMS).

The transistor 801 preferably has a structure in which the oxide layer 830 is surrounded by an insulating layer with oxygen and hydrogen barrier properties (hereinafter also referred to as a barrier layer). Employing such a structure can prevent release of oxygen from the oxide layer 830 and entry of hydrogen into the oxide layer 830. The reliability and electrical characteristics of the transistor 801 can be improved.

For example, the insulating layer 819 functions as a barrier layer and at least one of the insulating layers 811, 812, and 814 functions as a barrier layer. The barrier layer can be formed of a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 819 is described. In this example, each of the insulating layers 811, 812, 815, and 819 functions as a barrier layer. The insulating layers 816 to 818 are oxide layers containing excess oxygen. The insulating layer 811 is silicon nitride, the insulating layer 812 is aluminum oxide, and the insulating layer 813 is silicon oxynitride. The insulating layers 814 to 816 that have a function of the gate insulating layer on the back gate electrode side are a stack of silicon oxide, aluminum oxide, and silicon oxide. The insulating layer 817 that has a function of the gate insulating layer on the front gate side is silicon oxynitride. The insulating layer 818 that has a function of the interlayer insulating layer is silicon oxide. The insulating layer 819 is aluminum oxide.

Examples of conductive materials used for the conductive layers 850 to 853 include a metal such as molybdenum, titanium, tantalum, tungsten, aluminum, copper, chromium, neodymium, and scandium; and a metal nitride containing the above metal as its component (tantalum nitride, titanium nitride, molybdenum nitride, and tungsten nitride). It is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A structure example of the conductive layers 850 to 853 is described. The conductive layer 850 is a single layer of tantalum nitride or tungsten. Alternatively, the conductive layer 850 is a stack of tantalum nitride, tantalum, and tantalum nitride. The conductive layer 851 is a single layer of tantalum nitride or a stack of tantalum nitride and tungsten. The structure of the conductive layer 852 is the same as that of the conductive layer 851. A conductive layer 853*a* is tantalum nitride, and a conductive layer 853*b* is tungsten.

In order to reduce the off-state current of the transistor 801, the energy gap of the metal oxide film 822 is preferably large, for example. The energy gap of the metal oxide film 822 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 830 preferably exhibits crystallinity. At least the metal oxide film 822 preferably exhibits crystallinity. With the above-described structure, the transistor 801 having favorable reliability and electrical characteristics can be achieved.

Examples of the oxide that can be used for the metal oxide film 822 include an In—Ga oxide, an In—Zn oxide, and an In-M-Zn oxide (M is Al, Ga, Y, or Sn). The metal oxide film 822 is not limited to an oxide layer containing indium. The metal oxide film 822 can be formed using a Zn—Sn oxide, a Ga—Sn oxide, or a Zn—Mg oxide, for example. The metal oxide films 821, 823, and 824 can also be formed using an oxide that is similar to that used for the metal oxide film 822.

In particular, each of the metal oxide films 821, 823 and 824 can be formed using a Ga oxide.

If an interface state is formed at the interface between the metal oxide film 822 and the metal oxide film 821, a channel formation region is formed also in a region in the vicinity of the interface, which causes a change in threshold voltage of the transistor 801. It is therefore preferred that the metal oxide film 821 contain at least one of the metal elements contained in the metal oxide film 822 as its component. Accordingly, an interface state is less likely to be formed at the interface between the metal oxide film 822 and the metal oxide film 821, and variations in electrical characteristics such as threshold voltage of the transistor 801 can be reduced.

The metal oxide film 824 preferably contains at least one of the metal elements contained in the metal oxide film 822 as its component. Thus, interface scattering is less likely to occur at the interface between the metal oxide film 822 and the metal oxide film 824, and carrier transfer is less likely to be inhibited; hence, the field-effect mobility of the transistor 801 can be increased.

It is preferred that the metal oxide film 822 have the highest carrier mobility among the metal oxide films 821 to 824. Accordingly, a channel can be formed in the metal oxide film 822 that is apart from the insulating layers 816 and 817.

For example, in a metal oxide containing In, such as an In-M-Zn oxide, carrier mobility can be increased by an increase in the In content. In the In-M-Zn oxide, the s orbital of heavy metal mainly contributes to carrier transfer, and a larger number of s orbitals overlap by increasing the indium content; thus, an oxide having a high indium content has higher mobility than an oxide having a low indium content. Consequently, with the use of an oxide having a high indium content for the metal oxide film, carrier mobility can be increased.

For this reason, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the In content of the metal oxide film 822 is made higher than the In content of the metal oxide films 821 and 823. When the In-M-Zn oxide is formed by a sputtering method, the In content can be changed by changing the atomic ratio of the metal elements of a target.

For example, the atomic ratio In:M:Zn of the metal elements of a target used for forming the metal oxide film 822 is preferably 1:1:1, 3:1:2, or 4:2:4.1. For example, the atomic ratio In:M:Zn of the metal elements of a target used for forming the metal oxide films 821 and 823 is preferably 1:3:2 or 1:3:4. The atomic ratio of an In-M-Zn oxide formed using a target of In:M:Zn=4:2:4.1 is approximately In:M:Zn=4:2:3.

In order to provide the transistor 801 with stable electrical characteristics, it is preferable to reduce the concentration of impurities in the oxide layer 830. In the metal oxide, hydrogen, nitrogen, carbon, silicon, and a metal element other than its main component are impurities. For example, hydrogen and nitrogen contribute to formation of donor states, thereby increasing the carrier density. In addition, silicon and carbon contribute to formation of impurity states in the metal oxide. The impurity states serve as traps and might cause the electrical characteristics of the transistor to deteriorate.

For example, the oxide layer 830 includes a region where the silicon concentration is lower than or equal to $2\times10^{18}$ atoms/cm$^3$, preferably lower than or equal to $2\times10^{17}$ atoms/cm$^3$. The same applies to the carbon concentration of the oxide layer 830.

The oxide layer 830 includes a region where the concentration of an alkali metal is lower than or equal to $1\times10^{18}$ atoms/cm$^3$, preferably lower than or equal to $2\times10^{16}$ atoms/cm$^3$. The same applies to the concentration of an alkaline earth metal in the oxide layer 830.

The oxide layer 830 includes a region where the hydrogen concentration is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

The above-mentioned concentrations of the impurities in the oxide layer 830 are values obtained by SIMS.

In the case where the metal oxide film 822 contains oxygen vacancies, donor states are sometimes formed by entry of hydrogen into sites of oxygen vacancies. As a result, the oxygen vacancy becomes a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by reducing hydrogen in the metal oxide film 822 is effective in on-state current characteristics.

Hydrogen contained in a metal oxide reacts with oxygen bonded to a metal atom to be water, and thus forms an oxygen vacancy in some cases. Entry of hydrogen into the oxygen vacancy sometimes causes generation of an electron serving as a carrier. Furthermore, in some cases, bonding of part of hydrogen to oxygen bonded to a metal atom causes generation of an electron serving as a carrier. Since the channel formation region is provided in the metal oxide film 822, when hydrogen is contained in the metal oxide film 822, the transistor 801 is likely to have normally-on characteristics. Accordingly, it is preferred that hydrogen in the metal oxide film 822 be reduced as much as possible.

FIG. 21 shows an example in which the oxide layer 830 has a four-layer structure; however, one embodiment of the present invention is not limited to this. For example, the oxide layer 830 can have a three-layer structure without the metal oxide film 821 or the metal oxide film 823. Alternatively, one or a plurality of metal oxide films that are similar to the metal oxide films 821 to 824 can be provided at any two or more of the following positions: between given layers in the oxide layer 830, over the oxide layer 830, and under the oxide layer 830.

Figure 22:
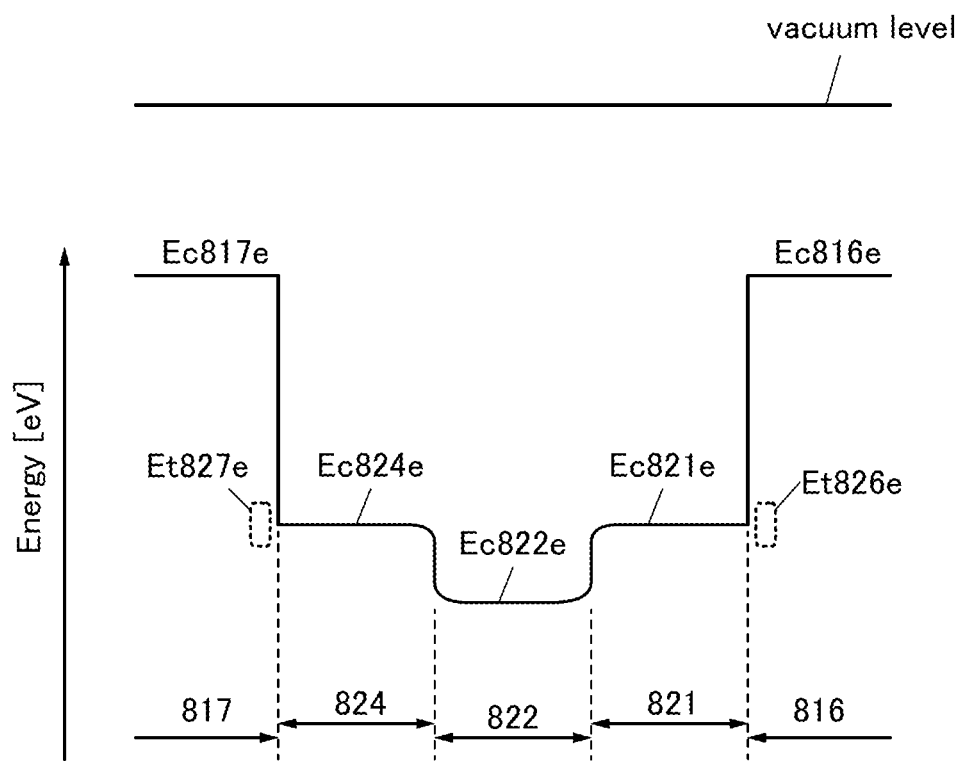
FIG. 22 A diagram showing an energy band structure.

Effects obtained from the stack of the metal oxide films 821, 822, and 824 are described with reference to FIG. 22. FIG. 22 is a schematic diagram of the energy band structure of the channel formation region in the transistor 801.

In FIG. 22, Ec816e, Ec821e, Ec822e, Ec824e, and Ec817e indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (also referred to as "electron affinity") is a value obtained by subtracting an energy gap from the energy difference between the vacuum level and the valence band maximum (also referred to as an ionization potential). Note that the energy gap can be measured using a spectroscopic ellipsometer (UT-300, HORIBA JOBIN YVON S.A.S.). Moreover, the energy difference between the vacuum level and the valence band maximum can be measured using an ultraviolet photoelectron spectroscopy (UPS) device (VersaProbe, ULVAC-PHI, Inc.).

Since the insulating layers 816 and 817 are insulators, Ec816e and Ec817e are closer to the vacuum level than Ec821e, Ec822e, and Ec824e (the insulating layers 816 and 817 have low electron affinities).

The metal oxide film 822 has a higher electron affinity than the metal oxide films 821 and 824. For example, the difference in electron affinity between the metal oxide film 822 and the metal oxide film 821 and the difference in electron affinity between the metal oxide film 822 and the metal oxide film 824 are each greater than or equal to 0.07 eV and less than or equal to 1.3 eV. The differences in electron affinity are preferably greater than or equal to 0.1 eV and less than or equal to 0.7 eV, further preferably greater than or equal to 0.15 eV and less than or equal to 0.4 eV. Note that the electron affinity is an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide film 821, the metal oxide film 822, and the metal oxide film 824.

An indium gallium oxide has a low electron affinity and a high oxygen-blocking property. Therefore, the metal oxide film 824 preferably contains an indium gallium oxide. The gallium atomic ratio [Ga/(In+Ga)] is, for example, higher than or equal to 70%, preferably higher than or equal to 80%, further preferably higher than or equal to 90%.

A mixed region of the metal oxide film 821 and the metal oxide film 822 sometimes exists between the metal oxide film 821 and the metal oxide film 822. Moreover, a mixed region of the metal oxide film 824 and the metal oxide film 822 sometimes exists between the metal oxide film 824 and the metal oxide film 822. Because the mixed regions have a lower interface state density, a region in which the metal oxide films 821, 822, and 824 are stacked has a band structure where the energy in the vicinity of each interface is changed continuously (also referred to as continuous junction).

Electrons transfer mainly through the metal oxide film 822 in the oxide layer 830 having such an energy band structure. Thus, even when a state exists at the interface between the metal oxide film 821 and the insulating layer 816 or at the interface between the metal oxide film 824 and the insulating layer 817, electron transfer in the oxide layer 830 is less likely to be inhibited by these interface states; hence, the on-state current of the transistor 801 can be increased.

In addition, as shown in FIG. 22, trap states Et826e and Et827e due to impurities or defects might be formed in the vicinity of the interface between the metal oxide film 821 and the insulating layer 816 and the vicinity of the interface between the metal oxide film 824 and the insulating layer 817, respectively; however, the metal oxide film 822 can be separated from the trap states Et826e and Et827e owing to the existence of the metal oxide films 821 and 824.

Note that when the difference between Ec821e and Ec822e is small, an electron in the metal oxide film 822 might reach the trap state Et826e by passing over the energy difference. When the electron is trapped at the trap state Et826e, negative fixed charge is generated at the interface with the insulating film, causing the threshold voltage of the transistor to be shifted in the positive direction. The same applies to the case where the energy difference between Ec822e and Ec824e is small.

In order to reduce a change in threshold voltage of the transistor 801 and make the electrical characteristics of the transistor 801 favorable, the difference between Ec821e and Ec822e and the difference between Ec824e and Ec822e are each preferably greater than or equal to 0.1 eV, further preferably greater than or equal to 0.15 eV.

Note that the transistor 801 can alternatively have a structure without a back gate electrode.

<Example of Stacked-Layer Structure>

Next, a structure of a semiconductor device configured with a stack of an OS transistor and another transistor will be described. The structure described below can be used for the register 51 in FIG. 6 to FIG. 8 or the like. For example, a transistor Tr100 can be used as the transistors M22 and M25 in FIG. 8, and a transistor Tr200 can be used as the transistors M21 and M24 in FIG. 8.

Figure 23:
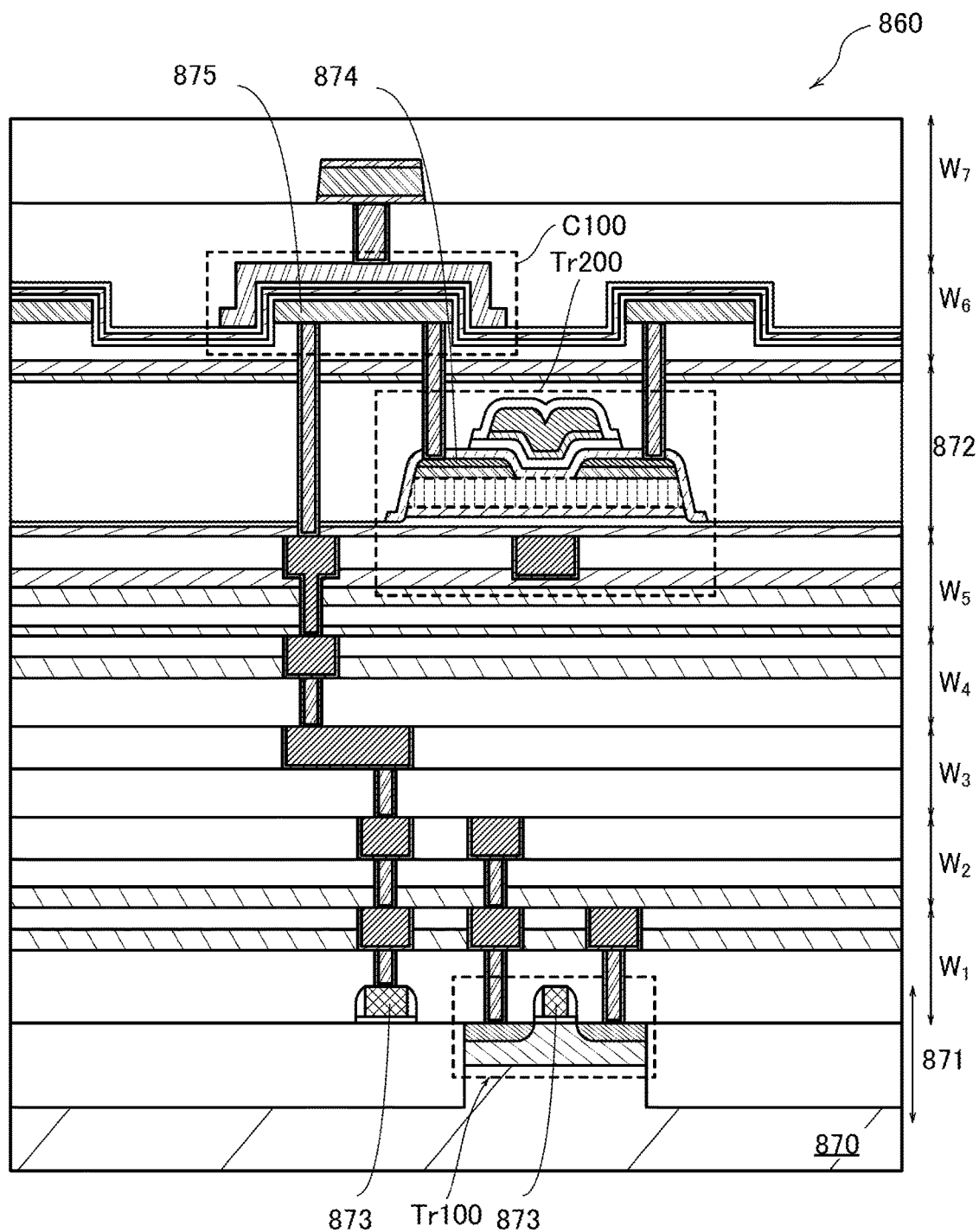
FIG. 23 A diagram illustrating a structure example of a semiconductor device.

FIG. 23 illustrates an example of a stacked-layer structure of a semiconductor device 860 in which the transistor Tr100 that is a Si transistor, the transistor Tr200 that is an OS transistor, and a capacitor C100 are stacked.

The semiconductor device 860 is configured with a stack of a CMOS layer 871, wiring layers $W_1$ to $W_5$, a transistor layer 872, and wiring layers $W_6$ and $W_7$.

The transistor Tr100 is provided in the CMOS layer 871. A channel formation region of the transistor Tr100 is provided in a single crystal silicon wafer 870. A gate electrode 873 of the transistor Tr100 is connected to one electrode 875 of the capacitor C100 through the wiring layers $W_1$ to $W_5$.

The transistor Tr200 is provided in the transistor layer 872. In FIG. 23, the transistor Tr200 has a structure similar to that of the transistor 801 (FIG. 21). An electrode 874 corresponding to one of a source and a drain of the transistor Tr200 is connected to the one electrode 875 of the capacitor C100. Note that FIG. 23 shows the case where the transistor Tr200 includes its back gate electrode in the wiring layer $W_5$. The capacitor C100 is formed in the wiring layer $W_6$.

The OS transistor and other elements are stacked in the above manner, whereby the circuit area can be reduced.

This embodiment can be combined with the description of the other embodiments as appropriate.

Embodiment 7

In this embodiment, a metal oxide that can be used for the OS transistor described in the above embodiment will be described. In particular, the details of a metal oxide and a CAC (Cloud-Aligned Composite) will be described below.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. When carriers flow in this composition, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be called a matrix composite or a metal matrix composite.

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed in a metal oxide and regions including the metal element(s) are mixed with a size greater than or equal to 0.5 nm and less than or equal to 10 nm, preferably greater than or equal to 1 nm and less than or equal to 2 nm, or a similar size is hereinafter referred to as a mosaic pattern or a patch-like pattern.

Note that a metal oxide preferably contains at least indium, and particularly preferably contains indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide with the CAC-OS composition may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)) so that a mosaic pattern is formed, and mosaic-like $InO_{X1}$ or $In_{X2}Zn_{Y2}O_{Z2}$ is evenly distributed in the film (which is hereinafter also referred to as "cloud-like").

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a structure formed of two layers of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by Out-of-plane method, which is one of X-ray diffraction (XRD) measurement methods. That is, it is found by the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanometer-sized electron beam), a ring-like high-luminance region and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that an In—Ga—Zn oxide with the CAC-OS composition has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has properties different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component has higher conductivity than a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, cloud-like distribution of regions including $In_{X2}Zn_{Y2}O_{Z2}$ or $InO_{X1}$ as a main component in an oxide semiconductor can achieve high field-effect mobility ($\mu$).

In contrast, a region including $GaO_{X3}$ or the like as a main component has a higher insulating property than a region including $In_{X2}Zn_{Y2}O_{Z2}$ or $InO_{X1}$ as a main component. In other words, distribution of regions including $GaO_{X3}$ or the like as a main component in an oxide semiconductor can reduce leakage current and achieve favorable switching operation.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

Moreover, a semiconductor element using the CAC-OS has high reliability. Thus, the CAC-OS is most suitable for a variety of semiconductor devices.

This embodiment can be combined with the description of the other embodiments as appropriate.

Embodiment 8

In this embodiment, electronic devices of one embodiment of the present invention will be described with reference to diagrams.

Electronic devices shown below are provided with the semiconductor device of one embodiment of the present invention in a display portion. Thus, the electronic devices achieve high resolution. In addition, the electronic devices can achieve both high resolution and a large screen.

The display portion in the electronic device of one embodiment of the present invention can display an image with a resolution of full high definition, 4K2K, 8K4K, 16K8K, or higher, for example. Moreover, the screen size of the display portion can be 20 inches or more in diagonal, 30 inches or more in diagonal, 50 inches or more in diagonal, 60 inches or more in diagonal, or 70 inches or more in diagonal.

Examples of electronic devices include a digital camera, a digital video camera, a digital photo frame, a mobile phone, a portable game console, a portable information terminal, and an audio reproducing device in addition to electronic devices provided with a comparatively large screen, such as a television device, a desktop or laptop personal computer, a monitor for a computer and the like, digital signage, and a large game machine such as a pachinko machine.

The electronic device of one embodiment of the present invention can be incorporated along a curved surface of an inside wall or an outside wall of a house or a building or the interior or the exterior of a car.

The electronic device of one embodiment of the present invention may include an antenna. When a signal is received by the antenna, an image, information, or the like can be displayed on the display portion. Moreover, when the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of one embodiment of the present invention can have a variety of functions, for example, a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 24A:
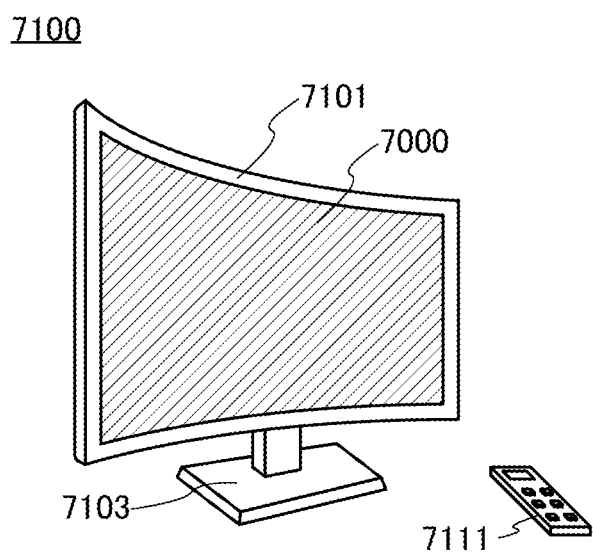
FIGS. 24A-24D Diagrams illustrating structure examples of electronic devices.

FIG. 24(A) illustrates an example of a television device. In a television device 7100, a display portion 7000 is incorporated into a housing 7101. Here, a structure where the housing 7101 is supported by a stand 7103 is shown.

The display device of one embodiment of the present invention can be used for the display portion 7000.

The television device 7100 illustrated in FIG. 24(A) can be operated with an operation switch provided in the housing 7101 or a separate remote controller 7111. Alternatively, the display portion 7000 may include a touch sensor, in which case the television device 7100 can be operated by touch on the display portion 7000 with a finger or the like. The remote controller 7111 may include a display portion that displays information to be output from the remote controller 7111. With operation keys or a touch panel included in the remote controller 7111, channels and volume can be controlled and images displayed on the display portion 7000 can be controlled.

Note that the television device 7100 is configured to include a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can also be performed.

Figure 24B:
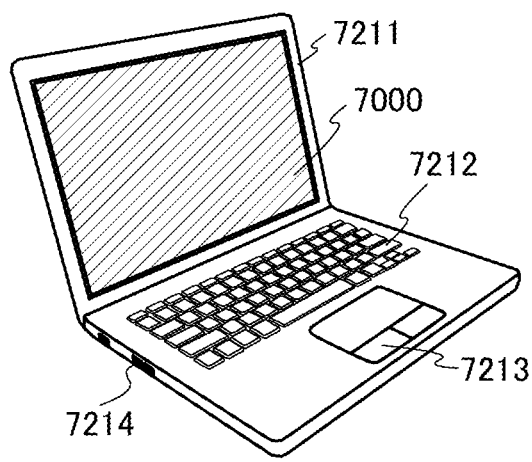

FIG. 24(B) illustrates a laptop personal computer 7200. The laptop personal computer 7200 includes a housing 7211, a keyboard 7212, a pointing device 7213, an external connection port 7214, and the like. The display portion 7000 is incorporated into the housing 7211.

The semiconductor device of one embodiment of the present invention can be used for the display portion 7000.

Figure 24C:
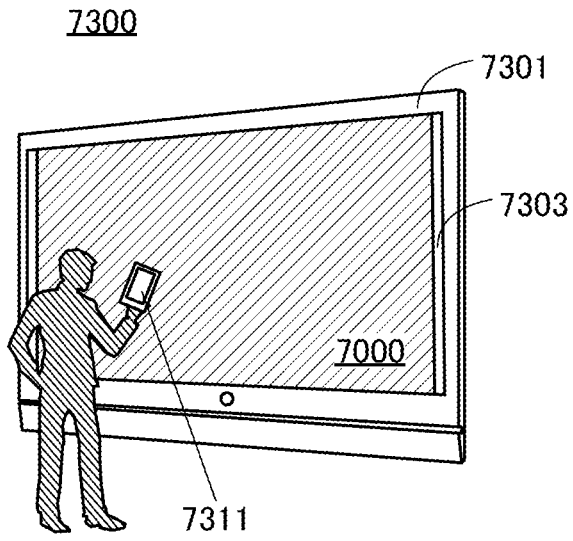

FIGS. 24(C) and (D) illustrate examples of digital signage.

Digital signage 7300 illustrated in FIG. 24(C) includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

Figure 24D:
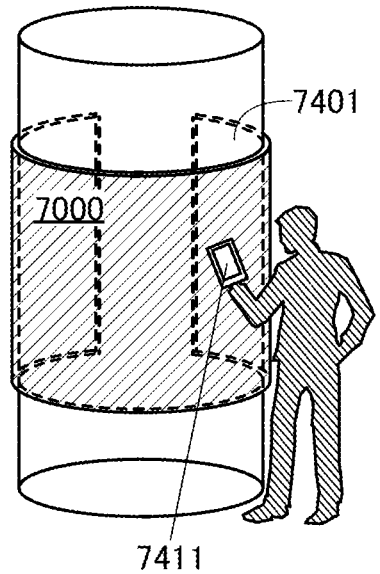

FIG. 24(D) illustrates digital signage 7400 mounted on a cylindrical pillar 7401. The digital signage 7400 includes the display portion 7000 provided along a curved surface of the pillar 7401.

In FIGS. 24(C) and (D), the display device of one embodiment of the present invention can be used for the display portion 7000.

The larger display portion 7000 can increase the amount of information that can be provided at a time. In addition, the larger display portion 7000 attracts more attention, and for example, the effectiveness of the advertisement can be increased.

It is preferable to use a touch panel in the display portion 7000, in which case intuitive operation by a user in addition to display of an image or a moving image on the display portion 7000 is possible. Moreover, for an application for providing information such as route information or traffic information, usability can be enhanced by intuitive operation.

Furthermore, as illustrated in FIGS. 24(C) and (D), it is preferred that the digital signage 7300 or the digital signage 7400 be capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. Moreover, display on the display portion 7000 can be switched by operating the information terminal 7311 or the information terminal 7411.

It is also possible to make the digital signage 7300 or the digital signage 7400 execute a game with the use of the screen of the information terminal 7311 or the information terminal 7411 as an operation means (a controller). Thus, an unspecified number of people can join in and enjoy the game concurrently.

This embodiment can be combined with the description of the other embodiments as appropriate.

REFERENCE NUMERALS 10 semiconductor device
20 pixel portion
21 region
22 pixel
30 driver circuit
31 shift register
32 control circuit
40 driver circuit
50 signal generator circuit
51 register
52 counter
53 comparator circuit
54 comparator circuit
100 display panel
101 substrate
110 scan chain register portion
111 register
112 selector
113 flip-flop circuit
114 retention circuit
115 memory circuit
116 memory circuit
120 register portion
121 register
122 latch circuit
123 MUX
200 display panel
201 substrate
210 display portion
211 pixel
221 TAB tape
222 integrated circuit
231 printed board
232 TAB tape
233 integrated circuit
400 display device
411 substrate
412 substrate
420 liquid crystal element
421 conductive layer
422 liquid crystal
423 conductive layer
424 alignment film
426 insulating layer
430 transistor
431 conductive layer
432 semiconductor layer
433 conductive layer
434 insulating layer
435 impurity semiconductor layer
437 semiconductor layer
438 connection portion
439 polarizing plate
441 coloring layer
442 light-blocking layer
460 capacitor
481 insulating layer
482 insulating layer
483 insulating layer
484 insulating layer
485 insulating layer
486 conductive layer
487 conductive layer
488 insulating layer
490 backlight unit
612 moving mechanism
613 moving mechanism
615 stage
616 ball screw mechanism
620 laser device
621 optical system unit
622 mirror
623 microlens array
624 mask
625 laser light
626 laser light
627 laser beam
630 substrate
640 amorphous silicon layer
641 polycrystalline silicon layer
801 transistor
811 insulating layer
812 insulating layer
813 insulating layer
814 insulating layer 815 insulating layer
816 insulating layer
817 insulating layer
818 insulating layer
819 insulating layer
820 insulating layer
821 metal oxide film
822 metal oxide film
823 metal oxide film
824 metal oxide film
830 oxide layer
850 conductive layer
851 conductive layer
852 conductive layer
853 conductive layer
860 semiconductor device
870 single crystal silicon wafer
871 CMOS layer
872 transistor layer
873 gate electrode
874 electrode
875 electrode
7000 display portion
7100 television device
7101 housing
7103 stand
7111 remote controller
7200 laptop personal computer
7211 housing
7212 keyboard
7213 pointing device
7214 external connection port
7300 digital signage
7301 housing
7303 speaker
7311 information terminal
7400 digital signage
7401 pillar
7411 information terminal

The invention claimed is:

1. A semiconductor device comprising:
a pixel portion;
a first driver circuit, a second driver circuit, a third driver circuit, and a fourth driver circuit;
a first wiring, a second wiring, a third wiring, a fourth wiring, a fifth wiring, and a sixth wiring;
a first signal generator circuit; and
a second signal generator circuit,
wherein:
the pixel portion comprises a first region comprising a first pixel and a second pixel, and a second region comprising a third pixel and a fourth pixel,
the first driver circuit is configured to supply a first selection signal to the first wiring and to supply a second selection signal to the second wiring,
the second driver circuit is configured to supply a third selection signal to the third wiring and to supply a fourth selection signal to the fourth wiring,
the third driver circuit is configured to supply a first image signal to the fifth wiring,
the fourth driver circuit is configured to supply a second image signal to the sixth wiring,
the first pixel is electrically connected to the first wiring and the fifth wiring,
the second pixel is electrically connected to the second wiring and the fifth wiring,
the third pixel is electrically connected to the third wiring and the sixth wiring,
the fourth pixel is electrically connected to the fourth wiring and the sixth wiring,
a distance between the third driver circuit and the second pixel is longer than a distance between the third driver circuit and the first pixel,
a distance between the fourth driver circuit and the fourth pixel is longer than a distance between the fourth driver circuit and the third pixel,
the second pixel and the fourth pixel are adjacent to each other,
a pulse width of the second selection signal is larger than a pulse width of the first selection signal,
a pulse width of the fourth selection signal is larger than a pulse width of the third selection signal,
the first signal generator circuit and the second signal generator circuit each comprise a register, a counter, a first comparator circuit, and a second comparator circuit,
the register is configured to output a first parameter to the first comparator circuit and to output a second parameter to the second comparator circuit,
the first comparator circuit is configured to generate a first clock signal or a second clock signal by using the first parameter and a count value of the counter, and
the second comparator circuit is configured to generate a first control signal or a second control signal by using the second parameter and the count value of the counter.

2. The semiconductor device according to claim 1, wherein:
the register comprises a first scan chain register portion, a second scan chain register portion, and a register portion,
first data is sequentially input to the first scan chain register portion,
second data is sequentially input to the second scan chain register portion, and
the register portion is configured to select and output one of the first data and the second data.

3. The semiconductor device according to claim 2, wherein:
the first scan chain register portion and the second scan chain register portion each comprise a retention circuit,
the retention circuit comprises a transistor and a capacitor,
one of a source and a drain of the transistor is electrically connected to the capacitor, and
the transistor comprises a metal oxide in a channel formation region.

4. The semiconductor device according to claim 1, wherein the first to fourth pixels each comprise a transistor comprising hydrogenated amorphous silicon in a channel formation region.

5. The semiconductor device according to claim 1, wherein the first to fourth pixels each comprise a transistor comprising a metal oxide in a channel formation region.

* * * * *